(12) United States Patent
Sakata et al.

(10) Patent No.: US 8,735,884 B2
(45) Date of Patent: May 27, 2014

(54) SEMICONDUCTOR DEVICE INCLUDING OXIDE SEMICONDUCTOR

(71) Applicant: Semiconductor Energy Laboratory Co., Ltd., Atsugi (JP)

(72) Inventors: Junichiro Sakata, Atsugi (JP); Toshinari Sasaki, Atsugi (JP); Miyuki Hosoba, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/632,709

(22) Filed: Oct. 1, 2012

(65) Prior Publication Data

US 2013/0037799 A1    Feb. 14, 2013

Related U.S. Application Data

(63) Continuation of application No. 12/828,464, filed on Jul. 1, 2010, now Pat. No. 8,304,300.

(30) Foreign Application Priority Data

Jul. 3, 2009  (JP) ................................. 2009-159052

(51) Int. Cl.
*H01L 29/10* (2006.01)
*H01L 29/12* (2006.01)

(52) U.S. Cl.
USPC .................. 257/43; 257/59; 257/72; 257/83; 438/46; 438/104; 438/128

(58) Field of Classification Search
USPC ............ 257/59, 72, 257, 258, 390, 391, 368, 257/443, 431, 448, 745, 743, 751, 752, 753, 257/756, 758, 759, 760, 249, 250, 43, 79, 257/80, 81, 82, 83, 84, 99, 100, 103, 432, 257/433; 438/30, 104, 43, 158, 59, 66, 149, 438/157, 347, 151, 142, 176, 195, 277, 283, 438/587, 22, 26, 39, 42, 46, 128
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN      001828932      9/2006
EP      1 737 044 A    12/2006
(Continued)

OTHER PUBLICATIONS

Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Thanh Y Tran
(74) *Attorney, Agent, or Firm* — Eric J. Robinson; Robinson Intellectual Property Law Office, P.C.

(57) ABSTRACT

An object is to provide a display device which operates stably with use of a transistor having stable electric characteristics. In manufacture of a display device using transistors in which an oxide semiconductor layer is used for a channel formation region, a gate electrode is further provided over at least a transistor which is applied to a driver circuit. In manufacture of a transistor in which an oxide semiconductor layer is used for a channel formation region, the oxide semiconductor layer is subjected to heat treatment so as to be dehydrated or dehydrogenated; thus, impurities such as moisture existing in an interface between the oxide semiconductor layer and the gate insulating layer provided below and in contact with the oxide semiconductor layer and an interface between the oxide semiconductor layer and a protective insulating layer provided on and in contact with the oxide semiconductor layer can be reduced.

20 Claims, 43 Drawing Sheets

(56) References Cited

U.S. PATENT DOCUMENTS

| | | |
|---|---|---|
| 5,808,595 A | 9/1998 | Kubota et al. |
| 5,847,410 A | 12/1998 | Nakajima |
| 6,294,274 B1 | 9/2001 | Kawazoe et al. |
| 6,563,174 B2 | 5/2003 | Kawasaki et al. |
| 6,566,685 B2 | 5/2003 | Morikawa et al. |
| 6,586,346 B1 | 7/2003 | Yamazaki et al. |
| 6,727,522 B1 | 4/2004 | Kawasaki et al. |
| 6,828,584 B2 | 12/2004 | Arao et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,078,277 B2 | 7/2006 | Arao et al. |
| 7,105,868 B2 | 9/2006 | Nause et al. |
| 7,211,825 B2 | 5/2007 | Shih et al |
| 7,253,038 B2 | 8/2007 | Arao et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,608,531 B2 | 10/2009 | Isa et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,855,369 B2 | 12/2010 | Takahashi |
| 7,863,611 B2 | 1/2011 | Abe et al. |
| 8,071,985 B2 | 12/2011 | Sakurai et al. |
| 8,203,144 B2 | 6/2012 | Hoffman et al. |
| 8,203,146 B2 | 6/2012 | Abe et al. |
| 8,487,436 B2 | 7/2013 | Isa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto et al. ............ 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0228389 A1 | 10/2007 | Hsu et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134397 A1* | 6/2010 | Ishitani et al. ............ 345/92 |
| 2010/0244020 A1* | 9/2010 | Sakata et al. ............ 257/43 |
| 2010/0244029 A1* | 9/2010 | Yamazaki et al. ............ 257/52 |
| 2012/0012846 A1 | 1/2012 | Isa et al. |
| 2012/0208318 A1 | 8/2012 | Hoffman et al. |

FOREIGN PATENT DOCUMENTS

| | | |
|---|---|---|
| EP | 2 226 847 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 | 10/1991 |
| JP | 05-251705 A | 9/1993 |
| JP | 08-264794 A | 10/1996 |
| JP | 09-073102 A | 3/1997 |
| JP | 11-505377 | 5/1999 |
| JP | 2000-044236 A | 2/2000 |
| JP | 2000-150900 | 5/2000 |
| JP | 2001-332716 A | 11/2001 |
| JP | 2002-076356 A | 3/2002 |
| JP | 2002-289859 A | 10/2002 |
| JP | 2003-037271 A | 2/2003 |
| JP | 2003-086000 A | 3/2003 |
| JP | 2003-086803 A | 3/2003 |
| JP | 2003-086808 A | 3/2003 |
| JP | 2004-071623 A | 3/2004 |
| JP | 2004-103957 | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2004-296654 A | 10/2004 |
| JP | 2005-079283 A | 3/2005 |
| JP | 2006-165532 A | 6/2006 |
| JP | 2006-250985 A | 9/2006 |
| JP | 2007-096055 | 4/2007 |
| JP | 2007-123861 | 5/2007 |
| JP | 2007-250983 | 9/2007 |
| JP | 2007-273956 A | 10/2007 |
| JP | 2007-529117 | 10/2007 |
| JP | 2007-529119 | 10/2007 |
| JP | 2008-096962 A | 4/2008 |
| JP | 2008-124215 A | 5/2008 |
| JP | 2009-033120 A | 2/2009 |
| JP | 2009-099777 A | 5/2009 |
| JP | 2009-130209 A | 6/2009 |
| WO | 2004/114391 | 12/2004 |
| WO | WO-2005/093847 | 10/2005 |
| WO | WO-2005/093850 | 10/2005 |
| WO | 2007/119386 | 10/2007 |
| WO | WO-2009/034953 | 3/2009 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds In$MO3$(ZnO)$m$ ($M$=In,Ga; $m$=Integer) Described by Four-Dimensional Superspace Group," Journal of Solid State Chemistry, 1998 vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Matrials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid—Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide—Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the $16^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

(56) References Cited

OTHER PUBLICATIONS

Osada et al., "Development of Driver-Integrated Panel using Amorphous In—Ga—Zn—Oxide TFT," AM-FPD '09 Digest of Technical Papers, Jul. 1, 2009, pp. 33-36.
Hirao et al., "Novel Top-Gate Zinc Oxide Thin-Film Transistors (ZnO TFTs) for AMLCDs," Journal of the SID, 2007, vol. 15, No. 1, pp. 17-22.
Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.
Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Ohara et al., "21.3: 4.0 IN. QVGA AMOLED Display Using In—Ga—Zn—Oxide TFTs with a Novel Passivation Layer," SID Digest '09: SID International Symposium Digest of Technical Papers, May 31, 2009, pp. 284-287.
Miyasaka, "58.2: Invited Paper: Suftla Flexible Microelectronics on their Way to Business," SID Digest '07: SID International Symposium Digest of Technical Papers, 2007, vol. 38, pp. 1673-1676.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.
Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.
Lee et al., "Current Status of, Challenges to, and Perspective View of AM-OLED," IDW '06: Proceedings of the $13^{th}$ International Display Workshops, Dec. 7, 2006, pp. 663-666.
Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Nakamura, "Synthesis of Homologous Compound with New Long-Period Structure," NIRIM Newsletter, Mar. 1, 1995, vol. 150, pp. 1-4.
Kikuchi et al., "Polymer-Stabilized Liquid Crystal Blue Phases," Nature Materials, Sep. 2, 2002, vol. 1, pp. 64-68.
Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, Or Al; B: Mg, Mn, Fe, Ni, Cu, or Zn] at Temperatures Over 1000° C.," Journal of Solid State Chemistry, 1985, vol. 60, pp. 382-384.
Kitzerow et al., "Observation of Blue Phases in Chiral Networks," Liquid Crystals, 1993, vol. 14, No. 3, pp. 911-916.
Costello et al., "Electron Microscopy of a Cholesteric Liquid Crystal and its Blue Phase," Phys. Rev. A (Physical Review A), May 1, 1984, vol. 29, No. 5, pp. 2957-2959.
Meiboom et al., "Theory of the Blue Phase of Cholesteric Liquid Crystals," Phys. Rev. Lett. (Physical Review Letters), May 4, 1981, vol. 46, No. 18, pp. 1216-1219.
Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Orita et al., "Mechanism of Electrical Conductivity of Transparent $InGaZnO_4$," Phys. Rev. B (Physical Review B), Jan. 15, 2000, vol. 61, No. 3, pp. 1811-1816.
Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Janotti et al., "Native Point Defects in ZnO," Phys. Rev. B (Physical Review. B), Oct. 4, 2007, vol. 76, No. 16, pp. 165202-1-165202-22.
Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.
Janotti et al., "Oxygen Vacancies in ZnO," Appl. Phys. Lett. (Applied Physics Letters), 2005, vol. 87, pp. 122102-1-122102-3.
Oba et al., "Defect energetics in ZnO: A hybrid Hartree-Fock density functional study," Phys. Rev. B (Physical Review B), 2008, vol. 77, pp. 245202-1245202-6.
Orita et al., "Amorphous transparent conductive oxide $InGaO_3(ZnO)_m$ (m<4): a Zn 4s conductor," Philosophical Magazine, 2001, vol. 81, No. 5, pp. 501-515.
Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Mo et al., "Amorphous Oxide TFT Backplanes for Large Size AMOLED Displays," IDW '08: Proceedings of the 6th International Display Workshops, Dec. 3, 2008, pp. 581-584.
Kim et al., "High-Performance oxide thin film transistors passivated by various gas plasmas," $214^{th}$ ECS Meeting, 2008, No. 2317.
Clark et al., "First Principles Methods Using CASTEP," Zeitschrift fur Kristallographie, 2005, vol. 220, pp. 567-570.
Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.
Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.
Nakamura, et al., "Syntheses and Crystal Structures of New Homologous Compounds, Indium Iron Zinc Oxides $(InFeO_3(ZnO)_m)$ (m: natural number) and Related Compounds," Kotai Butsuri (Solid State Physics), 1993, vol. 28, No. 5, pp. 317-327.
Chinese Office Action (Application No. 201010222538.9) Dated Nov. 21, 2013.

\* cited by examiner

SEMICONDUCTOR DEVICE INCLUDING OXIDE SEMICONDUCTOR

BACKGROUND OF THE INVENTION

1. Field of the Invention

The present invention relates to a display device including a circuit formed with a transistor, and a method for manufacturing the display device.

2. Description of the Related Art

Various metal oxides exist and are used for a variety of applications. Indium oxide is a well-known material as a metal oxide and is used as a light-transmitting conductive material which is necessary for liquid crystal displays and the like.

Some metal oxides have semiconductor characteristics. As metal oxides having semiconductor characteristics, for example, there are tungsten oxide, tin oxide, indium oxide, zinc oxide, and the like, and a transistor in which a channel formation region is formed using such a metal oxide having semiconductor characteristics has been proposed (for example, see Patent Documents 1 to 4 and Non-Patent Document 1).

As metal oxides, multi-component oxides as well as single-component oxides are known. For example, $InGaO_3(ZnO)_m$ (m is a natural number) having a homologous series is known as a multi-component oxide semiconductor including In, Ga, and Zn (see Non-Patent Documents 2 to 4).

In addition, it has been confirmed that an oxide semiconductor layer including such an In—Ga—Zn-based oxide can be used as a channel layer of a transistor (see Patent Document 5, and Non-Patent Documents 5 and 6).

REFERENCE

Patent Document

[Patent Document 1] Japanese Published Patent Application No S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun., 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_n$, (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides (In-$FeO_3(ZnO)_m$) (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

SUMMARY OF THE INVENTION

An object of one embodiment of the present invention is to provide a transistor having favorable electric characteristics and high reliability, and a manufacturing method thereof. Another object is to provide a display device to which the transistor is applied and which has favorable display quality and high reliability.

One embodiment of the present invention is a display device in which a transistor including an oxide semiconductor layer is provided. An active matrix substrate of the display device includes a pixel portion and a driver circuit portion. A gate electrode is provided to overlap with a back channel portion of a transistor in at least the driver circuit portion. In manufacture of the transistor, the oxide semiconductor layer is subjected to heat treatment for dehydration or dehydrogenation. After the heat treatment, a protective insulating layer is formed using an insulating inorganic material containing oxygen so as to cover the oxide semiconductor layer. Through the heat treatment, the carrier concentration is changed.

A transistor having favorable electric characteristics can be manufactured. In particular, a transistor whose threshold voltage is not easily shifted even when it is used for a long term and which has high reliability can be manufactured. With use of such a transistor in at least a driver circuit portion, the reliability of a display device can be improved.

BRIEF DESCRIPTION OF THE DRAWINGS

FIGS. 24A1, 24A2, and 24B are diagrams illustrating display devices which are one embodiment of the present invention.

DETAILED DESCRIPTION OF THE INVENTION

Figure 1A:
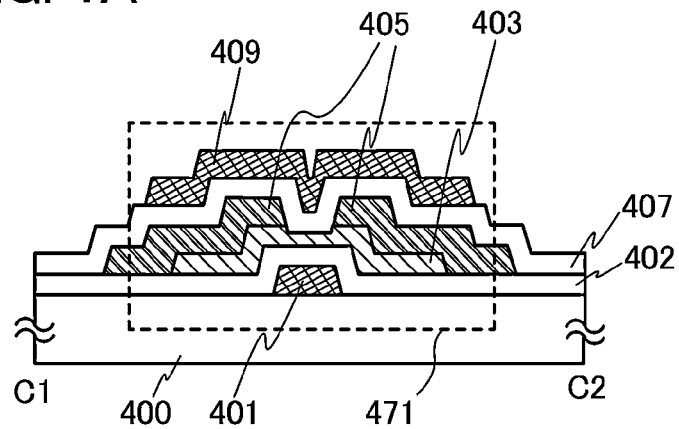
FIGS. 1A to 1C are diagrams each illustrating a transistor which is one embodiment of the present invention.

Embodiments and examples of the present invention will be described with reference to the drawings. However, the present invention is not limited to the description below, and those skilled in the art will appreciate that a variety of modifications can be made to the modes and details without departing from the spirit and scope of the present invention. Therefore, the present invention is not interpreted as being limited to the following description in the embodiments and examples. Note that, in all the drawings for explaining the embodiments and examples, the same portions or portions having the same functions are denoted by the same reference numerals, and the description thereof will be made only once.

Note that in Embodiments 1 to 4 which are described below, a transistor which is provided in at least a driver circuit portion of a display device which is one embodiment of the present invention will be described.

[Embodiment 1]

In this embodiment, a transistor that can be applied to a display device which is one embodiment of the present invention and a manufacturing method thereof will be described. In a display device which is one embodiment of the present invention, the transistor of this embodiment is provided in at least a driver circuit portion.

Figure 1B:
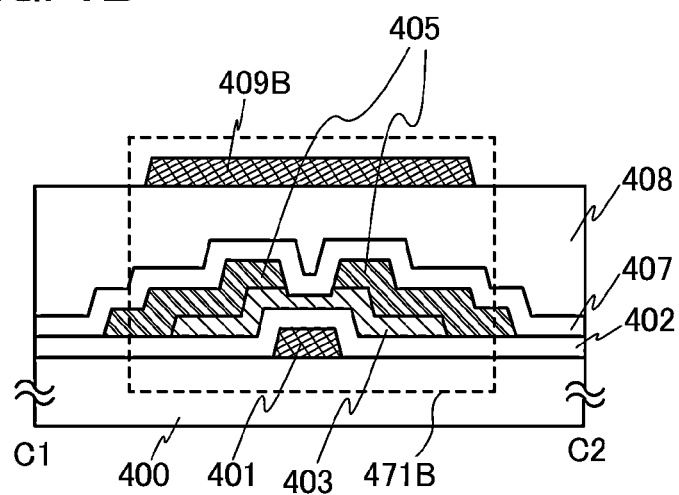
Figure 1C:
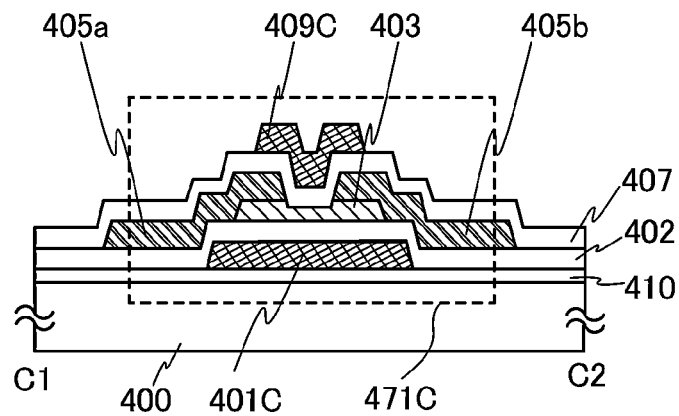

FIGS. 1A to 1C are cross-sectional views of transistors that can be applied to one embodiment of the present invention.

A transistor 471 is a bottom-gate transistor, and includes a first gate electrode layer 401, a gate insulating layer 402, an oxide semiconductor layer 403, and source and drain electrode layers 405 which are provided over a substrate 400. In addition, a first protective insulating layer 407 which is in contact with part of the oxide semiconductor layer 403 and covers the first gate electrode layer 401, the gate insulating layer 402, the oxide semiconductor layer 403, and the source and drain electrode layers 405 is included, and a second gate electrode layer 409 which is provided over the first protective insulating layer 407 and overlaps with the oxide semiconductor layer 403 is included. Note that the first protective insulating layer 407 can be referred to as a second gate insulating layer.

The oxide semiconductor layer 403 including a channel formation region may be formed using an oxide material having semiconductor characteristics. For example, an oxide semiconductor whose composition formula is represented by $InMO_3(ZnO)_m$ (m>0) can be used, and particularly, an In—Ga—Zn—O-based oxide semiconductor is preferably used. Note that M represents one or more metal elements selected from Ga, Fe, Ni, Mn, or Co. As an example, M may be Ga or may include the above metal element in addition to Ga; for example, M may be Ga and Ni or Ga and Fe.

Note that in the above oxide semiconductor, a transition metal element such as Fe or Ni or an oxide of the transition metal may be contained in addition to a metal element contained as M.

In this specification, an oxide semiconductor including a material whose composition formula is represented by $InMO_3(ZnO)_m$ (m>0) where at least Ga is included as M is referred to as an In—Ga—Zn—O-based oxide semiconductor, and a thin film thereof is also referred to as an In—Ga—Zn—O-based non-single-crystal film.

As the oxide semiconductor applied to the oxide semiconductor layer 403, any of the following oxide semiconductors can be applied in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

Further, silicon oxide may be included in the above oxide semiconductor.

The oxide semiconductor layer 403 can be formed in the following manner: at least after an oxide semiconductor film is formed, heat treatment (heat treatment for dehydration or dehydrogenation) through which impurities such as moisture ($H_2O$) are reduced is performed to reduce the resistance of the oxide semiconductor film (the carrier concentration of the oxide semiconductor film is increased, preferably to $1 \times 10^{18}$/$cm^3$ or more); and the first protective insulating layer 407 is formed in contact with the oxide semiconductor film (or a processed oxide semiconductor layer) so that the resistance of the oxide semiconductor film is raised (the carrier concentration of the oxide semiconductor film is decreased, preferably to less than $1\times10^{18}/cm^3$, more preferably to $1\times10^{14}/cm^3$ or less). In such a manner, the oxide semiconductor layer 403 that can be used as the channel formation region can be formed.

Further, after the heat treatment for dehydration or dehydrogenation is performed so that impurities such as moisture are eliminated, the oxide semiconductor layer is preferably slowly cooled (gradually cooled) under an inert atmosphere. After the oxide semiconductor layer is subjected to heat treatment for dehydration or dehydrogenation and is slowly cooled, an insulating oxide film or the like is formed in contact with the oxide semiconductor layer; thus, the carrier concentration of the oxide semiconductor layer can be reduced. In such a manner, the reliability of the transistor 471 can be improved.

Further, impurities such as moisture which are present not only in the oxide semiconductor layer 403, but also in the gate insulating layer 402, at an interface between the oxide semiconductor layer 403 and a layer provided below and in contact with the oxide semiconductor layer 403 (i.e., an interface between the oxide semiconductor layer 403 and the gate insulating layer 402), and at an interface between the oxide semiconductor layer 403 and a layer provided over and in contact with the oxide semiconductor layer 403 (i.e., an interface between the oxide semiconductor layer 403 and the first protective insulating layer 407) are reduced.

The oxide semiconductor layer 403 includes a high-resistance oxide semiconductor region at least in a region which is in contact with an inorganic insulating film, and the high-resistance oxide semiconductor region can serve as a channel formation region.

Note that an In—Ga—Zn—O-based non-single-crystal film used for the oxide semiconductor layer 403 may be amorphous, microcrystalline, or polycrystalline. Although the "In—Ga—Zn—O-based non-single-crystal film" is given, the oxide semiconductor layer 403 may be an In—Ga—Zn—O-based single crystal film instead.

When the high-resistance oxide semiconductor region is used as a channel formation region, electric characteristics of the transistor can be stabilized and increase in off current or the like can be prevented.

The source and drain electrode layers 405 which are in contact with the oxide semiconductor layer 403 are preferably formed using a material including a metal with high oxygen affinity. It is preferable that the material including a metal with high oxygen affinity be one or more materials selected from titanium, aluminum, manganese, magnesium, zirconium, beryllium, or thorium.

When heat treatment is performed while the oxide semiconductor layer 403 and the metal layer with high oxygen affinity are in contact with each other, oxygen atoms move from the oxide semiconductor layer 403 to the metal layer, the carrier density in the vicinity of an interface is increased, and a low-resistance region is formed. The low-resistance region may be in a film shape having an interface.

Through the above steps, the transistor whose contact resistance is reduced and on current is increased can be manufactured.

FIGS. 2A to 2D are cross-sectional views illustrating steps of manufacturing the transistor 471.

First, the first gate electrode layer 401 is formed over the substrate 400 having an insulating surface. As the substrate 400 having an insulating surface, any glass substrate used in the electronics industry (also called an alkali-free glass substrate) such as an aluminosilicate glass substrate, an aluminoborosilicate glass substrate, or a barium borosilicate glass substrate, a plastic substrate with heat resistance which can withstand a process temperature in this manufacturing process, or the like can be used. When the substrate 400 having an insulating surface is a mother glass, any of the following sizes of the substrate can be used; the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Alternatively, as illustrated in FIG. 1C which will be described later, a base insulating layer may be formed between the substrate 400 and the first gate electrode layer 401. The base insulating layer may be formed to have a single-layer structure or a stacked-layer structure using an insulating film that can prevent an impurity element (such as sodium) from diffusing from the substrate 400. For example, one or more films selected from a silicon nitride film, a silicon oxide film, a silicon nitride oxide film, or a silicon oxynitride film can be used.

The first gate electrode layer 401 can be formed to have a single-layer structure or a stacked-layer structure using a metal material such as molybdenum, titanium, chromium, tantalum, tungsten, aluminum, copper, neodymium, or scandium or an alloy material containing any of these materials as its main component.

For example, as a two-layer structure of the first gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

After a conductive film is formed over the entire surface of the substrate 400, a photolithography step is performed. A resist mask is formed over the conductive film, and an unnecessary portion is removed by etching. In such a manner, the first gate electrode layer 401 is formed. The first gate electrode layer 401 serves as a wiring and an electrode (such as a gate wiring, a capacitor wiring, and a terminal electrode which include the first gate electrode layer 401).

Next, the gate insulating layer 402 is formed over the first gate electrode layer 401.

The gate insulating layer 402 can be formed to have a single-layer structure or a stacked-layer structure using a silicon oxide layer, a silicon nitride layer, a silicon oxynitride layer, or a silicon nitride oxide layer by a plasma CVD method, a sputtering method, or the like. For example, a silicon oxynitride layer may be formed using $SiH_4$ and one or both of oxygen and nitrogen as a source gas by a plasma CVD method. Alternatively, dinitrogen monoxide may be used instead of oxygen and nitrogen.

Next, an oxide semiconductor film is formed over the gate insulating layer 402.

Note that before the oxide semiconductor film is formed by a sputtering method, dust or the like on a surface of the gate insulating layer 402 is preferably removed by reverse sputtering in which an argon gas is introduced and plasma is generated. The reverse sputtering refers to a method in which an RF power source is used for application of voltage to a substrate under an argon atmosphere and plasma is generated to expose an object to be processed (e.g., the substrate) to the plasma so that a surface of the object is modified. Note that nitrogen, helium, or the like may be used instead of an argon atmosphere. Alternatively, an argon atmosphere to which oxygen, dinitrogen monoxide, or the like is added may be used. Further alternatively, an argon atmosphere to which chlorine, methane tetrafluoride, or the like is added may be used.

The oxide semiconductor film is formed using an In—Ga—Zn—O-based metal oxide as a target by a sputtering method. The oxide semiconductor film can be formed by a sputtering method under a rare gas (e.g., argon) atmosphere, an oxygen atmosphere, or an atmosphere including a rare gas (e.g., argon) and oxygen.

Note that the gate insulating layer 402 and the oxide semiconductor film may be formed successively without exposure to air. By successive formation of the gate insulating layer 402 and the oxide semiconductor film without exposure to air, the interface between the gate insulating layer 402 and the oxide semiconductor film can be prevented from being contaminated by atmospheric components or impurities (such as moisture and hydrocarbon) floating in air, so that variation in characteristics of the transistors can be reduced.

Figure 2A:
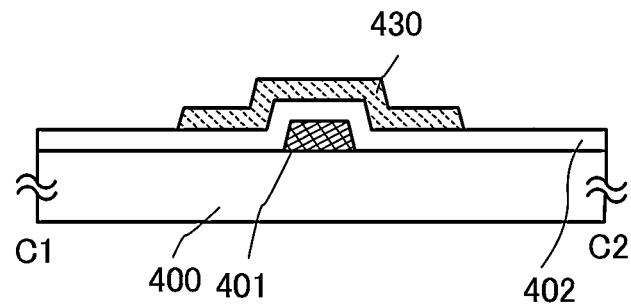
FIGS. 2A to 2D are diagrams illustrating a transistor which is one embodiment of the present invention.

Next, the oxide semiconductor film is processed into an island-shaped first oxide semiconductor layer 430 by a photolithography step (see FIG. 2A).

Figure 2B:
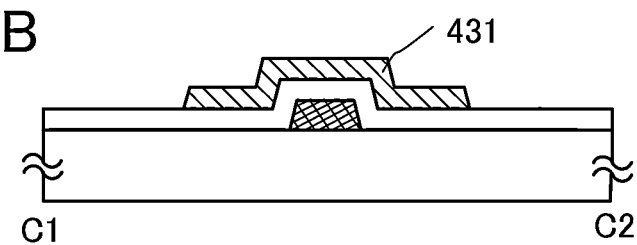

The first oxide semiconductor layer 430 is subjected to heat treatment under an inert gas (nitrogen or a rare gas such as helium, neon, or argon) atmosphere or reduced pressure, and is slowly cooled under an inert atmosphere, whereby a second oxide semiconductor layer 431 is formed (see FIG. 2B). When the first oxide semiconductor layer 430 is subjected to the heat treatment under the above atmosphere, impurities such as hydrogen and moisture contained in the first oxide semiconductor layer 430 can be removed, and the second oxide semiconductor layer 431 can be formed.

It is preferable that impurities such as moisture and hydrogen be not contained in nitrogen or a rare gas such as helium, neon, or argon in the heat treatment. Alternatively, the purity of nitrogen or a rare gas such as helium, neon, or argon introduced in a heat treatment apparatus is preferably 6 N (99.9999%) or higher, more preferably 7 N (99.99999%) or higher (that is, the concentration of the impurities is 1 ppm or lower, preferably 0.1 ppm or lower).

For the heat treatment, a method in which an electric furnace is used, a gas rapid thermal anneal (GRTA) method in which a heated gas is used, an instantaneous heating method such as a lamp rapid thermal anneal (LRTA) method in which lamp light is used, or the like can be used.

Here, the case where the first oxide semiconductor layer 430 is subjected to heat treatment in which an electric furnace is used will be described with reference to FIG. 3.

Figure 3:
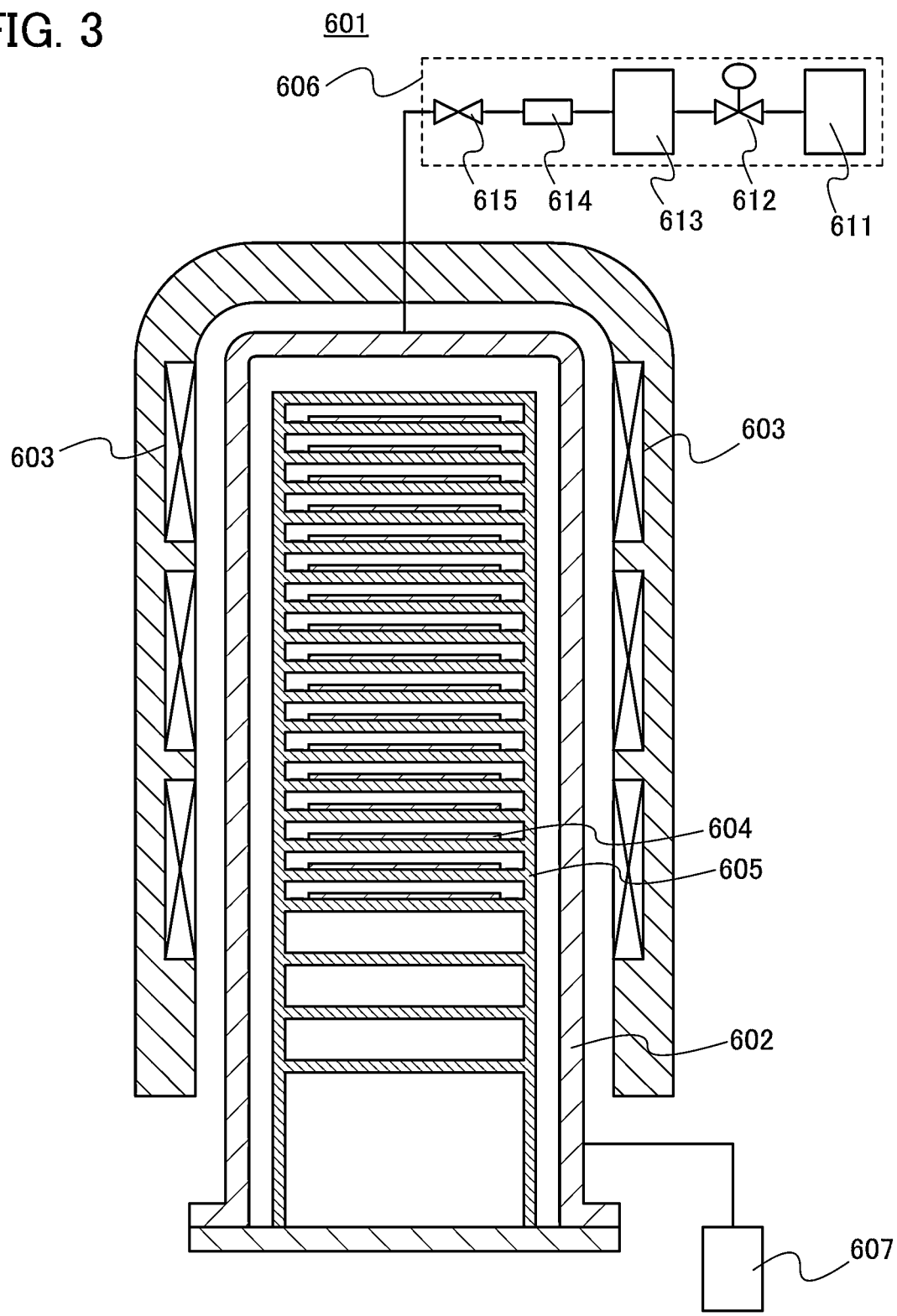
FIG. 3 is a diagram illustrating an electric furnace that can be applied to the present invention.

FIG. 3 is a schematic view of an electric furnace 601. The electric furnace 601 includes a chamber 602 and heaters 603 outside the chamber 602. The heaters 603 are used for heating the chamber 602. Inside the chamber 602, a susceptor 605 in which a substrate 604 is mounted is provided. The substrate 604 is transferred into/from the chamber 602. The chamber 602 is provided with a gas supply means 606 and an evacuation means 607. With the gas supply means 606, a gas is introduced into the chamber 602. The evacuation means 607 exhausts the inside of the chamber 602 or reduces the pressure in the chamber 602. Note that the electric furnace 601 preferably has a structure in which the temperature increases at greater than or equal to 0.1° C./min and less than or equal to 20° C./min and decreases at greater than or equal to 0.1° C./min and less than or equal to 15° C./min.

The gas supply means 606 includes a gas supply source 611, a pressure adjusting valve 612, a mass flow controller 614, and a stop valve 615. In this embodiment, as illustrated in FIG. 3, it is preferable that a refining apparatus 613 be provided between the gas supply source 611 and the chamber 602. The refining apparatus 613 can remove impurities such as moisture and hydrogen in a gas which is introduced from the gas supply source 611 into the chamber 602; thus, entry into the chamber 602, of moisture, hydrogen, and the like, can be prevented by provision of the refining apparatus 613.

In this embodiment, nitrogen or a rare gas is introduced into the chamber 602 from the gas supply source 611, so that the inside of the chamber 602 is in a nitrogen or a rare gas atmosphere. In the chamber 602 heated at greater than or equal to 200° C. and less than or equal to 600° C., preferably, greater than or equal to 400° C. and less than or equal to 600° C., the first oxide semiconductor layer 430 formed over the substrate 604 (the substrate 400 in FIGS. 1A to 1C) is heated, whereby the first oxide semiconductor layer 430 can be dehydrated or dehydrogenated.

Alternatively, the chamber 602 in which the pressure is reduced by the evacuation means 607 is heated at greater than or equal to 200° C. and less than or equal to 600° C., preferably, greater than or equal to 400° C. and less than or equal to 600° C. In such a chamber 602, the first oxide semiconductor layer 430 formed over the substrate 604 (the substrate 400 in FIGS. 1A to 1C) is heated, whereby the first oxide semiconductor layer 430 can be dehydrated or dehydrogenated.

Next, the heaters 603 are turned off, and the chamber 602 is slowly cooled (gradually cooled). By performance of heat treatment and slow cooling under an inert gas atmosphere or under reduced pressure, resistance of the first oxide semiconductor layer 430 is reduced (i.e., the carrier concentration is increased, preferably to $1 \times 10^{18}/cm^3$ or higher), so that a second oxide semiconductor layer 431 can be formed.

Through the heat treatment in the above-described manner, the reliability of the transistor formed later can be improved.

Note that in the case where heat treatment is performed under reduced pressure, an inert gas may be introduced into the chamber 602 after the heat treatment, so that the chamber 602 is to be under an atmospheric pressure, and then, cooling may be performed.

After the substrate 604 in the chamber 602 of the heating apparatus is cooled to about 300° C., the substrate 604 may be transferred into an atmosphere at room temperature. As a result, the cooling time of the substrate 604 can be shortened.

If the heating apparatus has a multi-chamber structure, heat treatment and cool treatment can be performed in chambers different from each other. For example, the first oxide semiconductor layer 430 over the substrate 604 (the substrate 400 in FIGS. 1A to 1C) is heated in a first chamber which is filled with nitrogen or a rare gas and heated at greater than or equal to 200° C. and less than or equal to 600° C., preferably greater than or equal to 400° C. and less than or equal to 600° C. Next, the substrate subjected to the heat treatment is transferred, through a transfer chamber in which nitrogen or a rare gas is introduced, into a second chamber which is filled with nitrogen or a rare gas and heated at 100° C. or lower, preferably at room temperature, and then cooling treatment is performed therein. In such a manner, the heat treatment and the cooling treatment are performed in different chambers, whereby throughput can be increased.

The heat treatment of the first oxide semiconductor layer 430 under an inert gas atmosphere or reduced pressure may be performed on the oxide semiconductor film which has not yet been processed into the island-shaped first oxide semiconductor layer 430. In that case, after heat treatment of the oxide semiconductor film performed under an inert gas atmosphere or reduced pressure, slow cooling is performed to the temperature equal to or higher than room temperature and lower than 100° C. Then, the substrate 604 (the substrate 400 in FIGS. 1A to 1C) is taken out from the heating apparatus, and a photolithography step is performed.

The first oxide semiconductor layer 430 which has been subjected to heat treatment under an inert gas atmosphere or reduced pressure is preferably in an amorphous state, but may be partly crystallized.

Next, a conductive film is formed over the gate insulating layer 402 and the second oxide semiconductor layer 431.

As a material for the conductive film, an element selected from aluminum, chromium, tantalum, titanium, molybdenum, or tungsten; an alloy containing any of the above metal elements as its main component; an alloy containing the above metal elements in combination; and the like can be given.

In the case where heat treatment is performed after formation of the conductive film, a conductive film having at least enough heat resistance to the heat treatment is used. For example, when the conductive film is formed using aluminum alone, there are disadvantages such as low heat resistance and a tendency to be corroded; therefore, the conductive film is formed using aluminum in combination with a conductive material having heat resistance. As the conductive material having heat resistance which is used in combination with aluminum, any of the following materials may be used: an element selected from titanium, tantalum, tungsten, molybdenum, chromium, neodymium, or scandium, an alloy containing any of the above metal elements as its main component, an alloy containing the above elements in combination, and a nitride containing any of the above elements as its main component.

Figure 2C:
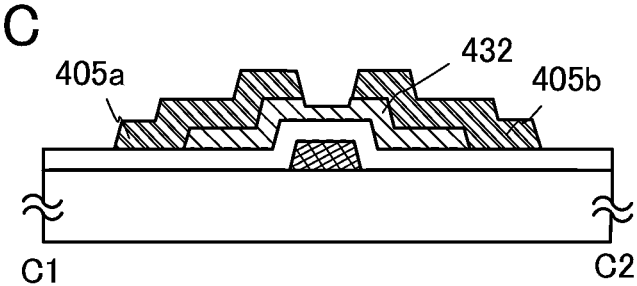
Figure 2D:
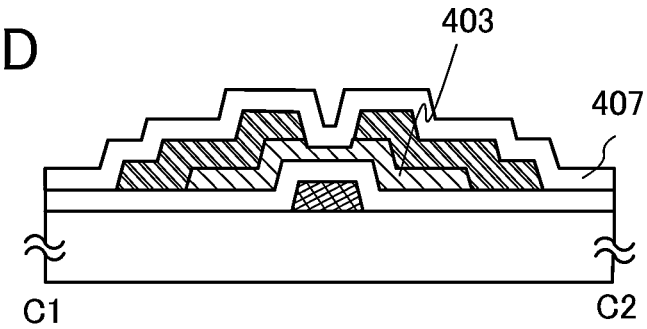

The second oxide semiconductor layer 431 and the conductive film are etched, so that a third oxide semiconductor layer 432 and the source and drain electrode layers 405 (a source electrode 405a and a drain electrode 405b) are formed (see FIG. 2C). Note that part (a back channel portion) of the third oxide semiconductor layer 432 is etched so as to have a groove (a depressed portion).

Next, the first protective insulating layer 407 is formed in contact with the third oxide semiconductor layer 432. Moisture, hydrogen ions, OH⁻, and the like are reduced in the first protective insulating layer 407, (that is, moisture, hydrogen ions, OH⁻, and the like are not included in the first protective insulating layer 407, or almost none of them are included in the first protective insulating layer 407). The first protective insulating layer 407 can block entry of them from the outside. The first protective insulating layer 407 is formed using an insulating inorganic material containing oxygen, and specifically, silicon oxide, silicon oxynitride, or silicon nitride oxide is preferably used.

In this embodiment, as the first protective insulating layer 407, a 300-nm-thick silicon oxide film is formed by a sputtering method. The substrate temperature in formation of the silicon oxide film may be from room temperature to 300° C. or lower and in this embodiment, is 100° C. The formation of the silicon oxide film by a sputtering method can be performed under a rare gas (e.g., argon) atmosphere, an oxygen atmosphere, or an atmosphere of a mixed gas of a rare gas (e.g., argon) and oxygen. As a target, a silicon oxide target or a silicon target may be used. For example, with use of a silicon target, a silicon oxide film can be formed by a sputtering method under an atmosphere containing oxygen.

When the oxide semiconductor film is formed as the first protective insulating layer 407 by a sputtering method, a plasma CVD method, or the like to be in contact with the third oxide semiconductor layer 432, in the low-resistance third oxide semiconductor layer 432, at least a region in contact with the first protective insulating layer 407 has increased resistance ((i.e., the carrier concentration is reduced, preferably to lower than $1\times10^{18}/cm^3$). Thus, a high-resistance oxide semiconductor region can be formed.

During a manufacture process of the transistor, it is important to increase and decrease the carrier concentration in the third oxide semiconductor layer 432 through performance of heat treatment and slow cooling under an inert gas atmosphere (or reduced pressure), formation of an insulating oxide, and the like. The third oxide semiconductor layer 432 becomes the oxide semiconductor layer 403 having a high-resistance oxide semiconductor region (see FIG. 2D).

Next, after a conductive film is formed over the first protective insulating layer 407, a photolithography step is performed. A resist mask is formed over the conductive film, and an unnecessary portion is removed by etching, so that the second gate electrode layer 409 (including a wiring or the like which is formed using the same layer) is formed. When the second gate electrode layer 409 is selectively etched so as to have a top surface having a desired shape, the first protective insulating layer 407 can function as an etching stopper.

Note that in the case where the second gate electrode layer 409 is connected to the first gate electrode layer 401, an opening which exposes the first gate electrode layer 401 is formed in a predetermined portion of the first protective layer 407 before the conductive film which is to be the second gate electrode layer 409 is formed.

For the conductive film formed over the first protective insulating layer 407, a metal material (one or more of metal elements selected from aluminum, copper, titanium, tantalum, tungsten, molybdenum, chromium, neodymium, or scandium, or an alloy containing any of the elements as its main component) can be used. A film formed using any of them can have a light-blocking property when having a sufficient thickness. In such a manner, the oxide semiconductor layer 403 can be blocked from light.

In FIG. 1A, the width of the second gate electrode layer 409 is larger than that of the first gate electrode layer 401 and larger than that of the oxide semiconductor layer 403. As illustrated in FIG. 1A, the width of the second gate electrode layer 409 is made larger than that of the oxide semiconductor layer 403 so that the second gate electrode layer 409 covers a top surface of the oxide semiconductor layer 403. In such a manner, the oxide semiconductor layer 403 can be blocked from light. A thin region of the oxide semiconductor layer 403 is not covered with the source and drain electrode layers 405. Therefore, there is a possibility that the electric characteristics of the transistor 471 are influenced by light irradiation. For example, an In—Ga—Zn—O-based non-single-crystal film formed by a sputtering method has photosensitivity at a wavelength of 450 nm or less; therefore, in the case where an In—Ga—Zn—O-based non-single-crystal film is used for the oxide semiconductor layer 403, the second gate electrode layer 409 may be provided so that light having a wavelength of 450 nm or less can be particularly blocked.

Note that here, the transistor 471 may be subjected to heat treatment under a nitrogen atmosphere or an air atmosphere (in air). This heat treatment is preferably performed at a temperature of 300° C. or less, and the timing of the heat treatment is not particularly limited as long as it is performed after an insulating film which is to be the first protective insulating layer 407 is formed. For example, heat treatment is performed at 350° C. for one hour under a nitrogen atmosphere. If the heat treatment is performed, variation in electric characteristics of the transistor 471 can be reduced.

Through the above steps, the transistor 471 illustrated in FIG. 1A can be formed.

Note that the transistor used in this embodiment is not limited to the one of FIG. 1A. As illustrated in FIG. 1B, a planarizing layer (for example, a resin layer) may be provided below a second gate electrode layer 409B. FIG. 1B illustrates a structure in which a resin layer 408 is formed between a second gate electrode layer 409B and the first protective insulating layer 407 which covers the first gate electrode layer 401, the gate insulating layer 402, the oxide semiconductor layer 403, and the source and drain electrode layers 405. By provision of the resin layer below the second gate electrode layer 409B, surface unevenness due to structures formed therebelow can be reduced, and a surface on which the second gate electrode layer 409B is formed can be planarized. The method for planarization is not limited to the formation of the resin layer, and another method (such as a spin coating method or a reflow method) by which the top surface can be planarized may be used.

In FIG. 1B, the same portions as those of FIG. 1A other than different portions are denoted by the same reference numerals.

The resin layer 408 covers the source and drain electrode layers 405 and the oxide semiconductor layer 403 having the thin region with the first protective insulating layer 407 provided therebetween. The resin layer 408 can be formed using, for example, a photosensitive or non-photosensitive organic material to have a thickness of 0.5 μm to 3 μm. As the photosensitive or non-photosensitive organic material used for the resin layer 408, polyimide, acrylic, polyamide, polyimideamide, resist, benzocyclobutene, or a stack of any of these materials is used. Here, a layer of photosensitive polyimide is formed by a coating method as the resin layer 408. After polyimide is applied to the entire surface, light exposure, development, and baking are performed, whereby the resin layer 408 of polyimide whose surface is plane and has a thickness of 1.5 μm is formed.

By provision of the resin layer 408, unevenness due to a structure of a transistor 471B can be reduced and the surface on which the second gate electrode layer 409 is formed can be planarized.

FIG. 1C illustrates a structure in which a base insulating layer 410 is provided between a first gate electrode layer 401C and the substrate 400 over which the transistor is provided and the relationship between the width of the first gate electrode layer 401C and the width of a second gate electrode layer 409C is different from that of FIG. 1A.

In FIG. 1C, the same portions as those of FIG. 1A other than different portions are denoted by the same reference numerals.

The base insulating layer 410 is formed using a silicon oxynitride layer, a silicon nitride oxide layer, a silicon nitride layer, or the like having a thickness of 50 nm to 200 nm. In the case where glass is used as the substrate 400, the base insulating layer 410 can prevent an impurity element (such as sodium) in a glass substrate from diffusing into a transistor 471C, in particular, can prevent such an impurity element from entering the oxide semiconductor layer 403. In addition, in the case where the base insulating layer 410 is provided, the substrate 400 can be prevented from being etched in the etching step for forming the first gate electrode layer 401C.

Note that in the transistor 471C, the relationship between the width of a first gate electrode layer 401C and that of a second gate electrode layer 409C are different from the relationship between the width of the first gate electrode layer and the second gate electrode layer of the transistor 471 or the transistor 471B. The length of the first gate electrode layer 401C in a channel length direction of the transistor 471C in FIG. 1C is larger than that of the oxide semiconductor layer 403 in the channel length direction. On the other hand, the length of the second gate electrode layer 409C in the channel length direction of the transistor 471C is smaller than that of the oxide semiconductor layer 403 in the channel length direction. As illustrated in FIG. 1C, the length of the second gate electrode layer 409C in the channel length direction is larger than at least the length of the thin region of the oxide semiconductor layer 403 (i.e., the region in contact with the first protective insulating layer 407), and the second gate electrode layer 409C overlaps with the thin region of the oxide semiconductor layer 403. In such a manner, when the length of the second gate electrode layer 409C is small, parasitic capacitance can be reduced.

Note that in FIGS. 1A to 1C, before the first protective insulating layer 407 is formed, an exposed thin region of the oxide semiconductor layer 403 may be subjected to oxygen radical treatment. By the oxygen radical treatment, an exposed surface and its vicinity of the oxide semiconductor layer 403 can be modified into an oxygen-excess region, and can function as a high-resistance region. Oxygen radicals may be supplied by a plasma generating apparatus using a gas including oxygen or an ozone generating apparatus. The surface of the oxide semiconductor layer 403 (the surface of a back channel portion) can be modified by being exposed to the supplied oxygen radicals or oxygen. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

Note that in FIGS. 1A to 1C, the second gate electrode layer can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

In FIGS. 1A to 1C, in the case where the second gate electrode layer is formed using a light-transmitting conductive material, the same material as a pixel electrode is used for the second gate electrode layer, so that the second gate electrode layer and the pixel electrode can be formed using the same photomask. When the second gate electrode layer and the pixel electrode are formed using the same material, the number of steps can be reduced. In the case where the second gate electrode layer is formed using a light-transmitting conductive material, a light-blocking layer for shielding the oxide semiconductor layer having the thin region from light is preferably separately formed at a position overlapping with the thin region of the oxide semiconductor layer. A material and the thickness of the light-blocking layer are determined such that the material has a light transmittance of at least less than 50%, preferably less than 20% at a wavelength of 400 nm to 450 nm. For example, as a material of the light-blocking layer, a metal such as chromium (chromium oxide or chromium nitride may alternatively be used) or titanium nitride, or a black resin can be used. In the case of using a black resin for blocking light, as the light intensity of light used for irradiation is higher, the light-blocking layer needs to be thicker. Therefore, in the case where the light-blocking layer needs to be thin, a metal film which has a high light-blocking property and can be subjected to a fine etching process and can be thinned is preferably used.

Note that in the above description, an example in which a two-tone photomask is used in a photolithography step is shown. When a resist mask including regions having different thicknesses (for example, two different thicknesses of a two-tone mask) is used, the number of resist masks can be reduced, so that the process can be simplified and cost can be reduced. Note that in this specification, a gray-tone photomask and a half-tone photomask are collectively referred to as a multi-tone mask, for convenience. Note that the multi-tone mask is not limited to a three-tone mask, and a four-tone mask or a mask having five or more tones may be used.

In the case of using a multi-tone mask, after the oxide semiconductor film and the conductive film are stacked, a resist mask including regions having different thicknesses is formed over the conductive film, and an oxide semiconductor layer having a thin region and source and drain electrode layers are formed with use of the resist mask. In this case, end portions of the source and drain electrode layers and end portions of the oxide semiconductor layer are generally aligned with each other, and side surfaces of the oxide semiconductor layer are exposed. Therefore, in the case where the first protective insulating layer 407 is formed, the side surfaces of the oxide semiconductor layer and the region (the thin region) of the oxide semiconductor layer which does not overlap with the source and drain electrode layers are in contact with the first protective insulating layer 407.

The channel formation region in the semiconductor layer included in the transistor of this embodiment is a high-resistance region; thus, electric characteristics of the transistor are stabilized and increase in off current can be prevented. Therefore, a display device including a transistor which has favorable electric characteristics and high reliability can be provided.

Note that this embodiment can be implemented in combination with any of other embodiments described in this specification as appropriate.

[Embodiment 2]

In this embodiment, a transistor that can be applied to a display device which is one embodiment of the present invention and that is different from the transistor of Embodiment 1 and a manufacturing method thereof will be described. In a display device which is one embodiment of the present invention, the transistor of this embodiment is provided in at least a driver circuit portion.

Figure 4A:
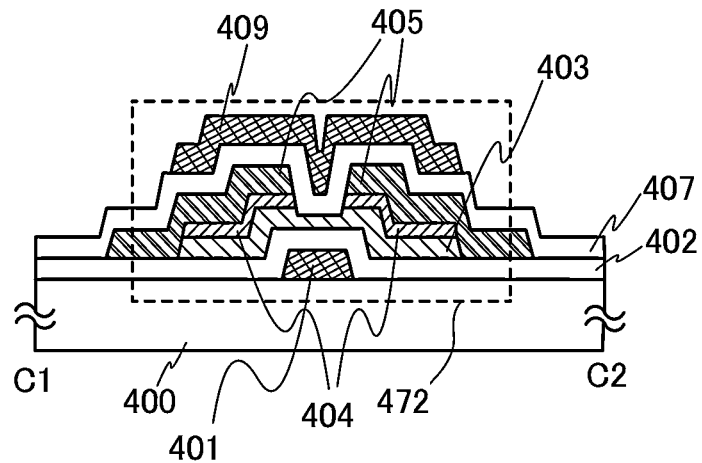
FIGS. 4A and 4B are diagrams each illustrating a transistor which is one embodiment of the present invention.
Figure 4B:
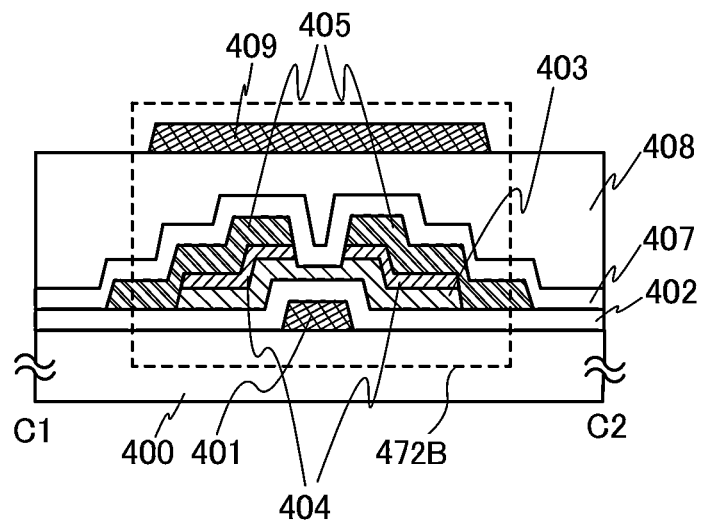

FIGS. 4A and 4B each illustrate a cross-sectional view of a transistor which is one embodiment of the present invention. A transistor 472 is a bottom-gate transistor, and includes a first gate electrode layer 401, a gate insulating layer 402, an oxide semiconductor layer 403, n-type oxide semiconductor layers 404, and source and drain electrode layers 405 which are provided over a substrate 400. In addition, a first protective insulating layer 407 which is in contact with part of the oxide semiconductor layer 403 and covers the first gate electrode layer 401, the gate insulating layer 402, the oxide semiconductor layer 403, the n-type oxide semiconductor layers 404, and the source and drain electrode layers 405 is included, and a second gate electrode layer 409 which is provided over the first protective insulating layer 407 and overlaps with the oxide semiconductor layer 403 is included. Note that the first protective insulating layer 407 can be referred to as a second gate insulating layer.

The n-type oxide semiconductor layers 404 having low resistance are provided between the oxide semiconductor layer 403 and the source and drain electrode layers 405, whereby the transistor 472 can operate more stably.

One example of a method for manufacturing the transistor 472 in FIG. 4A will be described with reference to FIGS. 5A to 5D.

Note that steps in which the first gate electrode layer 401 is formed over the substrate 400 having an insulating surface, the gate insulating layer 402 covering the first gate electrode layer 401 is formed, and an oxide semiconductor film is formed are the same as those of Embodiment 1. Therefore, detailed description is omitted here and the same portions as those of FIG. 1A are denoted by the same reference numerals.

A first oxide semiconductor film 433 is formed over the gate insulating layer 402 as in Embodiment 1.

Figure 5A:
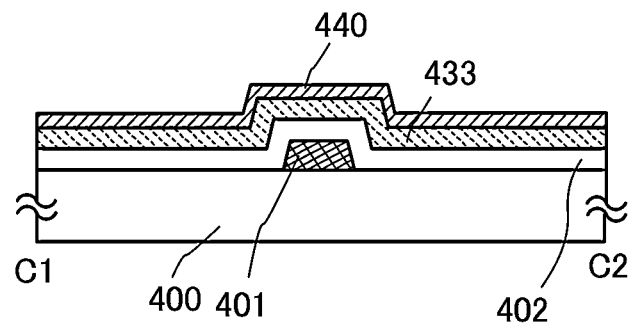
FIGS. 5A to 5D are diagrams illustrating a transistor which is one embodiment of the present invention.

Next, a first n-type oxide semiconductor film 440 serving as source and drain regions is formed over the first oxide semiconductor film 433 (see FIG. 5A). The first n-type oxide semiconductor film 440 is formed using an oxide semiconductor film having lower resistance than the first oxide semiconductor film 433.

The first n-type oxide semiconductor film 440 may be formed using, for example, an oxynitride film containing indium, gallium, and zinc which is obtained by use of a metal oxide containing indium (In), gallium (Ga), and zinc (Zn) ($In_2O_3$:$Ga_2O_3$: ZnO=1:1:1) by a sputtering method under an atmosphere containing a nitrogen gas, an Al—Zn—O-based non-single-crystal film, or an Al—Zn—O-based non-single-crystal film containing nitrogen, i.e., an Al—Zn—O-N-based non-single-crystal film (also referred to as an AZON film).

Note that an In—Ga—Zn—O-based non-single-crystal film used in this embodiment may be amorphous, microcrystalline, or polycrystalline. Alternatively, it may be a single crystal. By change in the condition of film formation or composition ratio of a target in the above manner, crystalline states of the first oxide semiconductor film 433 and the first n-type oxide semiconductor film 440 can be changed.

Therefore, the crystalline states of the n-type oxide semiconductor layers which are to be source and drain regions and the oxide semiconductor layer 403 which forms a channel region may be different from each other depending on the condition of the formation of the oxide semiconductor film or the composition ratio of the target. For example, the n-type oxide semiconductor layers which are to be the source and drain regions may include micro crystals; the oxide semiconductor layer 403 may be amorphous; the n-type oxide semiconductor layers which are to be the source and drain regions may be amorphous; or the oxide semiconductor layer 403 may include micro crystals.

Note that the first oxide semiconductor film 433 and the first n-type oxide semiconductor film 440 may be formed successively without being exposed to air. Successive film formation without being exposed to air makes it possible to obtain each interface between stacked layers, which is not contaminated by atmospheric components or an impurity element floating in air, such as moisture, hydrocarbon, or the like. Therefore, variation in characteristics of the transistors can be reduced. Note that the gate insulating layer 402, the first oxide semiconductor film 433, and the first n-type oxide semiconductor film 440 may be formed successively.

Next, as in Embodiment 1, the first oxide semiconductor film 433 is subjected to heat treatment. By performance of heat treatment and slow cooling under an inert gas atmosphere or under reduced pressure, resistance of the first oxide semiconductor film 433 is reduced (i.e., the carrier concentration is increased, preferably to $1 \times 10^{18}$/cm$^3$ or higher), so that a low-resistance oxide semiconductor film (a second n-type oxide semiconductor film) can be formed.

The first oxide semiconductor film 433 is subjected to heat treatment under an inert gas (nitrogen or a rare gas such as helium, neon, or argon) atmosphere or reduced pressure. By the heat treatment under the above atmosphere on the first oxide semiconductor film 433, impurities such as hydrogen and moisture contained in the first oxide semiconductor film 433 can be removed.

It is preferable that impurities such as moisture and hydrogen be not contained in nitrogen or a rare gas such as helium, neon, or argon in the heat treatment. Alternatively, the purity of nitrogen or a rare gas such as helium, neon, or argon introduced in a heat treatment apparatus is preferably 6 N (99.9999%) or higher, more preferably 7 N (99.99999%) or higher (that is, the concentration of the impurities is 1 ppm or lower, preferably 0.1 ppm or lower).

In this embodiment, an electric furnace has a structure in which the temperature increases at greater than or equal to 0.1° C./min and less than or equal to 20° C./min, the atmosphere in the chamber is a nitrogen atmosphere or a rare gas atmosphere, and the temperature is set at greater than or equal to 200° C. and less than or equal to 600° C., preferably greater than or equal to 400° C. and less than or equal to 600° C. In such a manner, the first oxide semiconductor film 433 and the first n-type oxide semiconductor film 440 which are formed over the substrate are heated. Alternatively, the pressure is reduced by an evacuation means, and the temperature is set at greater than or equal to 200° C. and less than or equal to 600° C., preferably greater than or equal to 400° C. and less than or equal to 600° C. In such a manner, the first oxide semiconductor film 433 and the first n-type oxide semiconductor film 440 which are formed over the substrate are heated, so that a second oxide semiconductor film and a second n-type oxide semiconductor film are formed.

After the heat treatment, the heaters of the electric furnace are turned off, so that the chamber is slowly cooled (gradually cooled). Note that the electric furnace preferably has a structure in which the temperature decreases at greater than or equal to 0.1° C./min and less than or equal to 15° C./min.

Through the heat treatment in the above-described manner, the reliability of the transistor formed later can be improved.

Figure 5B:
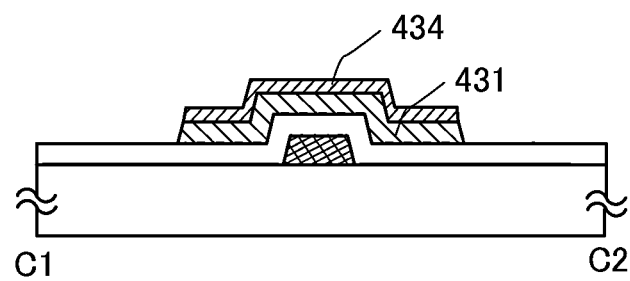
Figure 5C:
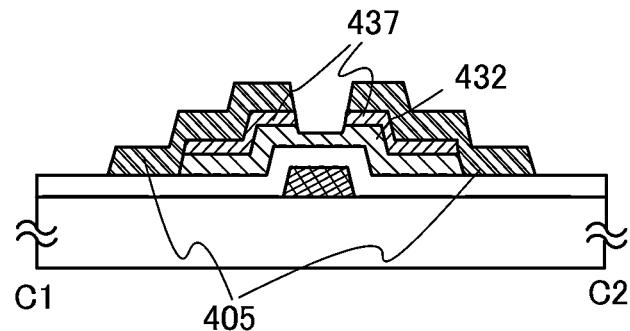
Figure 5D:
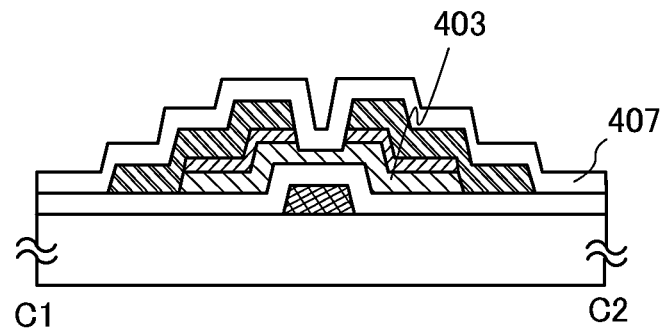

Next, a resist mask (not shown) is formed over the second oxide semiconductor film and the second n-type oxide semiconductor film by a photolithography step, and the films are processed into an island-shaped second oxide semiconductor layer 431 and a second n-type oxide semiconductor layer 434 by an etching step (see FIG. 5B).

Note that here, the oxide semiconductor films are processed after the heat treatment; however, the heat treatment may be performed after the oxide semiconductor films are processed.

Next, after the resist mask is removed, a conductive film is formed over the second n-type oxide semiconductor layer 434.

As a material for the conductive film, an element selected from aluminum, chromium, tantalum, titanium, molybdenum, or tungsten; an alloy containing any of the above metal elements as its component; an alloy containing the above metal elements in combination; and the like can be given.

If heat treatment is performed after formation of the conductive film, a conductive film having at least enough heat resistance to the heat treatment is used.

Next, a photolithography step is performed. A resist mask is formed over the conductive film, and the conductive film is etched, whereby the source and drain electrode layers 405 are formed. Note that the second n-type oxide semiconductor layer 434 in a region between source and drain electrodes which are formed by the source and drain electrode layers 405 (i.e., a back channel portion) is etched with use of the same resist mask, so that second n-type oxide semiconductor layers 437 which are to be source and drain regions are formed (see FIG. 5C). Note that only part of the second oxide semiconductor layer 431 is etched to be a third oxide semiconductor layer 432 having a groove (a recessed portion).

Next, the first protective insulating layer 407 is formed using an inorganic insulating film containing oxygen, such as silicon oxide or silicon nitride oxide, in contact with the third oxide semiconductor layer 432. Here, as in Embodiment 1, a silicon oxide film having a thickness of 300 nm is formed by a sputtering method as the first protective insulating layer 407.

When the first protective insulating layer 407 is formed by a sputtering method, a plasma CVD method, or the like to be in contact with the low-resistance first oxide semiconductor layer 432 with use of silicon oxide, in the low-resistance third oxide semiconductor layer 432, at least a region in contact with the first protective insulating layer 407 has increased resistance (i.e., the carrier concentration is reduced, preferably to lower than $1 \times 10^{18}/cm^3$). Thus, a high-resistance oxide semiconductor region can be formed.

During a manufacture process of the transistor, it is important to increase and decrease the carrier concentration in the third oxide semiconductor layer 432 through performance of heat treatment and slow cooling under an inert gas atmosphere (or reduced pressure), formation of an insulating oxide, and the like. The third oxide semiconductor layer 432 becomes the oxide semiconductor layer 403 having a high-resistance oxide semiconductor region (see FIG. 5D).

Note that steps after formation of the first protective insulating layer 407 are the same as those of Embodiment 1. That is, the second gate electrode layer 409 is formed over the first protective insulating layer 407.

Note that a resin layer may be provided over the second gate electrode layer 409. By provision of the resin layer over the second gate electrode layer 409, unevenness due to a structure of the transistor 472 can be reduced and the element can be planarized.

Note that the transistor 472 may be subjected to heat treatment under a nitrogen atmosphere or an air atmosphere (in air). This heat treatment is preferably performed at a temperature of 300° C. or less, and the timing of the heat treatment is not particularly limited as long as it is performed after an insulating film which is to be the first protective insulating layer 407 is formed. For example, heat treatment is performed at 350° C. for one hour under a nitrogen atmosphere. If the heat treatment is performed, variation in electric characteristics of the transistor 472 can be reduced.

Through the above steps, the transistor 472 illustrated in FIG. 4A can be formed. Note that in the transistor 472, the first protective insulating layer 407 functions as a second gate insulating layer.

FIG. 4B illustrates a structure in which a resin layer 408 is formed between the second gate electrode layer 409 and the first protective insulating layer 407 which covers the first gate electrode layer 401, the gate insulating layer 402, the oxide semiconductor layer 403, the n-type oxide semiconductor layers 404, and the source and drain electrode layers 405.

A transistor 472B in FIG. 4B has a structure which is partly different from that of FIG. 4A. In FIG. 4B, the same portions as those of FIG. 4A other than different portions are denoted by the same reference numerals.

The resin layer 408 covers the source and drain electrode layers 405 and the oxide semiconductor layer 403 having the thin region with the first protective insulating layer 407 provided therebetween. The resin layer 408 can be formed using a photosensitive or non-photosensitive organic material to have a thickness of 0.5 μm to 3 μm. As the photosensitive or non-photosensitive organic material used for the resin layer 408, polyimide, acrylic, polyamide, polyimideamide, resist, benzocyclobutene, or a stack of any of these materials is used. Here, a layer of photosensitive polyimide is formed by a coating method as the resin layer 408. After polyimide is applied to the entire surface, light exposure, development, and baking are performed, whereby the resin layer 408 of polyimide whose surface is plane and has a thickness of 1.5 μm is formed.

By provision of the resin layer 408, unevenness due to a structure of the transistor 472B can be reduced and the surface on which the second gate electrode layer 409 is formed can be planarized.

Note that as illustrated in FIG. 4A, the width of the second gate electrode layer 409 is made larger than that of the first gate electrode layer 401 and that of the oxide semiconductor layer 403, whereby the oxide semiconductor layer 403 can be shielded from light by the second gate electrode layer 409. Gate voltage can be applied to the entire oxide semiconductor layer 403 from the second gate electrode layer 409.

Note that even if the structure of FIG. 4A or FIG. 4B is employed, in the case where a portion in which the first protective insulating layer 407 and the resin layer 408 are stacked is thin, a problem of parasitic capacitance between the second gate electrode layer 409 and the source and drain electrode layers 405 arises in some cases. In the case where a problem of parasitic capacitance arises, the width of the second gate electrode layer 409 is preferably made small so that the area where the second gate electrode layer 409 and the source and drain electrode layers 405 overlap with each other can be reduced. When the area where they overlap with each other is reduced, parasitic capacitance can be reduced.

Note that in the case where parasitic capacitance does not become a problem because the portion in which the resin layer 408 and the first protective insulating layer 407 are stacked is sufficiently thick, the second gate electrode may be used as a common gate electrode which covers a plurality of transistors in the driver circuit and may have an area substantially the same or larger than the area of the driver circuit.

Note that in the above description, an example in which a two-tone photomask is used in a photolithography step is shown. When a resist mask including regions having different thicknesses (for example, two different thicknesses of a two-tone mask) is used, the number of resist masks can be reduced, so that the process can be simplified and cost can be reduced.

In the case of using a multi-tone mask, after the oxide semiconductor film of two stacked layers and the conductive film are stacked, a resist mask including regions having different thicknesses is formed over the conductive film, and an oxide semiconductor layer having a thin region and source and drain electrode layers are formed with use of the resist mask. In this case, end portions of the source and drain electrode layers and end portions of the oxide semiconductor layer are generally aligned with each other, and side surfaces of the oxide semiconductor layer are exposed. Therefore, in the case where the first protective insulating layer 407 is formed, the side surfaces and the region (the thin region) which does not overlap with the source and drain electrode layers of the oxide semiconductor layer are in contact with the first protective insulating layer 407.

The channel formation region in the semiconductor layer included in the transistor of this embodiment is a high-resistance region; thus, electric characteristics of the transistor are stabilized and increase in off current can be prevented. Therefore, a semiconductor device (a display device) including a transistor which has favorable electric characteristics and high reliability can be provided.

Note that this embodiment can be implemented in combination with any of other embodiments described in this specification as appropriate.

[Embodiment 3]

In this embodiment, a transistor that can be applied to a display device which is one embodiment of the present invention and that is different from the transistors of Embodiments 1 and 2 and a manufacturing method thereof will be described. In a display device which is one embodiment of the present invention, the transistor of this embodiment is provided in at least a driver circuit portion.

Figure 6A:
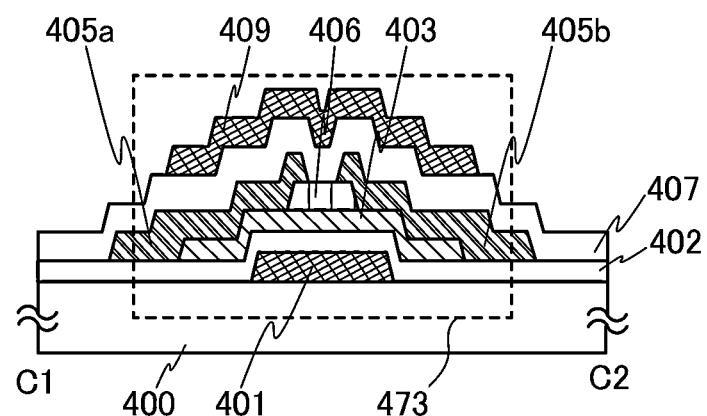
FIGS. 6A and 6B are diagrams each illustrating a transistor which is one embodiment of the present invention.
Figure 6B:
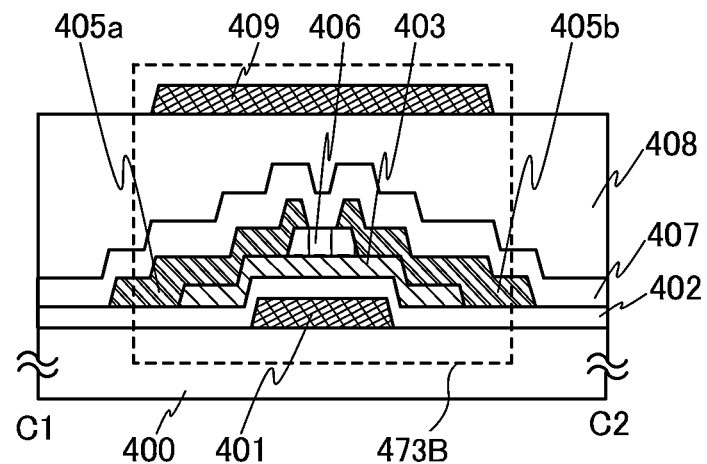

FIGS. 6A and 6B each illustrate a cross-sectional view of a transistor which is one embodiment of the present invention. A transistor 473 is a bottom-gate transistor, and includes a first gate electrode layer 401, a gate insulating layer 402, an oxide semiconductor layer 403, source and drain electrode layers 405 (a source electrode 405a and a drain electrode 405b), and a channel protective layer 406 which are provided over a substrate 400. In addition, a first protective insulating layer 407 which is in contact with the channel protective layer 406 and covers the first gate electrode layer 401, the gate insulating layer 402, the oxide semiconductor layer 403, and the source and drain electrode layers 405 is included, and a second gate electrode layer 409 which is formed over the first protective insulating layer 407 and overlaps with the oxide semiconductor layer 403 is included. That is, the transistor 473 described in this embodiment is a channel-stop-type transistor.

One example of a method for manufacturing the transistor 473 in FIG. 6A will be described with reference to FIGS. 7A to 7D.

Note that steps in which the first gate electrode layer 401 is formed over the substrate 400 having an insulating surface, the gate insulating layer 402 covering the first gate electrode layer 401 is formed, and an oxide semiconductor film is formed are the same as those of Embodiment 1. Therefore, detailed description is omitted here and the same portions as those of FIG. 2A are denoted by the same reference numerals.

A first oxide semiconductor film is formed over the gate insulating layer 402 as in Embodiment 1.

Next, a photolithography step is performed. A resist mask is formed over the first oxide semiconductor film, and the first oxide semiconductor film is etched, so that an island-shaped oxide semiconductor layer 430 is formed. Note that etching here is not limited to wet etching and may be dry etching (see FIG. 7A).

Next, as in Embodiment 1, the first oxide semiconductor layer 430 is subjected to heat treatment. By performance of heat treatment and slow cooling under an inert gas atmosphere or under reduced pressure, resistance of the first oxide semiconductor layer 430 is reduced (i.e., the carrier concentration is increased, preferably to $1 \times 10^{18}/cm^3$ or higher), so that a low-resistance second oxide semiconductor layer 431 can be formed.

The first oxide semiconductor layer 430 is subjected to heat treatment under an inert gas (nitrogen or a rare gas such as helium, neon, or argon) atmosphere or reduced pressure. By the heat treatment under the above atmosphere on the first oxide semiconductor layer 430, impurities such as hydrogen and moisture contained in the first oxide semiconductor layer 430 can be removed.

It is preferable that impurities such as moisture and hydrogen be not contained in nitrogen or a rare gas such as helium, neon, or argon in the heat treatment. Alternatively, the purity of nitrogen or a rare gas such as helium, neon, or argon introduced in a heat treatment apparatus is preferably 6 N (99.9999%) or higher, more preferably 7 N (99.99999%) or higher (that is, the concentration of the impurities is 1 ppm or lower, preferably 0.1 ppm or lower).

In this embodiment, an electric furnace has a structure in which the temperature increases at greater than or equal to 0.1° C./min and less than or equal to 20° C./min, the atmosphere in the chamber is a nitrogen atmosphere or a rare gas atmosphere, and the temperature is set at greater than or equal to 200° C. and less than or equal to 600° C., preferably greater than or equal to 400° C. and less than or equal to 600° C. In such a manner, the first oxide semiconductor layer 430 which is formed over the substrate is heated in the heated chamber. Alternatively, the pressure is reduced by an evacuation means, and the temperature is set at greater than or equal to 200° C. and less than or equal to 600° C., preferably greater than or equal to 400° C. and less than or equal to 600° C. In such a manner, the first oxide semiconductor layer 430 which is formed over the substrate is heated, so that the second oxide semiconductor layer 431 is formed.

After the heat treatment, the heaters of the electric furnace are turned off, so that the chamber is slowly cooled (gradually cooled). Note that the electric furnace preferably has a structure in which the temperature decreases at greater than or equal to 0.1° C./min and less than or equal to 15° C./min.

Through the heat treatment in the above-described manner, the reliability of the transistor formed later can be improved.

Next, an insulating film which is to be a channel protective layer is formed in contact with the second oxide semiconductor layer 431. Moisture, hydrogen ions, OW, and the like are reduced in the insulating film which is to be the channel protective layer and is formed in contact with the second oxide semiconductor layer, and are prevented from entering the insulating film from the outside. The insulating film is formed using an insulating inorganic material containing oxygen. Specifically, silicon oxide, silicon oxynitride, or silicon nitride oxide is used. That is, the insulating film which is to be the channel protective layer may be formed in a manner similar to formation of the first protective insulating layer 407 described in Embodiment 1.

In this embodiment, as the insulating film which is to be the channel protective layer, a 300-nm-thick silicon oxide film is formed by a sputtering method. The substrate temperature in film formation may be from room temperature to 300° C. or lower and in this embodiment, is 100° C. The formation of the silicon oxide film by a sputtering method can be performed under a rare gas (e.g., argon) atmosphere, an oxygen atmosphere, or an atmosphere of a mixed gas of a rare gas (e.g., argon) and oxygen. As a target, a silicon oxide target or a silicon target may be used. For example, with use of a silicon target, a silicon oxide film can be formed by a sputtering method under an atmosphere containing oxygen.

When the insulating film which is to be the channel protective layer is formed by a sputtering method, a plasma CVD method, or the like to be in contact with the second oxide semiconductor layer 431, in the low-resistance second oxide semiconductor layer 431, at least a region in contact with the insulating film which is to be the channel protective layer has increased resistance ((i.e., the carrier concentration is reduced, preferably to lower than $1 \times 10^{18}/cm^3$). Thus, a high-resistance oxide semiconductor region can be formed.

During a manufacture process of the transistor, it is important to increase and decrease the carrier concentration in the third oxide semiconductor layer through performance of heat treatment and slow cooling under an inert gas atmosphere (or reduced pressure), formation of an insulating oxide, and the like. The second oxide semiconductor layer 431 becomes the oxide semiconductor layer 403 having a high-resistance oxide semiconductor region.

Next, a photolithography step is performed. A resist mask is formed over the insulating film that is to be the channel protective layer, and an unnecessary portion is removed by etching, so that the channel protective layer 406 is formed. Note that the width of the first gate electrode layer 401 is preferably larger than that of the channel protective layer 406 (i.e., the length of the channel protective layer 406 in the channel length direction) (see FIG. 7B).

Next, after the resist mask is removed, a conductive film is formed over the second oxide semiconductor layer 431 and the channel protective layer 406.

As a material for the conductive film, an element selected from aluminum, chromium, tantalum, titanium, molybdenum, or tungsten; an alloy containing any of the above metal elements as its component; an alloy containing the above metal elements in combination; and the like can be given.

If heat treatment is performed after formation of the conductive film, a conductive film having at least enough heat resistance to the heat treatment is used.

Next, a photolithography step is performed. A resist mask is formed over the conductive film, and the conductive film is etched, whereby the source and drain electrode layers 405 (the source electrode 405a and a drain electrode 405b) are formed. In this etching, the channel protective layer 406 functions as an etching stopper of the oxide semiconductor layer 403. Therefore, the oxide semiconductor layer 403 is not etched.

Because of the structure in which the channel protective layer 406 is provided on and in contact with a channel formation region of the oxide semiconductor layer 403, damage to the channel formation region of the oxide semiconductor layer 403 (for example, reduction in film thickness due to plasma or an etchant in etching, or oxidation) in the manufacturing process can be prevented. Therefore, the reliability of the transistor 473 can be improved.

Next, the first protective insulating layer 407 is formed over the source and drain electrode layers 405 and the channel protective layer 406. Moisture, hydrogen ions, OH⁻, and the like are reduced in the first protective insulating layer 407, and are prevented from entering the first protective insulating layer 407 from the outside. The first protective insulating layer 407 is formed using an insulating inorganic material containing oxygen. Specifically, silicon oxide, silicon nitride, silicon oxynitride, silicon nitride oxide, aluminum oxide, aluminum nitride, magnesium oxide, yttrium oxide, hafnium oxide, or tantalum oxide can be given (see FIG. 7D).

Note that steps after formation of the first protective insulating layer 407 are the same as those of Embodiment 1. That is, the second gate electrode layer 409 is formed over the first protective insulating layer 407.

Note that a resin layer may be provided over the second gate electrode layer 409. By provision of the resin layer over the second gate electrode layer 409, unevenness due to a structure of the transistor 473 can be reduced and the element can be planarized.

Note that the transistor 473 may be subjected to heat treatment under a nitrogen atmosphere or an air atmosphere (in air). This heat treatment is performed at a temperature of 300° C. or less, and the timing of the heat treatment is not particularly limited as long as it is performed after the channel protective layer 406 is formed. For example, heat treatment is performed at 350° C. for one hour under a nitrogen atmosphere. If the heat treatment is performed, variation in electric characteristics of the transistor 473 can be reduced.

Through the above steps, the transistor 473 illustrated in FIG. 6A can be formed. Note that in the transistor 473, a portion in which the channel protective layer 406 and the first protective insulating layer 407 are stacked functions as a second gate insulating layer.

A transistor 473B in FIG. 6B has a structure which is partly different from that of FIG. 6A. In FIG. 6B, the same portions as those of FIG. 6A other than different portions are denoted by the same reference numerals.

FIG. 6B illustrates a structure in which a resin layer 408 is formed between the second gate electrode layer 409 the first protective insulating layer 407 which covers the first gate electrode layer 401, the gate insulating layer 402, the oxide semiconductor layer 403, and the source and drain electrode layers 405.

The resin layer 408 covers the source and drain electrode layers 405 and the channel protective layer 406 with the first protective insulating layer 407 provided therebetween. The resin layer 408 can be formed using a photosensitive or non-photosensitive organic material to have a thickness of 0.5 μm to 3 μm. As the photosensitive or non-photosensitive organic material used for the resin layer 408, polyimide, acrylic, polyamide, polyimideamide, resist, benzocyclobutene, or a stack of any of these materials is used. Here, a layer of photosensitive polyimide is formed by a coating method as the resin layer 408. After polyimide is applied to the entire surface, light exposure, development, and baking are performed, whereby the resin layer 408 of polyimide whose surface is plane and has a thickness of 1.5 μm can be formed.

By provision of the resin layer 408, unevenness due to a structure of the transistor 473B can be reduced and the surface on which the second gate electrode layer 409 is formed can be planarized.

Note that as illustrated in FIG. 6A, the width of the second gate electrode layer 409 is made larger than that of the gate electrode layer 401 and that of the oxide semiconductor layer 403, whereby gate voltage can be applied to the entire oxide semiconductor layer 403 from the second gate electrode layer 409.

Note that even if the structure of FIG. 6A or FIG. 6B is employed, in the case where a portion in which the channel protective layer 406, the first protective insulating layer 407, and the resin layer 408 are stacked is thin, a problem of parasitic capacitance between the second gate electrode layer 409 and the source and drain electrode layers 405 arises in some cases. In the case where a problem of parasitic capacitance arises, the width of the second gate electrode layer 409 is made smaller than that of the first gate electrode layer 401, and the area where the second gate electrode layer 409 and the source and drain electrode layers 405 overlap with each other is preferably reduced. When the area where they overlap with each other is reduced, parasitic capacitance can be reduced. Further, the width of the first gate electrode layer 401 may be set to be smaller than that of the channel protective layer 406 and the width of the second gate electrode layer 409 may be set to be smaller than that of the channel protective layer 406 so that the second gate electrode 409 does not overlap with the source and drain electrode layers 405, whereby more parasitic capacitance may be reduced.

Note that in the case where parasitic capacitance does not become a problem because the portion in which the resin layer 408 and the first protective insulating layer 407 are stacked is sufficiently thick, the second gate electrode may be used as a common gate electrode which covers a plurality of transistors in the driver circuit and may have an area substantially the same or larger than the area of the driver circuit.

The channel formation region in the semiconductor layer included in the transistor of this embodiment is a high-resistance region; thus, electric characteristics of the transistor are stabilized and increase in off current can be prevented. Therefore, a semiconductor device (a display device) including a transistor which has favorable electric characteristics and high reliability can be provided.

Note that this embodiment can be implemented in combination with any of other embodiments described in this specification as appropriate.

[Embodiment 4]

In this embodiment, a transistor that can be applied to a display device which is one embodiment of the present invention and that is different from the transistors of Embodiments 1 to 3 and a manufacturing method thereof will be described. In a display device which is one embodiment of the present invention, the transistor of this embodiment is provided in at least a driver circuit portion.

Figure 8A:
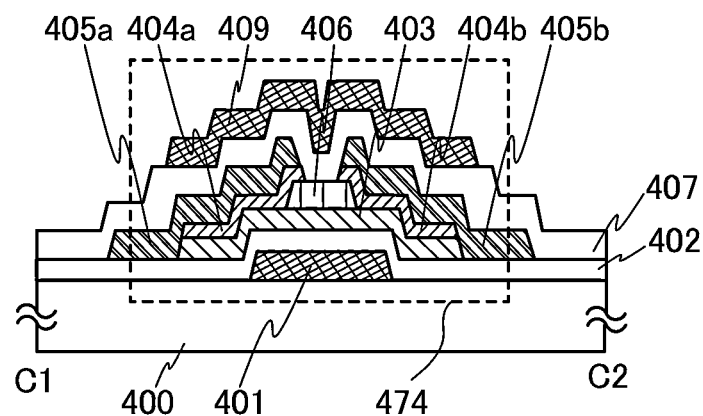
FIGS. 8A and 8B are diagrams each illustrating a transistor which is one embodiment of the present invention.
Figure 8B:
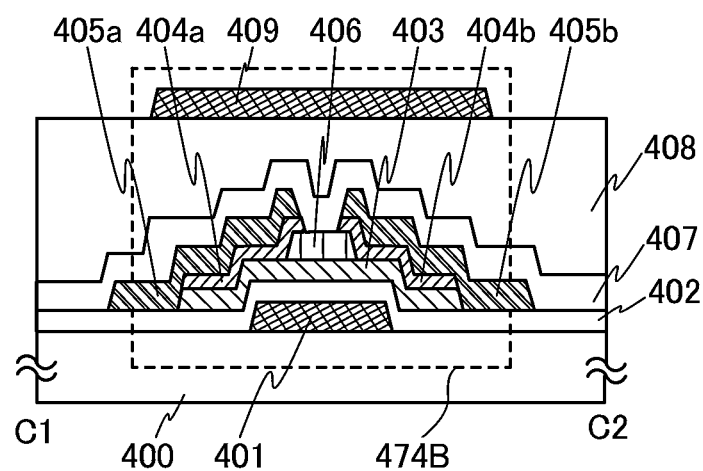

FIGS. 8A and 8B each illustrate a cross-sectional view of a transistor which is one embodiment of the present invention. A transistor 474 is a bottom-gate transistor, and includes a first gate electrode layer 401, a gate insulating layer 402, an oxide semiconductor layer 403, n-type oxide semiconductor layers 404a and 404b, source and drain electrode layers 405 (a source electrode 405a and a drain electrode 405b), and a channel protective layer 406 which are provided over a substrate 400. In addition, a first protective insulating layer 407 which is in contact with the channel protective layer 406 and covers the first gate electrode layer 401, the gate insulating layer 402, the oxide semiconductor layer 403, the n-type oxide semiconductor layers 404a and 404b, and the source and drain electrode layers 405 (the source electrode 405a and the drain electrode 405b) is included, and a second gate electrode layer 409 which is formed over the first protective insulating layer 407 and overlaps with the oxide semiconductor layer 403 is included. That is, the transistor 474 described in this embodiment is a channel-stop-type transistor.

One example of a method for manufacturing the transistor 474 in FIG. 8A will be described with reference to FIGS. 9A to 9D.

Figure 7A:
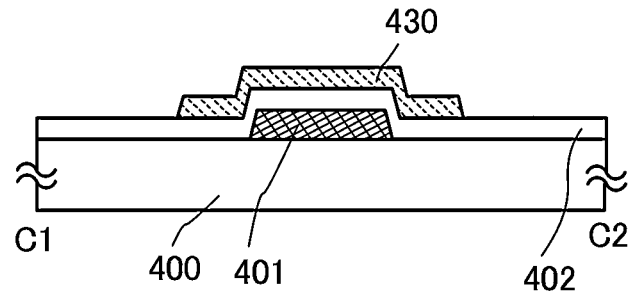
FIGS. 7A to 7D are diagrams illustrating a transistor which is one embodiment of the present invention.
Figure 7B:
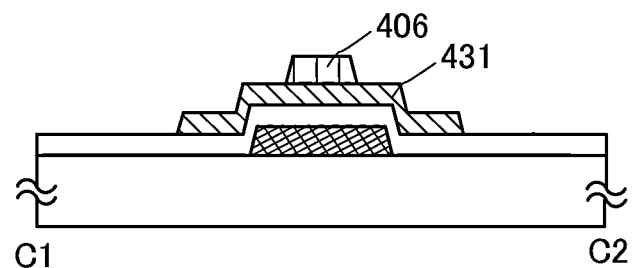
Figure 7C:
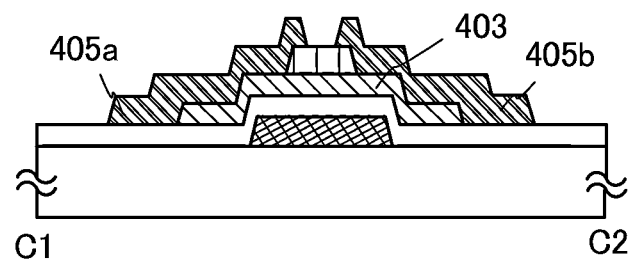
Figure 7D:
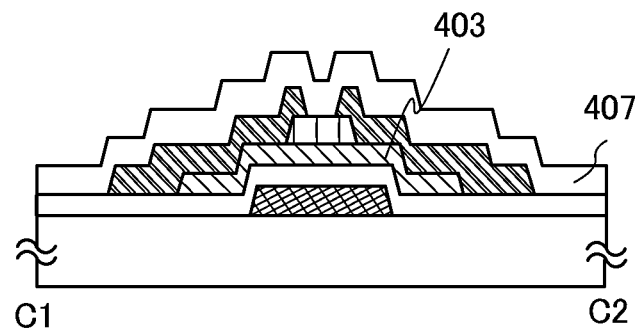

Note that steps in which the first gate electrode layer 401 is formed over the substrate 400 having an insulating surface, the gate insulating layer 402 covering the first gate electrode layer 401 is formed, and an oxide semiconductor film is formed are the same as those of Embodiment 3. Therefore, detailed description is omitted here and the same portions as those of FIG. 7A are denoted by the same reference numerals.

A first oxide semiconductor film 433 is formed over the gate insulating layer 402 as in Embodiment 1.

Next, as in Embodiment 1, the first oxide semiconductor film 433 is subjected to heat treatment. By performance of heat treatment and slow cooling under an inert gas atmosphere or under reduced pressure, resistance of the first oxide semiconductor film 433 is reduced (i.e., the carrier concentration is increased, preferably to $1 \times 10^{18}/cm^3$ or higher), so that a low-resistance second oxide semiconductor film can be formed.

The first oxide semiconductor film 433 is subjected to heat treatment under an inert gas (nitrogen or a rare gas such as helium, neon, or argon) atmosphere or reduced pressure. By the heat treatment under the above atmosphere on the first oxide semiconductor film 433, impurities such as hydrogen and moisture contained in the first oxide semiconductor film 433 can be removed.

It is preferable that impurities such as moisture and hydrogen be not contained in nitrogen or a rare gas such as helium, neon, or argon in the heat treatment. Alternatively, the purity of nitrogen or a rare gas such as helium, neon, or argon introduced in a heat treatment apparatus is preferably 6 N (99.9999%) or higher, more preferably 7 N (99.99999%) or higher (that is, the concentration of the impurities is 1 ppm or lower, preferably 0.1 ppm or lower).

In this embodiment, an electric furnace has a structure in which the temperature increases at greater than or equal to 0.1° C./min and less than or equal to 20° C./min, the atmosphere in the chamber is a nitrogen atmosphere or a rare gas atmosphere, and the temperature is set at greater than or equal to 200° C. and less than or equal to 600° C., preferably greater than or equal to 400° C. and less than or equal to 600° C. In such a manner, the first oxide semiconductor film 433 which is formed over the substrate is heated in the heated chamber.

After the heat treatment, the heaters of the electric furnace are turned off, so that the chamber is slowly cooled (gradually cooled). Note that the electric furnace preferably has a structure in which the temperature decreases at greater than or equal to 0.1° C./min and less than or equal to 15° C./min.

Through the heat treatment in the above-described manner, the reliability of the transistor formed later can be improved.

Next, an insulating film which is to be a channel protective layer is formed in contact with the second oxide semiconductor film. Moisture, hydrogen ions, OW, and the like are reduced in the insulating film which is to be the channel protective layer and is formed in contact with the second oxide semiconductor film, and are prevented from entering the insulating film from the outside. The insulating film is formed using an insulating inorganic material containing oxygen. Specifically, a silicon oxide film or a silicon nitride oxide film is used.

In this embodiment, as the insulating film which is to be the channel protective layer, a 300-nm-thick silicon oxide film is formed by a sputtering method. The substrate temperature in film formation may be from room temperature to 300° C. or lower and in this embodiment, is 100° C. The formation of the silicon oxide film by a sputtering method can be performed under a rare gas (e.g., argon) atmosphere, an oxygen atmosphere, or an atmosphere of a mixed gas of a rare gas (e.g., argon) and oxygen. As a target, a silicon oxide target or a silicon target may be used. For example, with use of a silicon target, a silicon oxide film can be formed by a sputtering method under an atmosphere containing oxygen.

When the insulating film which is to be the channel protective layer is formed by a sputtering method, a plasma CVD method, or the like to be in contact with the second oxide semiconductor film, in the low-resistance second oxide semiconductor film, at least a region in contact with the insulating film which is to be the channel protective layer has increased resistance ((i.e., the carrier concentration is reduced, preferably to lower than $1 \times 10^{18}/cm^3$). Thus, a high-resistance oxide semiconductor region can be formed.

During a manufacture process of the transistor, it is important to increase and decrease the carrier concentration in the oxide semiconductor layer through performance of heat treatment and slow cooling under an inert gas atmosphere (or reduced pressure), formation of an insulating oxide, and the like. The second oxide semiconductor film becomes the third oxide semiconductor film having a high-resistance oxide semiconductor region.

Next, a photolithography step is performed. A resist mask is formed over the insulating film that is to be the channel protective layer, and an unnecessary portion is removed by etching, so that the channel protective layer 406 is formed.

Note that the width of the first gate electrode layer 401 is preferably larger than that of the channel protective layer 406 (i.e., the length of the channel protective layer 406 in the channel length direction).

Next, an n-type oxide semiconductor film serving as source and drain regions is formed over the third oxide semiconductor film and the channel protective layer 406. The n-type oxide semiconductor film is formed using an oxide semiconductor film having lower resistance than the third oxide semiconductor film.

The n-type oxide semiconductor film may be formed using, for example, an oxynitride film containing indium, gallium, and zinc which is obtained by use of a metal oxide containing indium (In), gallium (Ga), and zinc (Zn) ($In_2O_3:Ga_2O_3:ZnO=1:1:1$) by a sputtering method under an atmosphere containing a nitrogen gas, an Al—Zn—O-based non-single-crystal film, or an Al—Zn—O-based non-single-crystal film containing nitrogen, i.e., an Al—Zn—O—N-based non-single-crystal film (also referred to as an AZON film).

Note that an In—Ga—Zn—O-based non-single-crystal film used in this embodiment may be amorphous, microcrystalline, or polycrystalline. Alternatively, the crystalline state is not limited thereto, and it may be a single crystal. By change in the condition of film formation or composition ratio of a target in the above manner, crystalline states of the third oxide semiconductor film and the n-type oxide semiconductor film can be changed.

Therefore, the crystalline states of the n-type oxide semiconductor film which is to be the source and drain regions and the third oxide semiconductor film which forms a channel region may be different from each other depending on the condition of the formation of the oxide semiconductor film or the composition ratio of the target. For example, the n-type oxide semiconductor film which is to be the source and drain regions may include micro crystals; the third oxide semiconductor film may be amorphous; the n-type oxide semiconductor film which is to be the source and drain regions may be amorphous; or the third oxide semiconductor film may include micro crystals.

Next, a photolithography step is performed. A resist mask is formed over the n-type oxide semiconductor film, and an unnecessary portion of the n-type oxide semiconductor film and the third oxide semiconductor film is removed by etching. In such a manner, the oxide semiconductor layer 403 is formed (see FIG. 9B).

Note that the photolithography step is not particularly limited to the above description, and the following manner may be alternatively employed: a resist mask is formed over the insulating film that is to be a channel protective layer; an unnecessary portion of the insulating film that is to be the channel protective layer and the third oxide semiconductor film is removed by etching; the resist mask is reduced; and an unnecessary portion of the insulating film that is to be the channel protective layer is further removed by etching. In such a manner, the channel protective layer 406 may be formed. In this case, the resist mask which is formed first over the insulating film that is to be the channel protective layer is preferably a resist mask which is formed using a multi-tone mask and is provided with regions having different thicknesses.

Next, after the resist mask is removed, a conductive film is formed over the n-type oxide semiconductor film.

As a material for the conductive film, an element selected from aluminum, chromium, tantalum, titanium, molybdenum, or tungsten; an alloy containing any of the above metal elements as its main component; an alloy containing the above metal elements in combination; and the like can be given.

If heat treatment is performed after formation of the conductive film, a conductive film having at least enough heat resistance to the heat treatment is used.

Next, a photolithography step is performed. A resist mask is formed over the conductive film, and the conductive film is etched, whereby the source and drain electrode layers 405 are formed.

Then, a region of the n-type oxide semiconductor film, which is between the source electrode and the drain electrode formed from the source and drain electrode layers 405, is removed by etching with use of the same resist mask, whereby the n-type oxide semiconductor layers 404 which are to be the source and drain regions are formed.

The n-type oxide semiconductor layers 404 having low resistance are provided between the oxide semiconductor layer 403 and the source and drain electrode layers 405, whereby the transistor 474 can operate more stably as compared with the case of using only metal wirings.

In this etching, the channel protective layer 406 functions as an etching stopper of the oxide semiconductor layer 403. Therefore, the oxide semiconductor layer 403 is not etched. The channel protective layer 406 is provided, so that damage to the channel formation region of the oxide semiconductor layer 403 (for example, reduction in film thickness due to plasma or an etchant in etching, or oxidation) in the manufacturing process can be prevented. Therefore, the reliability of the transistor 474 can be improved (see FIG. 9C).

Figure 9A:
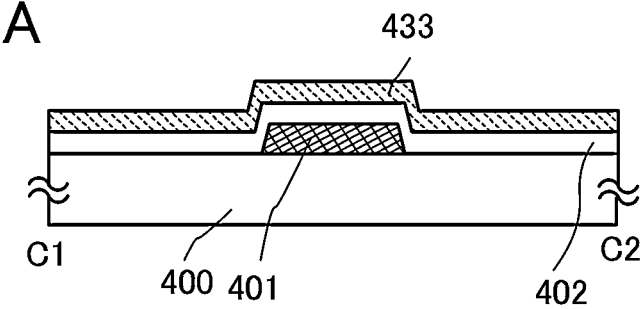
FIGS. 9A to 9D are diagrams illustrating a transistor which is one embodiment of the present invention.
Figure 9B:
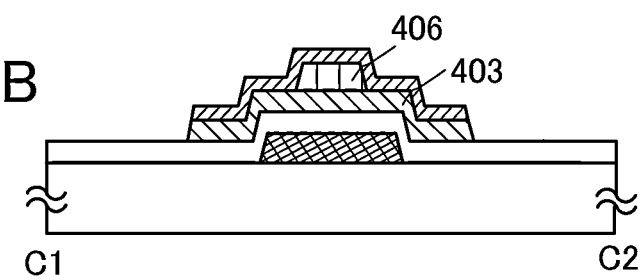
Figure 9C:
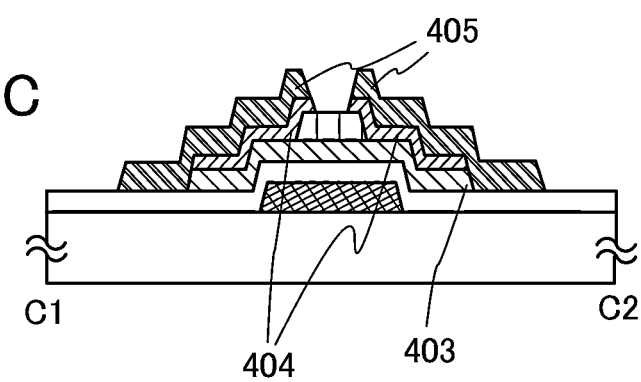
Figure 9D:
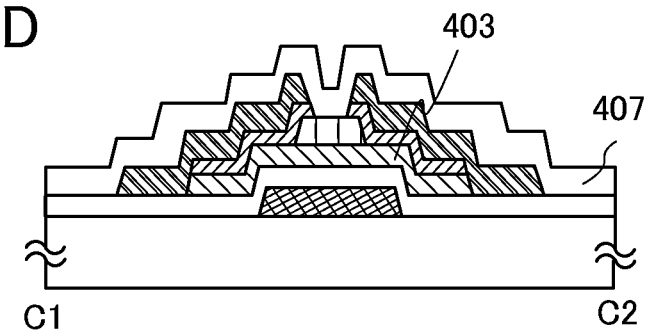

Next, the first protective insulating layer 407 is formed over the source and drain electrode layers 405 and the channel protective layer 406 (see FIG. 9D). Moisture, hydrogen ions, OH-, and the like are reduced in the first protective insulating layer 407, and are prevented from entering the first protective insulating layer 407 from the outside. The first protective insulating layer 407 is formed using an insulating inorganic material containing oxygen. Specifically, silicon oxide, silicon nitride, silicon oxynitride, silicon nitride oxide, aluminum oxide, aluminum nitride, magnesium oxide, yttrium oxide, hafnium oxide, or tantalum oxide can be given.

Note that steps after formation of the first protective insulating layer 407 are the same as those of Embodiment 1. That is, the second gate electrode layer 409 is formed over the first protective insulating layer 407.

Note that a resin layer may be provided over the second gate electrode layer 409. By provision of the resin layer over the second gate electrode layer 409, unevenness due to a structure of the transistor 474 can be reduced and the element can be planarized.

Note that the transistor 474 may be subjected to heat treatment under a nitrogen atmosphere or an air atmosphere (in air). This heat treatment is performed at a temperature of 300° C. or less, and the timing of the heat treatment is not particularly limited as long as it is performed after the channel protective layer 406 is formed. For example, heat treatment is performed at 350° C. for one hour under a nitrogen atmosphere. If the heat treatment is performed, variation in electric characteristics of the transistor 474 can be reduced.

Through the above steps, the transistor 474 illustrated in FIG. 8A can be formed. Note that in the transistor 474, a portion in which the channel protective layer 406 and the first protective insulating layer 407 are stacked functions as a second gate insulating layer.

A transistor 474B in FIG. 8B has a structure which is partly different from that of FIG. 8A. In FIG. 8B, the same portions as those of FIG. 8A other than different portions are denoted by the same reference numerals.

FIG. 8B illustrates a structure in which a resin layer 408 is formed between the second gate electrode layer 409 and the first protective insulating layer 407 which covers the transistor the first gate electrode layer 401, the gate insulating layer 402, the oxide semiconductor layer 403, the n-type oxide semiconductor layers 404, and the source and drain electrode layers 405.

The resin layer 408 covers the source and drain electrode layers 405 and the channel protective layer 406 with the first protective insulating layer 407 provided therebetween. The resin layer 408 can be formed using a photosensitive or non-photosensitive organic material to have a thickness of 0.5 μm to 3 μm. As the photosensitive or non-photosensitive organic material used for the resin layer 408, polyimide, acrylic, polyamide, polyimideamide, resist, benzocyclobutene, or a stack of any of these materials is used. Here, a layer of photosensitive polyimide is formed by a coating method as the resin layer 408. After polyimide is applied to the entire surface, light exposure, development, and baking are performed, whereby the resin layer 408 of polyimide whose surface is plane and has a thickness of 1.5 μm can be formed.

By provision of the resin layer 408, unevenness due to a structure of a transistor 474B can be reduced and the surface on which the second gate electrode layer 409 is formed can be planarized.

Note that as illustrated in FIG. 8A, the width of the second gate electrode layer 409 is made larger than that of the first gate electrode layer 401 and that of the oxide semiconductor layer 403, whereby gate voltage can be applied to the entire oxide semiconductor layer 403 from the second gate electrode layer 409.

Note that even if the structure of FIG. 8A or FIG. 8B is employed, in the case where a portion in which the channel protective layer 406, the first protective insulating layer 407, and the resin layer 408 are stacked is thin, a problem of parasitic capacitance between the second gate electrode layer 409 and the source and drain electrode layers 405 arises in some cases. In the case where a problem of parasitic capacitance arises, the width of the second gate electrode layer 409 is made smaller than that of the first gate electrode layer 401, and the area where the second gate electrode layer 409 and the source and drain electrode layers 405 overlap with each other is preferably reduced. When the area where they overlap with each other is reduced, parasitic capacitance can be reduced. Further, the width of the first gate electrode layer 401 may be set to be smaller than that of the channel protective layer 406 and the width of the second gate electrode 409 may be set to be smaller than that of the channel protective layer 406 so that the second gate electrode layer 409 does not overlap with the source and drain electrode layers 405, whereby more parasitic capacitance may be reduced.

Note that in the case where parasitic capacitance does not become a problem because the portion in which the resin layer 408 and the first protective insulating layer 407 are stacked is sufficiently thick, the second gate electrode may be used as a common gate electrode which covers a plurality of transistors in the driver circuit and may have an area substantially the same or larger than the area of the driver circuit.

The channel formation region in the semiconductor layer included in the transistor of this embodiment is a high-resistance region; thus, electric characteristics of the transistor are stabilized and increase in off current can be prevented. Therefore, a semiconductor device (a display device) including a transistor which has favorable electric characteristics and high reliability can be provided.

Note that this embodiment can be implemented in combination with any of other embodiments described in this specification as appropriate.

[Embodiment 5]

Figure 10A:
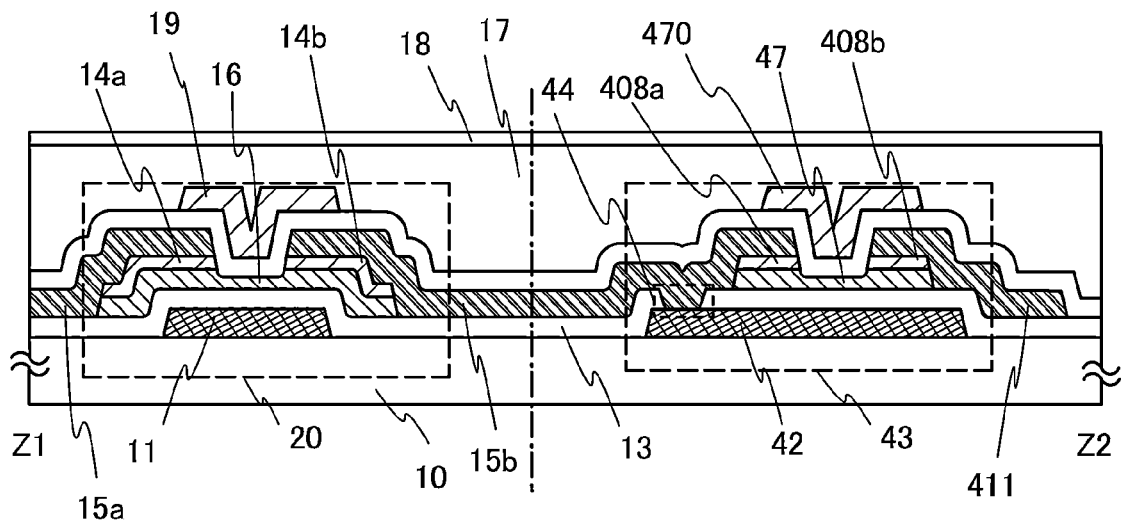
FIGS. 10A and 10B are diagrams illustrating a transistor which is one embodiment of the present invention.

In this embodiment, an example in which an inverter circuit in a driver circuit is formed using two n-channel transistors will be described. Transistors in FIG. 10A are the same as the transistor 471 in FIG. 1A of Embodiment 1 or the like, and thus the same parts are denoted by the same reference numerals. Note that n-type oxide semiconductor layers 14a and 14b are similar to the n-type oxide semiconductor layers 404 in Embodiment 2; a resin layer 17 is similar to the resin layer 408 in Embodiment 1; a first protective insulating layer 18 is similar to the first protective insulating layer 407 in Embodiment 1; and a second gate electrode layer 470 is similar to the second gate electrode layer 409 in Embodiment 1.

The driver circuit for driving a pixel portion is formed using an inverter circuit, a capacitor, a resistor, and the like. When two n-channel transistors are combined to form an inverter circuit, there are the following combinations: a combination of an enhancement type transistor and a depletion type transistor (hereinafter, a circuit formed by such a combination is referred to as an EDMOS circuit) and a combination of enhancement type transistors (hereinafter, a circuit formed by such a combination is referred to as an EEMOS circuit).

Figure 10B:
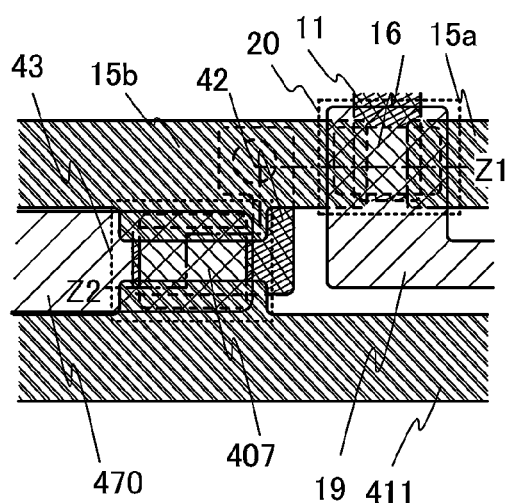

FIG. 10A illustrates a cross-sectional structure of the inverter circuit of the driver circuit. Note that a transistor 20 and a second transistor 43 in FIGS. 10A and 10B are inverted staggered channel-etched transistors and exemplify a transistor in which a wiring is provided over an oxide semiconductor layer with a source region or a drain region interposed therebetween.

In FIG. 10A, a first gate electrode 11 and a third gate electrode 42 are provided over a substrate 10. The first gate electrode 11 and the third gate electrode 42 can be formed to have a single-layer structure or a stacked-layer structure using a metal material such as molybdenum, titanium, chromium, tantalum, tungsten, aluminum, copper, neodymium, or scandium, or an alloy material containing any of these materials as its main component.

Further, over a first gate insulating layer 13 covering the first gate electrode 11 and the third gate electrode 42, an oxide semiconductor layer 16 and a second oxide semiconductor layer 47 are provided.

An electrode layer serving as a first terminal (a source electrode layer 15a) and an electrode layer serving as a second terminal (a drain electrode layer 15b) are provided over the oxide semiconductor layer 16. The electrode layer serving as the second terminal is directly connected to the third gate electrode 42 through a contact hole 44 formed in the first gate insulating layer 13. In addition, an electrode layer serving as a third terminal 411 is provided over the second oxide semiconductor layer 47.

The transistor 20 includes the first gate electrode 11, the first gate insulating layer 13 covering the first gate electrode 11, and the oxide semiconductor layer 16 overlapping with the first gate electrode 11 with the first gate insulating layer 13 between the first gate electrode 11 and the oxide semiconductor layer 16. The electrode layer serving as the first terminal (the source electrode layer 15a) is a power supply line to which negative voltage VDL is applied (a negative power supply line). This power supply line may be a power supply line with a ground potential (a ground potential power supply line). Note that in the inverter circuit, the electrode layer serving as the first terminal is the drain electrode layer and the electrode layer serving as the second terminal is the source electrode layer in some cases, depending on a potential of a wiring connected to the electrode layer serving as the second terminal (the drain electrode layer 15b).

The second transistor 43 includes the third gate electrode 42 and the second oxide semiconductor layer 47 overlapping with the third gate electrode 42 with the first gate insulating layer 13 between the third gate electrode 42 and the second oxide semiconductor layer 47. The third terminal 411 is a power supply line to which positive voltage VDH is applied (a positive power supply line). Note that in the inverter circuit, the electrode layer serving as the second terminal is the source electrode layer and the electrode layer serving as the third terminal 411 is the drain electrode layer in some cases, depending on a potential of a wiring connected to the electrode layer serving as the second terminal (the drain electrode layer 15b).

Here, a buffer layer 408a (also referred to as a source region or a drain region) is provided between the second oxide semiconductor layer 47 and the drain electrode layer 15b. A buffer layer 408b (also referred to as a drain region or a source region) is provided between the second oxide semiconductor layer 47 and the third terminal 411.

FIG. 10B is a top view of the inverter circuit of the driver circuit. In FIG. 10B, a cross section taken along chain line Z1-Z2 corresponds to FIG. 10A.

In this embodiment, in order that the transistor 20 can serve as an n-channel enhancement type transistor, a second gate insulating layer is provided over the oxide semiconductor layer 16 and a second gate electrode 19 is provided over the second gate insulating layer so that the threshold voltage of the transistor 20 is controlled by voltage applied to the second gate electrode 19.

Note that the example in which the electrode layer serving as the second terminal (the drain electrode layer 15b) is directly connected to the third gate electrode 42 through the contact hole 44 formed in the first gate insulating layer 13 is illustrated in FIGS. 10A and 10B without particular limitations. The electrode layer serving as the second terminal (the drain electrode layer 15b) may be electrically connected to the third gate electrode 42 with a connection electrode separately provided.

This embodiment can be implemented in combination with any of Embodiments 1 to 4 as appropriate.

[Embodiment 6]

In this embodiment, a display device which is one embodiment of the present invention will be described with reference to a block diagram, a circuit diagram, a waveform diagram showing potential changes of signals, a top view (a layout diagram), and the like.

Figure 11A:
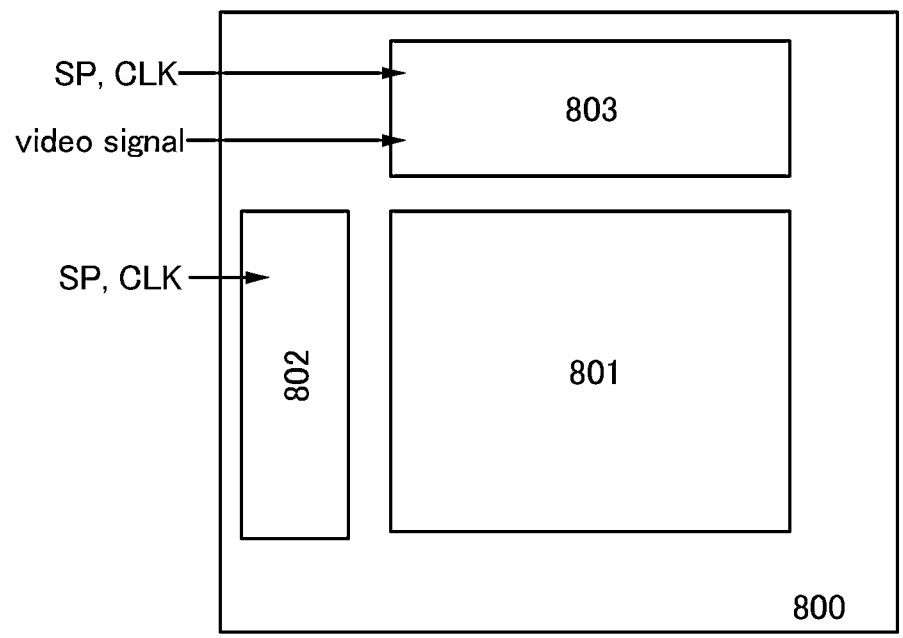
FIGS. 11A and 11B are diagrams illustrating a display device which is one embodiment of the present invention.
Figure 11B:
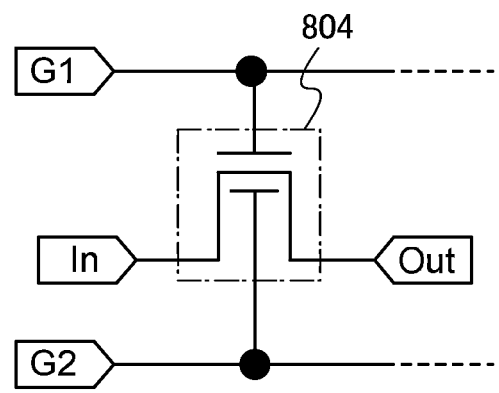

An example of a block diagram of an active matrix liquid crystal display device is illustrated in FIG. 11A. The liquid crystal display device illustrated in FIG. 11A includes, over a substrate 800, a pixel portion 801 including a plurality of pixels each provided with a display element, a scan line driver circuit 802 which controls potentials of scan lines connected to gate electrodes of the pixels, and a signal line driver circuit 803 which controls a video signal input to a selected pixel. Each pixel is provided with a transistor 804 in FIG. 11B. The transistor 804 is an element controlling electric current between an In terminal and an Out terminal with a first control signal G1 and a second control signal G2. Note that a symbol of the transistor 804 in FIG. 11B corresponds to the transistor described in any one of Embodiments 1 to 4.

Note that although a mode in which the scan line driver circuit 802 and the signal line driver circuit 803 are formed over the substrate 800 is described here, part of the scan line driver circuit 802 may be mounted over an IC formed over another substrate. Further, part of the signal line driver circuit 803 may be mounted over an IC formed over another substrate. Still further, a plurality of scan line driver circuits 802 may be provided over the substrate 800.

Figure 12:
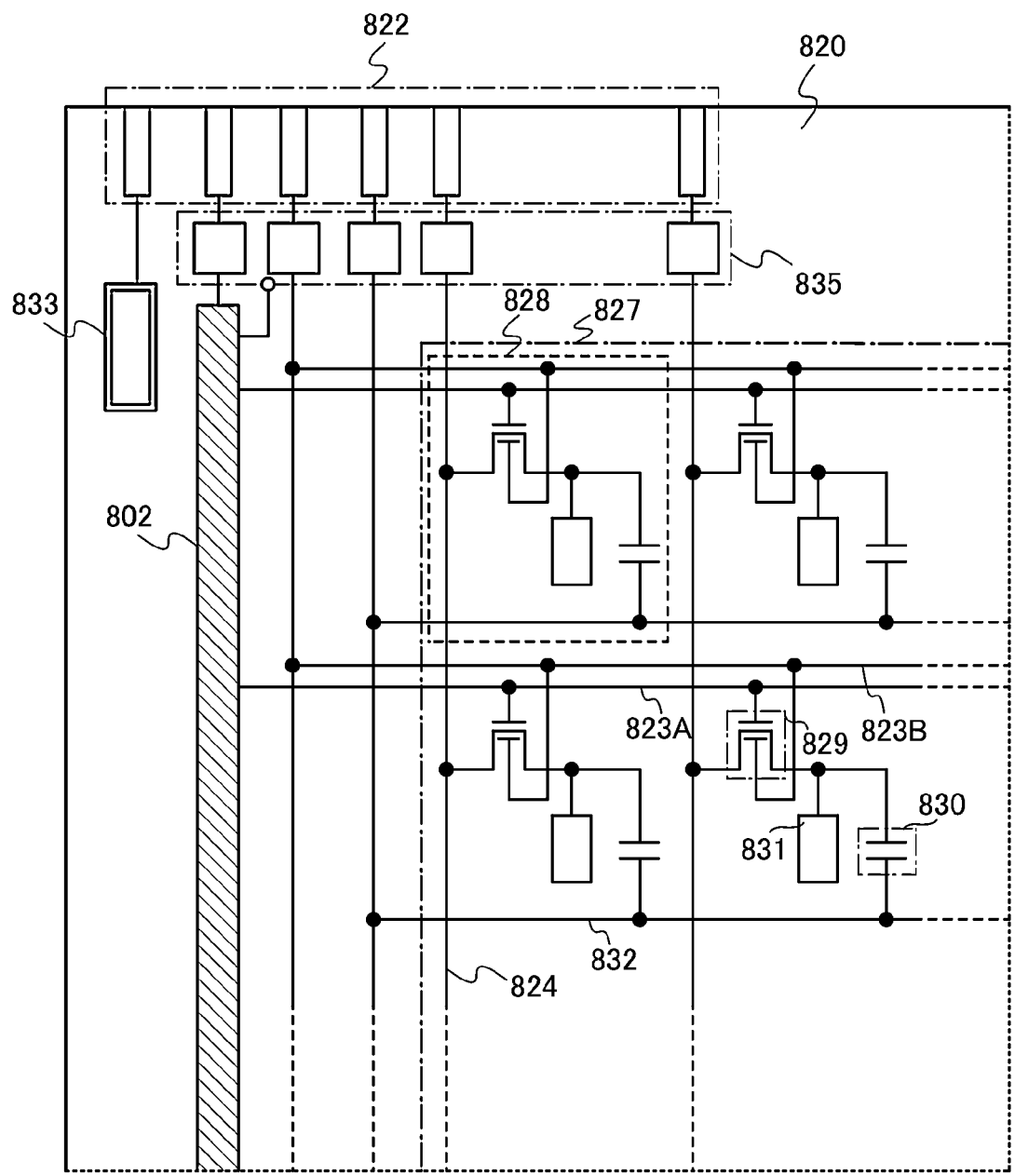
FIG. 12 is a diagram illustrating a display device which is one embodiment of the present invention.

FIG. 12 illustrates a positional relationship of signal input terminals, scan lines, signal lines, protective circuits including non-linear elements, and a pixel portion in a display device. Over a substrate 820 having an insulating surface, scan lines 823A and control lines 823B intersect with signal lines 824 in a pixel portion 827. The pixel portion 827 corresponds to the pixel portion 801 in FIG. 11. Note that the control lines 823B may be arranged parallel to the signal line 824.

The pixel portion 827 includes a plurality of pixels 828 arranged in a matrix. The pixel 828 includes a pixel transistor 829 connected to the scan line 823A, the control line 823B, and the signal line 824, a storage capacitor 830, and a pixel electrode 831.

The pixel structure here illustrates a case where one electrode of the storage capacitor 830 is connected to the pixel transistor 829 and the other electrode of the storage capacitor 830 is connected to a capacitor line 832. The pixel electrode 831 serves as one of electrodes which drive a display element (such as a liquid crystal element, a light-emitting element, or a contrast medium (electronic ink)). The other electrode (also referred to as a counter electrode) of the display element is connected to a common terminal 833. From the common terminal, a common potential is applied to the counter electrode of the display element.

The protective circuit 835 is provided between a wiring extended from the pixel portion 827 and the signal line input terminal 822. The protective circuit 835 is also provided between the scan line driver circuit 802 and the pixel portion 827. In this embodiment, the protective circuit 835 including a plurality of protective circuits is provided so that the pixel transistors 829 and the like are not broken when surge voltage due to static electricity or the like is applied to the scan line 823A, the control line 823B, the signal line 824, or the capacitor line 832. Accordingly, the protective circuits 835 are formed so that charge can be released into a common wiring when surge voltage is applied.

In this embodiment, an example in which one protective circuit is provided for each wiring in the vicinity of the signal line input terminals 822 is shown. However, the position of the protective circuits 835 and the number of protective circuits provided in the protective circuit 835 are not limited to the example.

The use of the transistor described in any of Embodiments 1 to 4 as the pixel transistor 829 allows the threshold voltage of the pixel transistor 829 to be controlled and/or on current of the transistor to be increased.

Figure 13A:
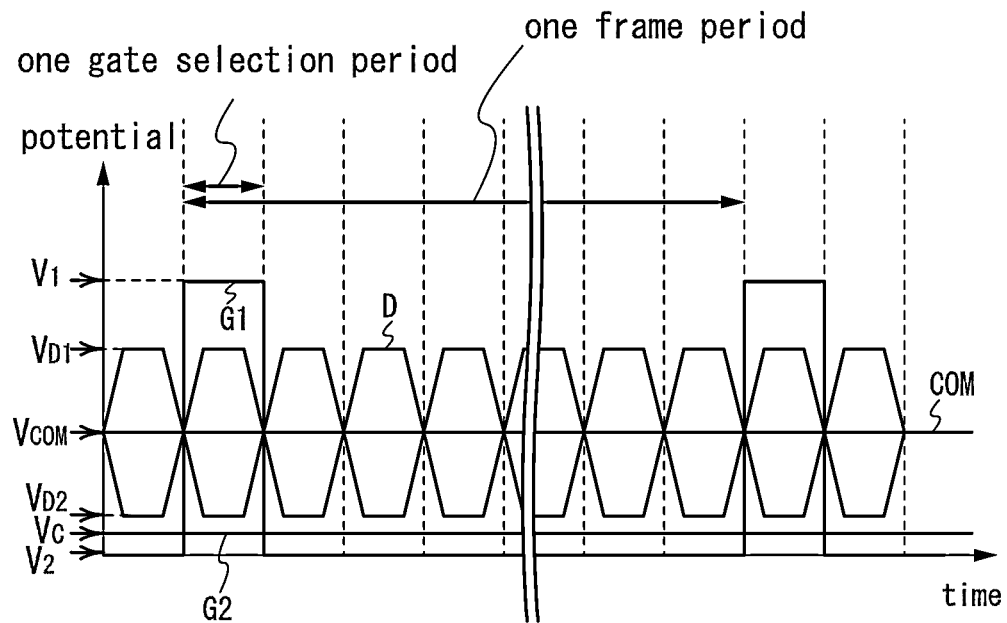
FIGS. 13A and 13B are diagrams each illustrating a display device which is one embodiment of the present invention.
Figure 13B:
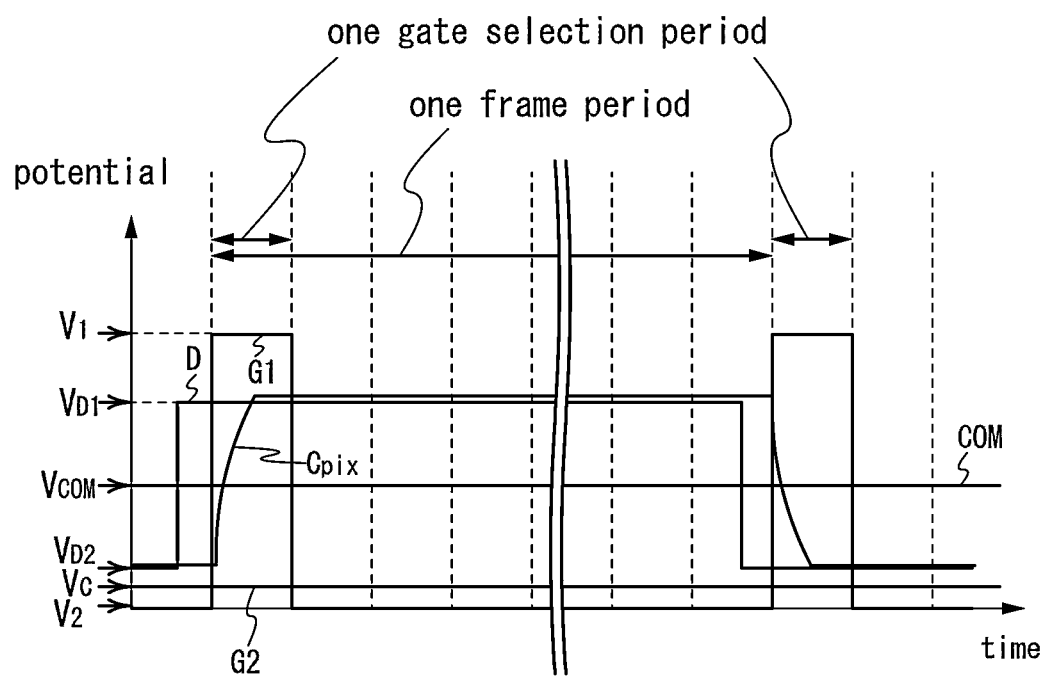

FIG. 13A is a waveform diagram schematically showing potential changes of signals supplied to the pixel 828. Here, operation of the pixel 828 will be described. FIG. 13A shows a waveform of potentials of each of the scan line 823A, the control line 823B, the signal line 824, and the capacitor line 832 which are connected to one pixel. In FIG. 13A, a waveform G1 schematically represents a potential change of the scan line 823A, a waveform G2 schematically represents a potential change of the control line 823B, a waveform D schematically represents a potential change of the signal line 824, and a waveform COM schematically represents a potential change of the capacitor line 832. Changes in those waveforms over time are shown with the horizontal axis representing time and the vertical axis representing potential. Note that a high power supply potential of the waveform G1 is denoted as $V_1$ and a low power supply potential of the waveform G1 is denoted as $V_2$. A potential of the waveform G2 is denoted as $V_c$. A high power supply potential of the waveform D is denoted as $V_{D1}$ and a low power supply potential of the waveform D is denoted as $V_{D2}$. A potential of the waveform COM is denoted as $V_{COM}$. As shown in FIGS. 13A and 13B, a period of time from when the waveform G1 changes to $V_1$, until the waveform G1 changes to $V_1$ again after changing to $V_2$ corresponds to one frame period. Further, as shown in FIGS. 13A and 13B, a period of time from when the waveform G1 changes to $V_1$ until the waveform G1 changes to $V_2$ corresponds to one gate selection period.

In FIG. 13A, in one gate selection period in one frame period, that is, in a period of time when the scan line 823A has $V_1$, the storage capacitor 830 in the pixel 828 holds a potential of the signal line 824 in the range of from $V_{D1}$ to $V_{D2}$. In FIG. 13A, a period other than a gate selection period in one frame period, that is, in a period of time when the scan line 823A has $V_2$, the storage capacitor 830 in the pixel 828 holds a potential input in one gate selection period regardless of the potential of the signal line 824, which is in the range of from $V_{D1}$ to $V_{D2}$. Note that the waveform G2 schematically representing a potential change of the control line 823B is preferably kept at a fixed potential in the range in which the 823B does not cause malfunction of the pixel transistor 829 which is controlled on or off by the scan line 823A. By setting the potential $V_c$ of the control line 823B at $V_{D2}$ or lower, preferably in the range of from $V_2$ to $V_{D2}$, malfunction of the pixel transistor 829 which is controlled on or off by the scan line 823A can be prevented.

FIG. 13B is another example of a waveform diagram schematically showing potential changes in the case where a potential of the signal line 824 is fixed at $V_{D1}$ for a certain period of time. FIG. 13B is different from FIG. 13A in that the waveform D representing a potential change of the signal line 824 is specifically shown (in FIG. 13A, the waveform D represents a given potential in the range of from $V_{D2}$ to $V_{D1}$), and that a waveform $C_{pix}$ representing a change of a potential held by the storage capacitor 830 in the pixel 828 is shown. In FIG. 13B, before the waveform G1 changes to $V_1$, the waveform D changes to $V_{D1}$ from $V_{D2}$, and then the waveform G1 changes to $V_1$ and a potential held by the storage capacitor 830 in the pixel 828, that is, a potential of the waveform $C_{pix}$ rises (see the first one gate selection period in FIG. 13B). In addition, in FIG. 13B, before the waveform G1 changes to $V_1$, the waveform D changes to $V_{D2}$ from $V_{D1}$, and then the waveform G1 changes to $V_1$ and a potential of the storage capacitor 830 in the pixel 828, that is, a potential of the waveform $C_{pix}$ falls (see the second one gate selection period in FIG. 13B). If the waveform D changes to $V_{D1}$ from $V_{D2}$ or $V_{D2}$ from $V_{D1}$ before the waveform G1 changes to $V_1$, malfunction due to signal delay and the like can be reduced. Note that in FIG. 13B, although there is a period in which the waveform D and the waveform $C_{pix}$ are in the same potential, they are separately shown for the sake of clarity.

As shown in FIGS. 13A and 13B, by provision of the control line 823B, the threshold voltage of the pixel transistor 829 can be controlled while a similar effect of the transistor described in any one of Embodiments 1 to 4 is obtained. Specifically, by setting a potential of the waveform G2 of the control line 823B at a fixed potential, a transistor with a stable threshold voltage can be obtained, which is preferable.

Note that the waveform diagrams in FIGS. 13A and 13B schematically showing potential changes of signals supplied to the pixel 828 are merely examples and may be combined with another driving method. As an example of another driving method, a driving method such as an inversion drive method (so-called inversion drive) may be employed, in which the polarity of a voltage applied to the pixel electrode is inverted every certain period or every frame or between pixels in accordance with the common potential of the common electrode. By the inversion drive, uneven display such as flickering of an image and deterioration of a display element (e.g., a liquid crystal material) can be suppressed. Note that as an example of the inversion drive, source line inversion drive, gate line inversion drive, dot inversion drive, and the like can be given as well as frame inversion drive. Note that as a display method, a progressive method, an interlace method, or the like can be employed. Further, one pixel may include a plurality of subpixels.

Figure 14:
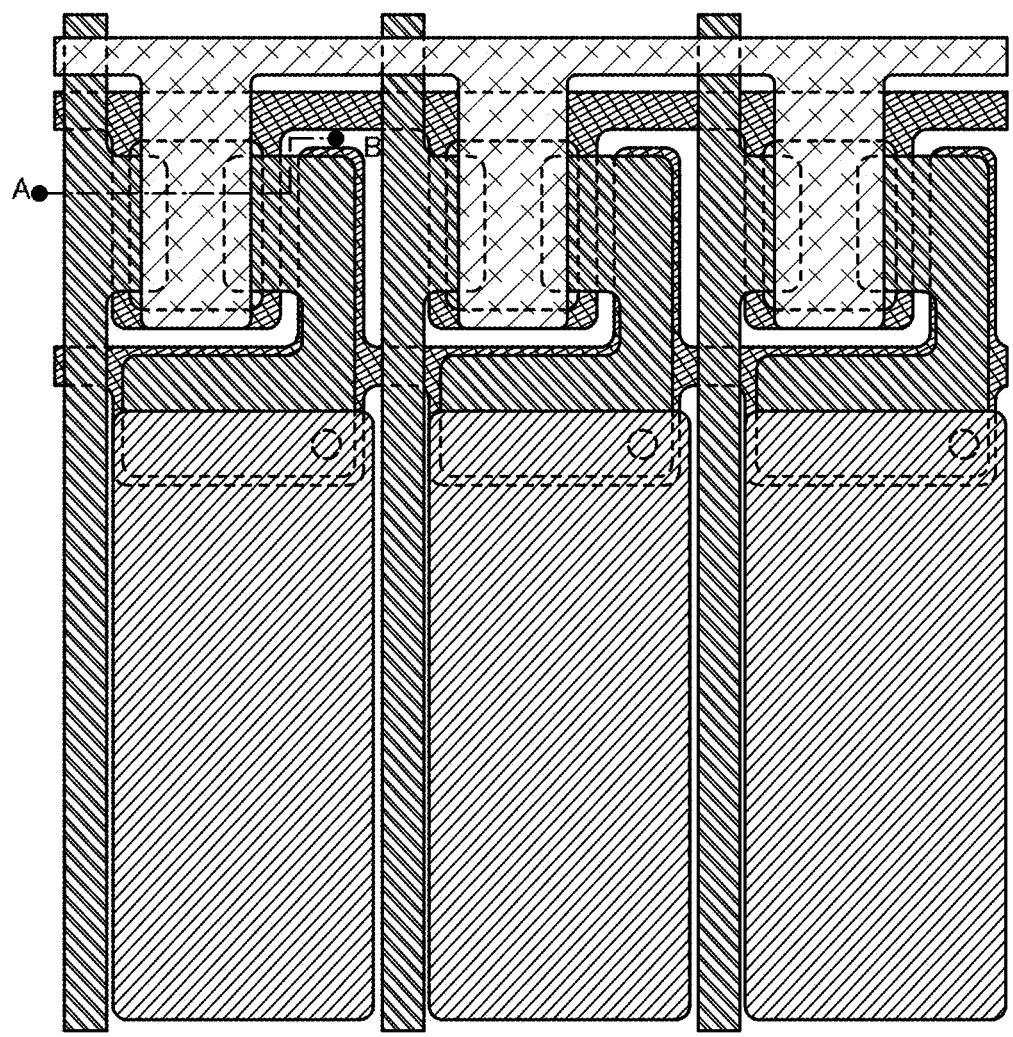
FIG. 14 is a diagram illustrating a display device which is one embodiment of the present invention.

FIG. 14 is an example of a layout diagram of the pixel 828 in FIG. 12. FIG. 14 shows an example where a structure of a transistor is a channel-etch type described in Embodiment 1. In FIG. 14, a cross section taken along chain line A-B corresponds to the cross-sectional view of FIG. 1C. Note that the layout diagram of pixels of FIG. 14 shows an example of so-called stripe arrangement in which pixels of three colors, RGB (R is red, G is green, and B is blue), are arranged along the scan line 823A; however, the arrangement is not limited thereto, and delta or Bayer arrangement may alternatively be employed. Note that without limitation to the three colors of RGB, more than three colors may be used. For example, RGBW (W is white) or RGB with one or more colors of yellow, cyan, or magenta may be used. Note that areas of display regions in pixels may be different between color elements of RGB.

Figure 15:
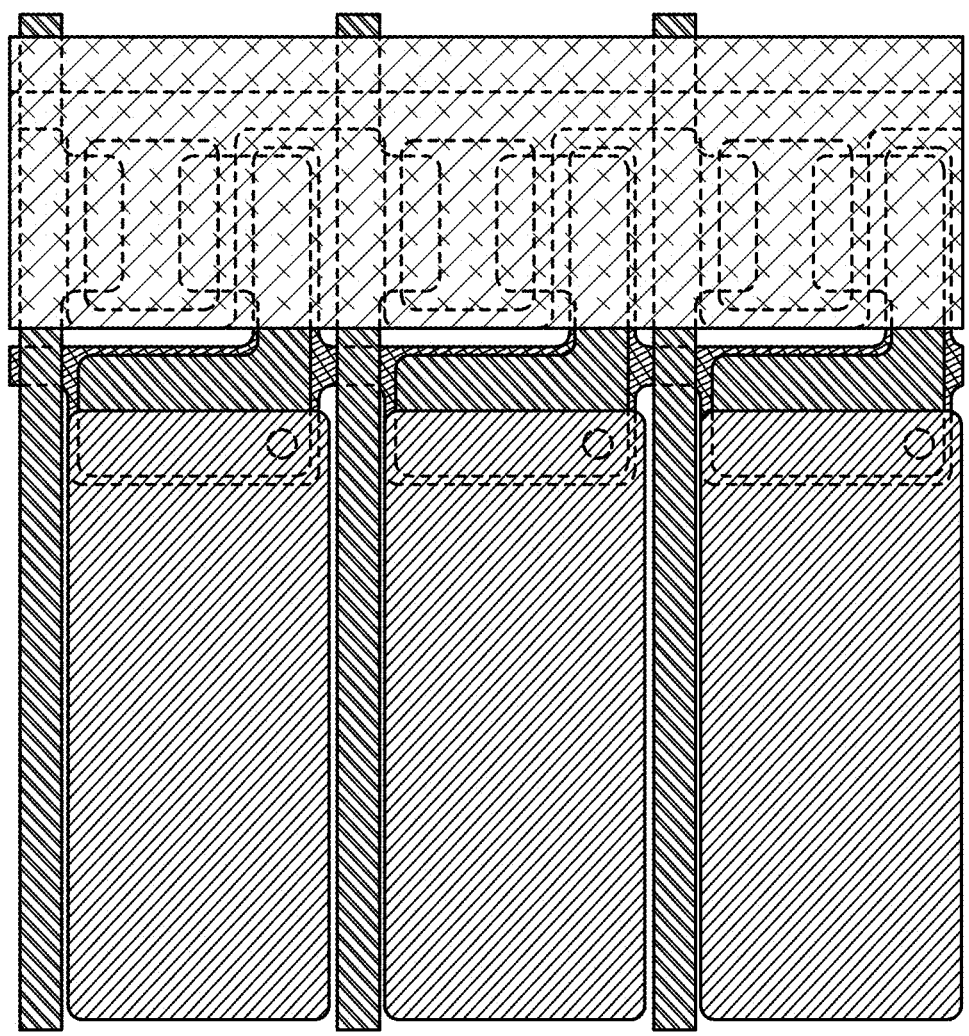
FIG. 15 is a diagram illustrating a display device which is one embodiment of the present invention.

FIG. 14 illustrates a pixel circuit including a first conductive layer 1101 which serves as a wiring serving as the scan line 823A and one electrode of the capacitor line 832, an oxide semiconductor layer 1102 which forms a channel region of the pixel transistor 829, a second conductive layer 1103 which serves as a wiring serving as the signal line 824 and the other electrode of the capacitor line 832, a pixel electrode layer 1104 which serves as the pixel electrode 831, a third conductive layer 1105 which serves as a wiring serving as the control line 823B, and an opening 1106 (referred to as a contact hole) for connection between the second conductive layer 1103 and the pixel electrode 831. Although FIG. 14 shows a structure in which the third conductive layer 1105 parallel to the first conductive layer 1101 is extended over the oxide semiconductor layer 1102, a structure in FIG. 15 in which the third conductive layer 1105 is provided to overlap with the first conductive layer 1101 and the oxide semiconductor layer 1102 may be employed. When the third conductive layer 1105 is formed from a light-blocking conductive material, the light-blocking property of the third conductive layer 1105 can be more improved in the structure in FIG. 15, than that in the layout diagram in FIG. 14.

Note that, in the layout diagram of FIG. 14 or the like, the facing portion of source and drain regions in the transistor may have a U-like shape or a C-like shape. Further, the first conductive layer 1101 serving as a first gate electrode may have a U-like shape or a C-like shape. Note that the width in the channel length direction of the first conductive layer 1101 which serves as the first gate electrode may be larger than the width of the oxide semiconductor layer 1102. In addition, the width in a channel length direction of the third conductive layer 1105 which serves as the second gate electrode is smaller than the width of the first conductive layer 1101 and the width of the oxide semiconductor layer 1102.

Figure 16:
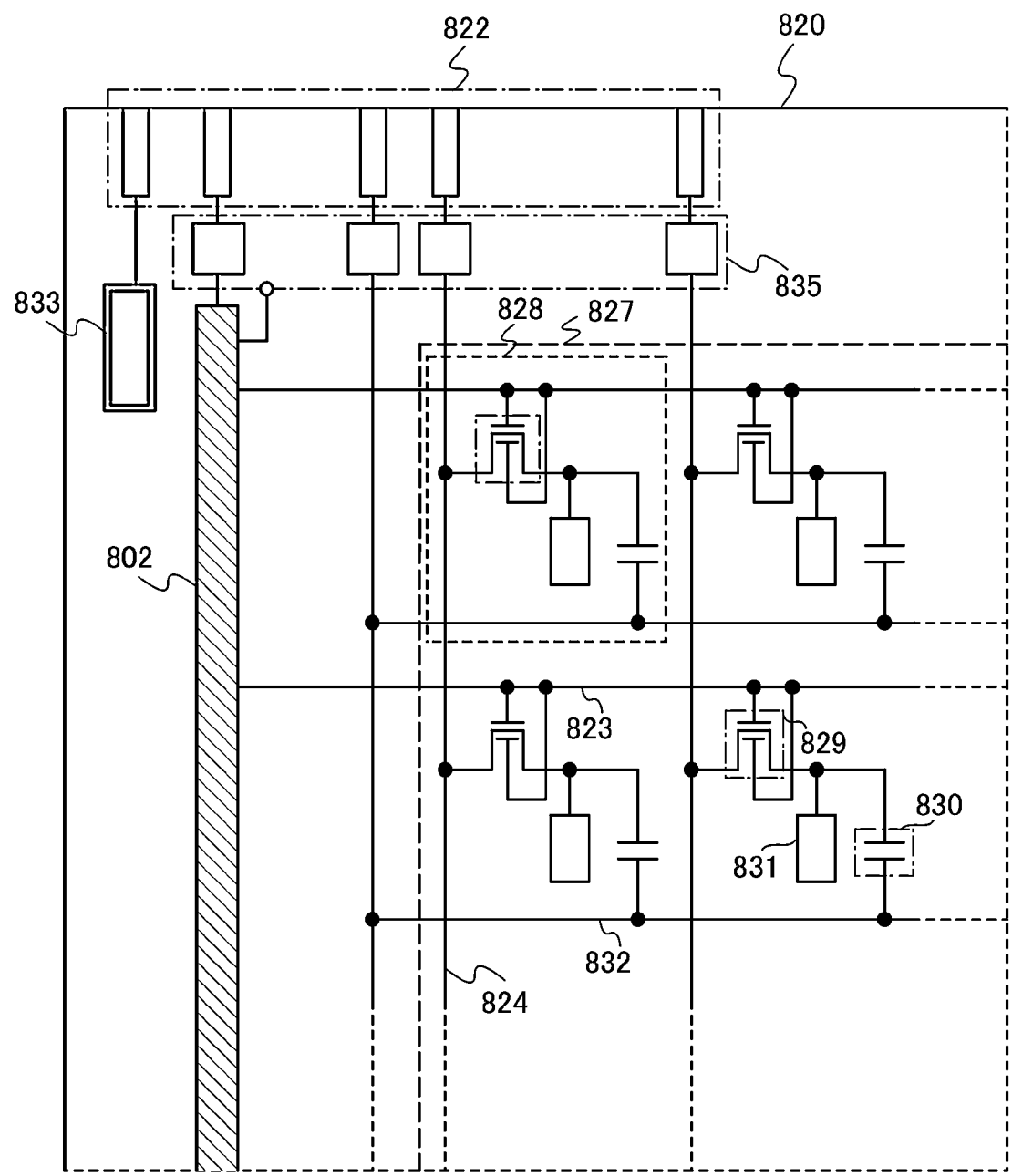
FIG. 16 is a diagram illustrating a display device which is one embodiment of the present invention.

FIG. 16 illustrates an example in which connection between the pixel transistors and the scan lines is different from that in FIG. 12. FIG. 16 illustrates the case where the first gate electrode connected to the scan line and the second gate electrode connected to the control line are connected to each other and have the same potential with use of the transistor described in any one of Embodiments 1 to 4. Note that the same portions in FIG. 16 as those in FIG. 12 are not repeatedly described.

FIG. 16 illustrates a positional relationship of signal input terminals, scan lines, signal lines, protective circuits including non-linear elements, and a pixel portion in a display device. FIG. 16 is different from FIG. 12 in that the control line 823B is not provided and the scan line 823 which corresponds to the scan line 823A in FIG. 12 is provided. As shown in FIG. 16, by controlling the pixel transistors with the scan line 823 connected to the second gate electrode, the control line can be omitted, which can decrease the number of wirings and signal line input terminals 822.

Figure 17:
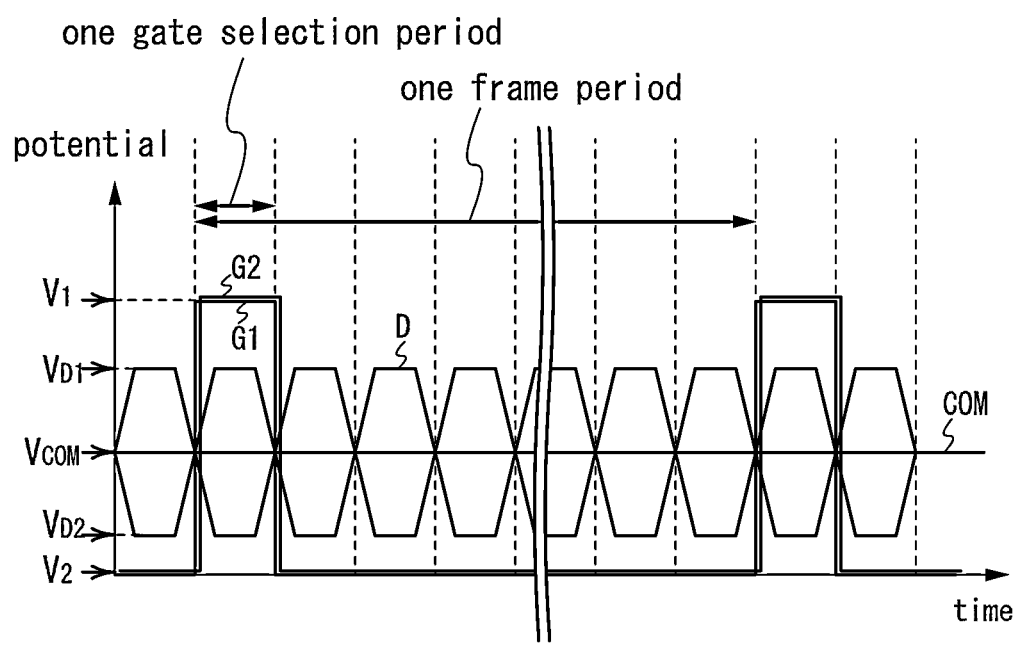
FIG. 17 is a diagram illustrating a display device which is one embodiment of the present invention.

FIG. 17 is a waveform diagram schematically showing potential changes of signals supplied to the pixel 828 shown in FIG. 16. Here, operation of the pixel 828 in FIG. 16 will be described. FIG. 17 shows a waveform of potentials of each of the scan line 823, the signal line 824, and the capacitor line 832 which are connected to one pixel. Note that in FIG. 17, in order to clarify the difference from FIG. 13A, the first gate electrode and the second gate electrode which are connected to the scan line 823 such that they have the same potential are shown to be separated slightly from each other. In FIG. 17, a waveform G1 schematically represents a potential change of the first gate electrode, a waveform G2 schematically represents a potential change of the second gate electrode, a waveform D schematically represents a potential change of the signal line 824, and a waveform COM schematically represents a potential change of the capacitor line 832. Changes in those waveforms over time are shown with the horizontal axis representing time and the vertical axis representing potential. Note that a high power supply potential of the waveform G1 and the waveform G2 is denoted as $V_1$ and a low power supply potential of the waveform G1 and the waveform G2 is denoted as $V_2$. A high power supply potential of the waveform D is denoted as $V_{D1}$ and a low power supply potential of the waveform D is denoted as $V_{D2}$. A potential of the waveform COM is denoted as $V_{COM}$. As shown in FIG. 17, a period of time from when the waveform G1 changes to $V_1$, until the waveform G1 changes to $V_1$ again after changing to $V_2$ corresponds to one frame period. Further, as shown in FIG. 17, a period of time from when the waveform G1 changes to $V_1$ until the waveform G1 changes to $V_2$ corresponds to one gate selection period.

In FIG. 17, in one gate selection period in one frame period, that is, in a period of time when the scan line 823 has $V_1$, the storage capacitor 830 in the pixel 828 holds a potential of the signal line 824 in the range of from $V_{D1}$ to $V_{D2}$. In FIG. 17, a period other than a gate selection period in one frame period, that is, in a period of time when the scan line 823 has $V_2$, the storage capacitor 830 in the pixel 828 holds a potential input in one gate selection period regardless of the potential of the signal line 824, which is in the range of from $V_{D1}$ to $V_{D2}$.

Figure 18:
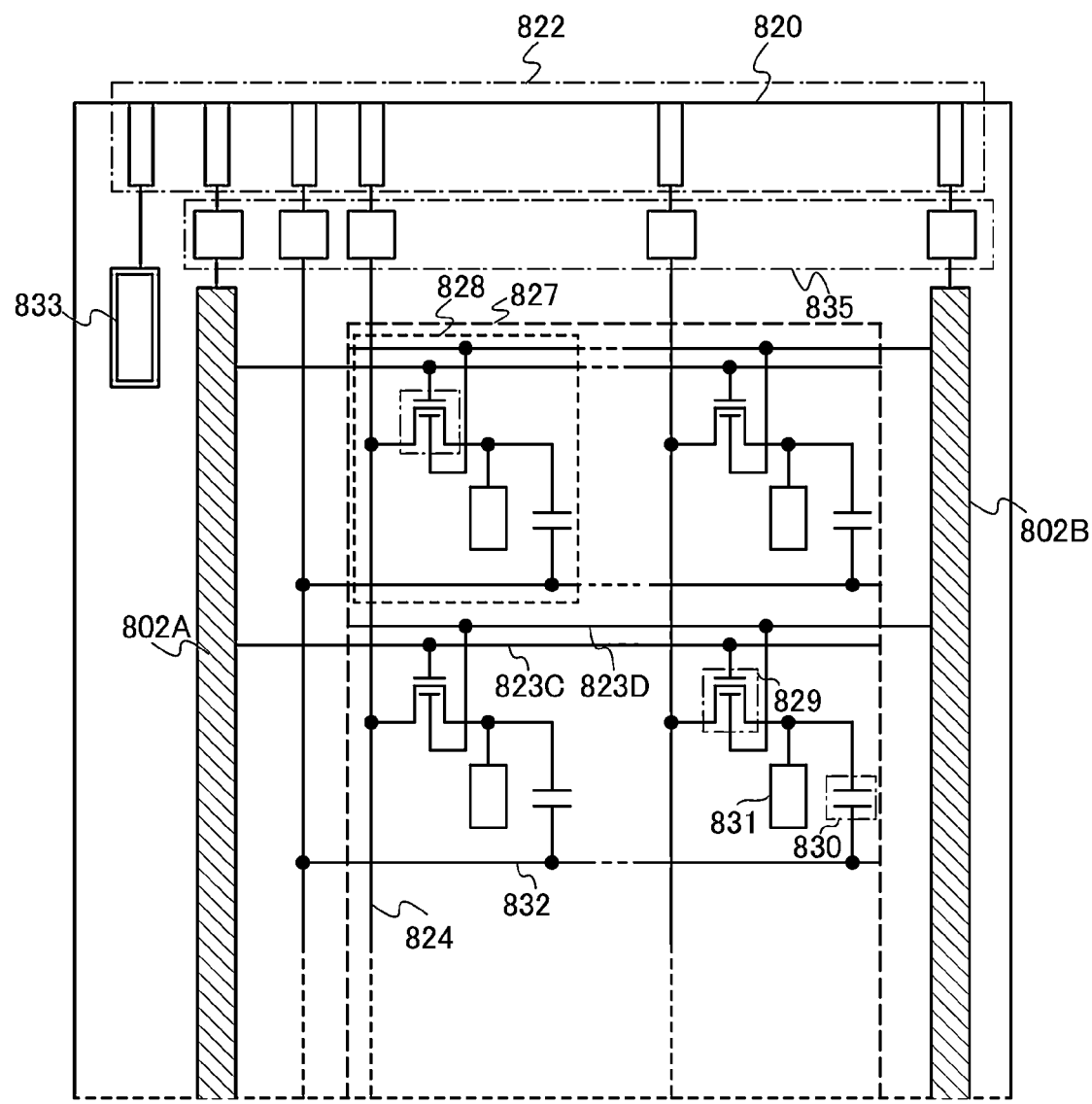
FIG. 18 is a diagram illustrating a display device which is one embodiment of the present invention.

By driving the pixel transistor 829 in a manner in which the waveform G1 and the waveform G2 are in the same potential as shown in FIG. 17, an area which becomes a channel in the pixel transistor 829 can be increased. Thus, an amount of current flowing through the pixel transistor 829 is increased, whereby the display element can operate at high speed. As another structure in which the pixel transistor 829 is driven in a manner in which the waveform G1 and the waveform G2 are in the same potential, a structure provided with a first scan line driver circuit 802A and a second scan line driver circuit 802B shown in FIG. 18 can be given. As shown in FIG. 18, the transistor may be controlled by the first scan line driver circuit 802A and the second scan line driver circuit 802B which supply scan signals through the first scan line 823C and the second scan line 823D, respectively.

Note that the waveform diagram in FIG. 17 schematically showing potential changes is one example similarly to the waveform diagrams in FIGS. 13A and 13B and may be combined with another driving method. As an example of another driving method, the driving method (so-called inversion drive described above) may be employed, in which the polarity of a voltage applied to the pixel electrode is inverted every certain period or every frame or between pixels in accordance with the common potential of the common electrode. With use of the inversion drive, effects similar to the above can be obtained.

Figure 19:
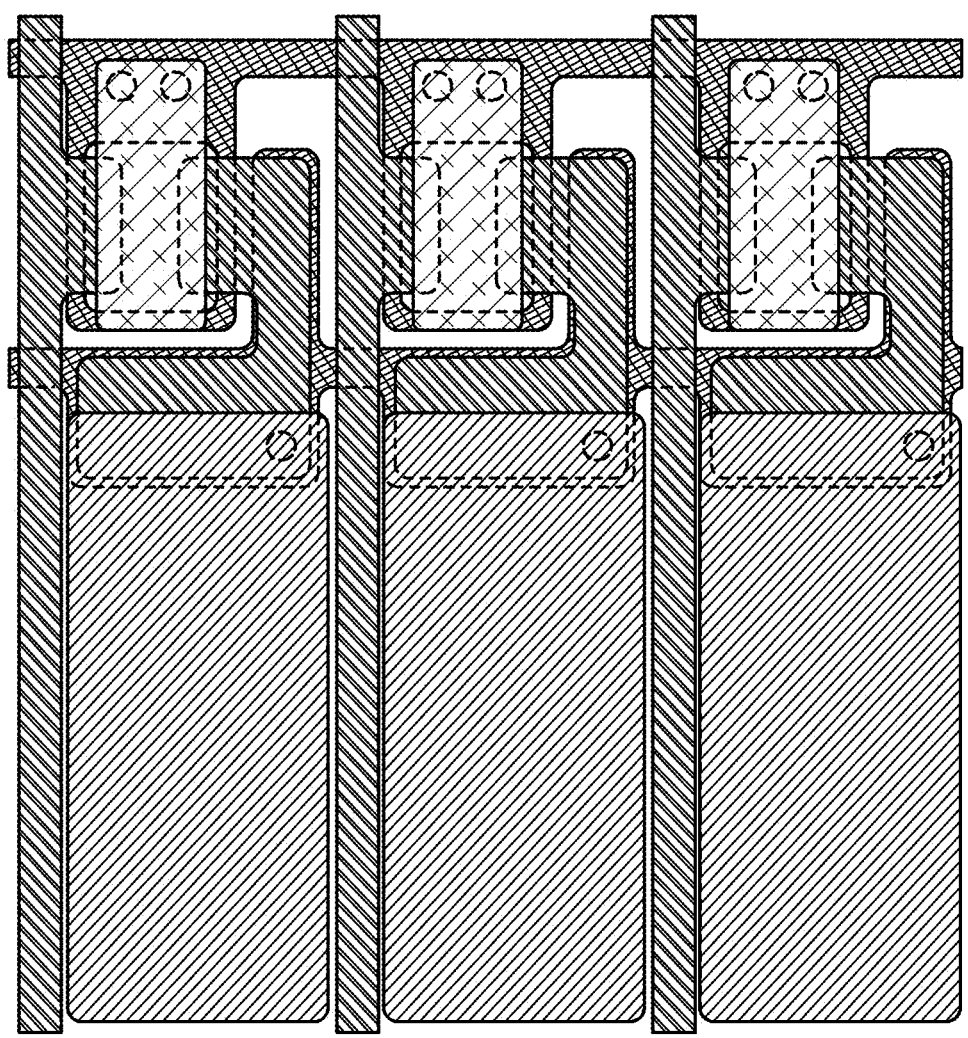
FIG. 19 is a diagram illustrating a display device which is one embodiment of the present invention.

FIG. 19 is an example of a layout diagram of the pixel 828 in FIG. 16. FIG. 19 shows an example where a structure of a transistor is a channel-etch type described in Embodiment 1. Note that the layout diagram of pixels of FIG. 19 shows an example of so-called stripe arrangement in which pixels of three colors, RGB (R is red, G is green, and B is blue), are arranged along the scan line 823; however, the arrangement is not limited thereto, and delta or Bayer arrangement may alternatively be employed. Note that without limitation to the three colors of RGB, more than three colors may be used. For example, RGBW (W is white) or RGB with one or more colors of yellow, cyan, or magenta may be used. Note that areas of display regions in pixels may be different between color elements of RGB.

Figure 20:
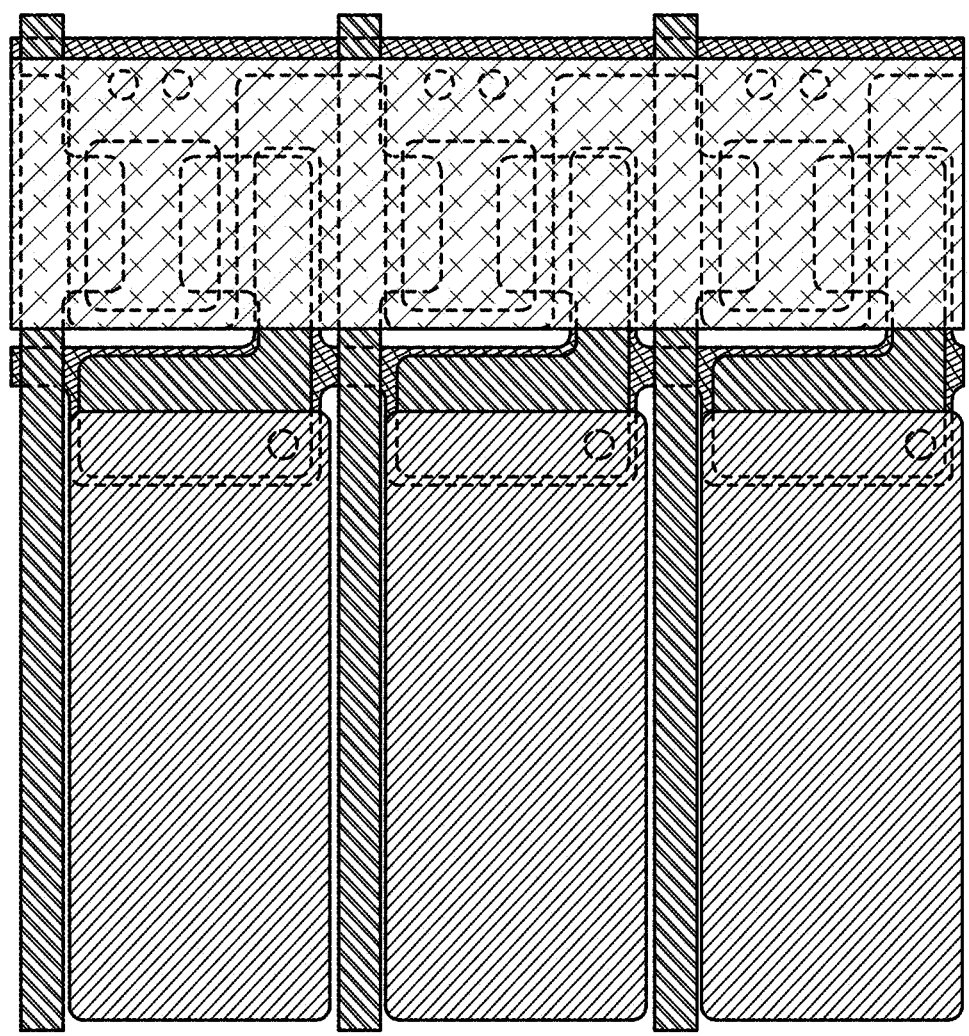
FIG. 20 is a diagram illustrating a display device which is one embodiment of the present invention.

FIG. 19 illustrates a pixel circuit including a first conductive layer 1101 which serves as a wiring serving as the scan line 823 and one electrode of the capacitor line 832, an oxide semiconductor layer 1102 which forms a channel region of the pixel transistor 829, a second conductive layer 1103 which serves as a wiring serving as the signal line 824 and the other electrode of the capacitor line 832, a pixel electrode layer 1104 which serves as the pixel electrode 831, a third conductive layer 1105 which is connected to the first conductive layer 1101, and an opening 1106 (referred to as a contact hole) for connection between the second conductive layer 1103 and the pixel electrode 831 or between the first conductive layer 1101 and the third conductive layer 1105. Although FIG. 19 shows a structure in which the third conductive layer 1105 is provided over the oxide semiconductor layer 1102 for each transistor 829, a structure in FIG. 20 in which the third conductive layer 1105 is provided to overlap with the first conductive layer 1101 and the oxide semiconductor layer 1102 may be employed. When the third conductive layer 1105 is formed from a light-blocking conductive material, the light-blocking property of the third conductive layer 1105 can be more improved in the structure in FIG. 20, than that in the layout diagram in FIG. 19.

Note that, in the layout diagram of FIG. 19 or the like, the facing portion of source and drain regions in the transistor may have a U-like shape or a C-like shape. Further, the first conductive layer 1101 serving as a gate electrode may have a U-like shape or a C-like shape. Note that the width in the channel length direction of the first conductive layer 1101 which serves as the first gate electrode may be larger than the width of the oxide semiconductor layer 1102. In addition, the width in a channel length direction of the third conductive layer 1105 which serves as the second gate electrode is larger than the width of the first conductive layer 1101 and the width of the oxide semiconductor layer 1102.

As described above, by use of the transistor having the structure described in any one of Embodiments 1 to 4, the threshold voltage can be controlled to a favorable value while effects described in the above embodiments can be obtained.

Note that in this embodiment, what is illustrated in the drawing can be freely combined with or replaced with what is described in another embodiment as appropriate.

[Embodiment 7]

In this embodiment, a light-emitting display device to which the transistor including an oxide semiconductor layer described in any one of Embodiments 1 to 4 is applied will be described. Note that as an example of a display element included in the light-emitting display device of this embodiment, a light-emitting element utilizing electroluminescence is described. Light-emitting elements utilizing electroluminescence are classified according to whether a light emitting material is an organic compound or an inorganic compound. The former is referred to as an organic EL element and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Note that description is made in this embodiment using an organic EL element as a light-emitting element.

Figure 21:
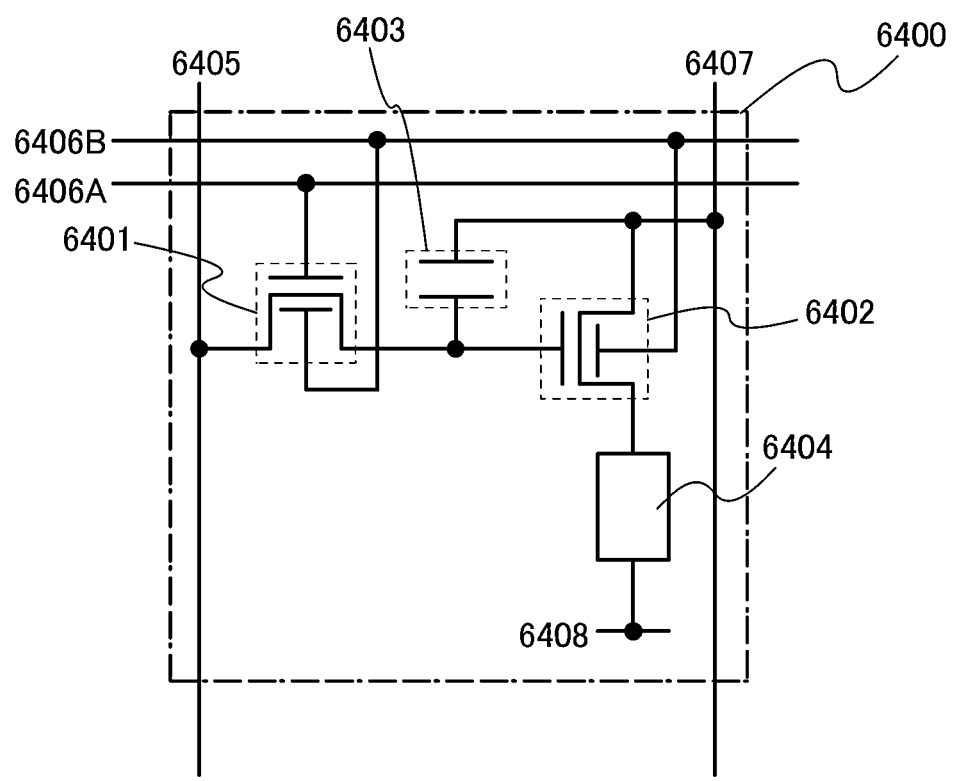
FIG. 21 is a diagram illustrating a display device which is one embodiment of the present invention.

FIG. 21 shows an example of a pixel in a light-emitting display device including the transistor described in any one of Embodiments 1 to 4.

A structure and an operation of the pixel in the light-emitting display device are described. In this example, one pixel includes two n-channel transistors each of which includes an oxide semiconductor layer (for example, an In—Ga—Zn—O-based non-single-crystal film) as a channel formation region.

A pixel 6400 includes a switching transistor 6401 (a first transistor), a driver transistor 6402 (a second transistor), a capacitor 6403, and a light-emitting element 6404. The switching transistor 6401 has a first gate electrode connected to a scan line 6406A, a second gate electrode connected to a control line 6406B, a first electrode (one of a source electrode and a drain electrode) connected to a signal line 6405, and a second electrode (the other of the source electrode and the drain electrode) connected to a gate of the driver transistor 6402. The driver transistor 6402 has a first gate electrode connected to a power supply line 6407 through the capacitor 6403, a second gate electrode connected to the control line 6406B, a first electrode connected to the power supply line 6407, and a second electrode connected to a first electrode (a pixel electrode) of the light-emitting element 6404. A second electrode of the light-emitting element 6404 corresponds to a common electrode 6408. The common electrode 6408 is electrically connected to a common potential line provided over the same substrate, and the connection portion may be used as a common connection portion.

Note that the second electrode (the common electrode 6408) of the light-emitting element 6404 is set to a low power supply potential. The low power supply potential is a potential smaller than a high power supply potential when the high power supply potential set to the power supply line 6407 is a reference. As the low power supply potential, GND, 0 V, or the like may be employed, for example. A potential difference between the high power supply potential and the low power supply potential is applied to the light-emitting element 6404 to make current flow through the light-emitting element 6404, so that the light-emitting element 6404 emits light. Thus, each of the potentials is set so that the potential difference between the high power supply potential and the low power supply potential is equal to or higher than the forward threshold voltage of the light-emitting element 6404.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode, for example.

In the case of analog grayscale driving, voltage equal to or higher than the sum of the forward voltage of the light-emitting element 6404 and the threshold voltage of the driver transistor 6402 is applied to the first gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order to allow the driver transistor 6402 to operate in the saturation region, the potential of the power supply line 6407 is set higher than the potential of the first gate of the driver transistor 6402. When an analog video signal is used, current can be made to flow through the light-emitting element 6404 in accordance with the video signal and analog grayscale driving can be performed.

As shown in FIG. 21, by provision of the control line 6406B, the threshold voltage of the switching transistor 6401 and the driver transistor 6402 can be controlled as in the transistor described in any one of Embodiments 1 to 4. Specifically, in the driver transistor 6402, a video signal is input so that the driver transistor 6402 operates in the saturation region. Therefore, by controlling the threshold voltage by a potential of the control line 6406B, a deviation between an input video signal and luminance of the light-emitting element due to threshold voltage shift can be reduced. As a result, display quality of the display device can be improved.

Note that the switching transistor 6401 serves as a switch and a potential of the second gate is not always required to be controlled by the control line 6406B. That is, the control line 6406B may be connected to only the second gate of the driver transistor 6402.

Note that the pixel structure illustrated in FIG. 21 is not limited thereto. For example, a switch, a resistor, a capacitor, a transistor, a logic circuit, or the like may be added to the pixel in FIG. 21.

In the case of digital grayscale driving, a video signal is input to the gate of the driver transistor 6402 so that the driver transistor 6402 is either completely turned on or completely turned off. That is, the driver transistor 6402 operates in a linear region. Since the driver transistor 6402 operates in a linear region, the potential of the first gate of the driver transistor 6402 is set higher than the potential of the power supply line 6407. Note that voltage which is equal to or higher than the sum of the voltage of the power supply line and the Vth of the driver transistor 6402 is applied to the signal line 6405. In this case, the same structure as in FIG. 21 can be employed.

Next, structures of a light-emitting element will be described with reference to FIGS. 22A to 22C. A cross-sectional structure of a pixel is described here by taking an n-channel driver transistor as an example. Transistors 7001, 7011, and 7021 serving as driver transistors illustrated in FIGS. 22A to 22C can be formed by a method similar to the method for forming the transistor 471 described in Embodiment 1 or the like. The transistors 7001, 7011, and 7021 each include an oxide semiconductor layer for a channel formation region.

In order to extract light emitted from the light-emitting element, at least one of an anode and a cathode should be transparent. There are the following structures of a light-emitting element which is formed over the same substrate as a transistor: a top-emission structure in which light is extracted through the surface opposite to the substrate, a bottom-emission structure in which light is extracted through the surface of the substrate, and a dual-emission structure in which light is extracted through the surface opposite to the substrate and the surface of the substrate. As illustrated in FIGS. 22A to 22C, any of these emission structures can be applied in this embodiment.

A light-emitting element having a top-emission structure will be described with reference to FIG. 22A.

Figure 22A:
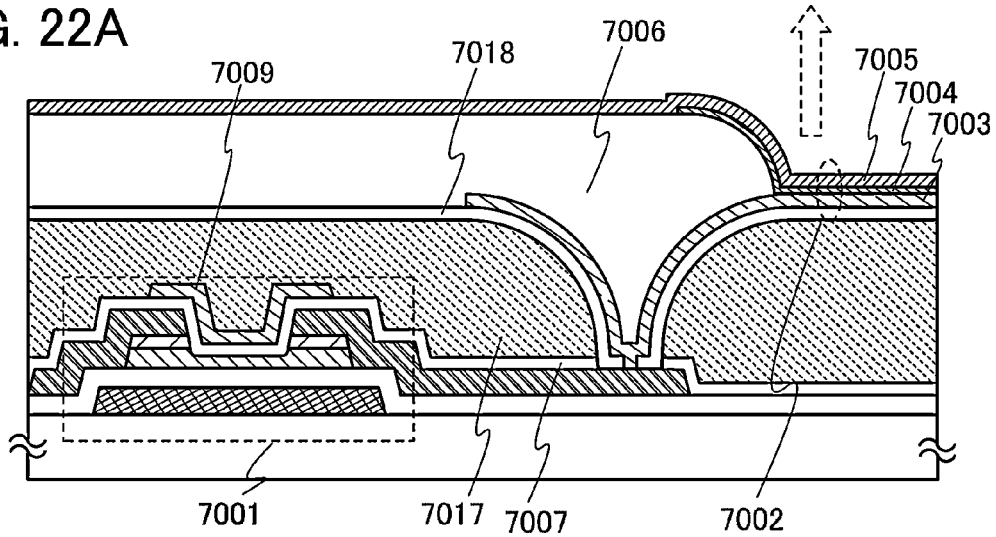
FIGS. 22A to 22C are diagrams each illustrating a display device which is one embodiment of the present invention.

FIG. 22A is a cross-sectional view of a pixel in which the transistor 7001 described in Embodiment 1 is provided as a driver transistor in the pixel and light emitted from a light-emitting element 7002 electrically connected to the transistor 7001 goes out through an anode 7005. The transistor 7001 is covered with a protective layer 7007 and a resin layer 7017 over which a second protective insulating layer 7018 formed of a silicon nitride film is provided. An In—Zn—O-based oxide semiconductor is used for the channel of the transistor 7001.

In FIG. 22A, a cathode 7003 of the light-emitting element 7002 is electrically connected to the transistor 7001 serving as a driver transistor, and a light-emitting layer 7004 and the anode 7005 are stacked in this order over the cathode 7003. The cathode 7003 can be formed using any of conductive materials which have a low work function and a film of which reflects light. For example, Ca, Al, MgAg, AlLi, or the like is preferably used.

In FIG. 22A, a second gate electrode 7009 which is formed from the same material as the cathode 7003 overlaps with the oxide semiconductor layer to shield the oxide semiconductor layer from light. In addition, the second gate electrode 7009 controls the threshold voltage of the transistor 7001. By formation of the cathode 7003 and the second gate electrode 7009 from the same material and the same layer, the number of steps can be reduced.

In addition, a partition 7006 formed of an insulating material is provided in order to prevent short circuit of the second gate electrode 7009 and the cathode 7003. The light-emitting layer 7004 is provided so as to overlap with both of part of the partition 7006 and part of the cathode 7003 which is not covered with the partition 7006.

The light-emitting layer 7004 may be formed using either a single layer or a stacked layer of a plurality of layers. When the light-emitting layer 7004 is formed using a stacked layer of a plurality of layers, an electron-injection layer, an electron-transport layer, a light-emitting layer, a hole-transport layer, and a hole-injection layer are sequentially stacked over the cathode 7003. It is not necessary to form all of these layers. The anode 7005 is formed using a light-transmitting conductive material such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 includes the cathode 7003, the anode 7005, and the light-emitting layer 7004 sandwiched between the cathode 7003 and the anode 7005. In the case of the pixel illustrated in FIG. 22A, light is emitted from the light-emitting element 7002 to the anode 7005 side as indicated by an arrow.

Next, a light-emitting element having a bottom-emission structure will be described with reference to FIG. 22B.

Figure 22B:
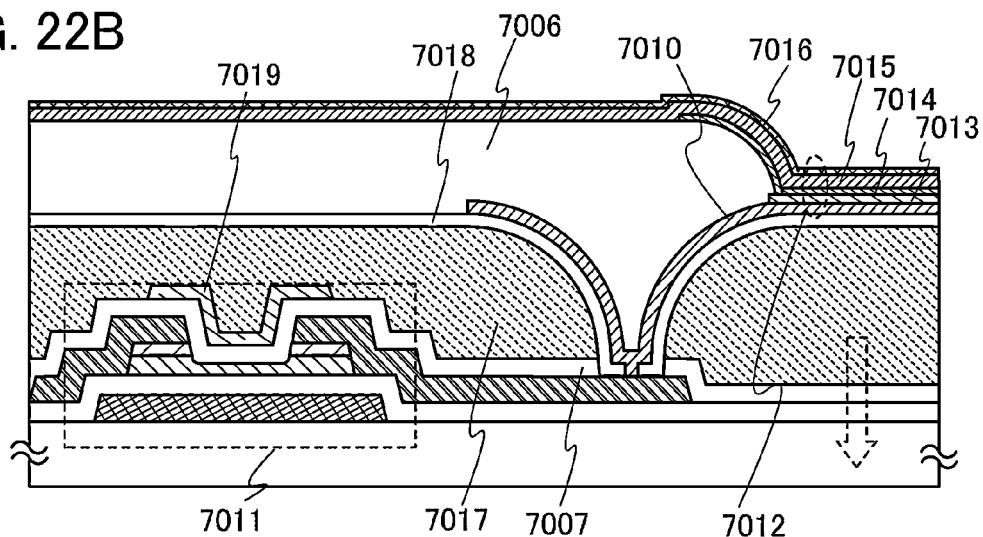

FIG. 22B is a cross-sectional view of a pixel in which the transistor 7011 described in Embodiment 1 is provided as a driver transistor in the pixel and light emitted from a light-emitting element 7012 electrically connected to the transistor 7011 goes out through a cathode 7013. The transistor 7011 is covered with the protective layer 7007 and the resin layer 7017 over which the second protective insulating layer 7018 formed of a silicon nitride film is provided. An In—Ga—Zn—O-based oxide semiconductor is used for the channel of the transistor 7011.

In FIG. 22B, the cathode 7013 of the light-emitting element 7012 is formed over a conductive film 7010 having a light-transmitting property which is electrically connected to the transistor 7011 which is the driver transistor, and a light-emitting layer 7014 and an anode 7015 are stacked in this order over the cathode 7013. Note that a blocking film 7016 for reflecting or blocking light may be formed so as to cover the anode 7015 when the anode 7015 has a light-transmitting property. For the cathode 7013, any of conductive materials which have a low work function can be used as in the case of FIG. 22A. Note that the cathode 7013 is formed to have a thickness with which the cathode 7013 transmits light (preferably, approximately from 5 nm to 30 nm). For example, an aluminum film with a thickness of 20 nm can be used as the cathode 7013.

Similarly to the case of FIG. 22A, the light-emitting layer 7014 may be formed using either a single layer or a stacked layer of a plurality of layers. The anode 7015 is not required to transmit light, but can be formed using a light-transmitting conductive material as in the case of FIG. 22A. The blocking film 7016 can be formed using, for example, a metal which reflects light; however, it is not limited to a metal film. For example, a resin to which a black pigment is added can be used.

In FIG. 22B, a second gate electrode 7019 which is formed from the same light-transmitting conductive material as the conductive film 7010 having a light-transmitting property overlaps with the oxide semiconductor layer. In this embodiment, indium tin oxide including silicon oxide is used as a material for the second gate electrode 7019. The second gate electrode 7019 controls the threshold voltage of the transistor 7011. By formation of the conductive film 7010 having a light-transmitting property and the second gate electrode 7019 from the same material and the same layer, the number of steps can be reduced. The oxide semiconductor layer in the transistor 7011 is shielded from light by the blocking film 7016 provided over the second gate electrode 7019.

The light-emitting element 7012 includes the cathode 7013, the anode 7015, and the light-emitting layer 7014 sandwiched between the cathode 7013 and the anode 7015. In the case of the pixel illustrated in FIG. 22B, light is emitted from the light-emitting element 7012 to the cathode 7013 side as indicated by an arrow.

Next, a light-emitting element having a dual-emission structure will be described with reference to FIG. 22C.

Figure 22C:
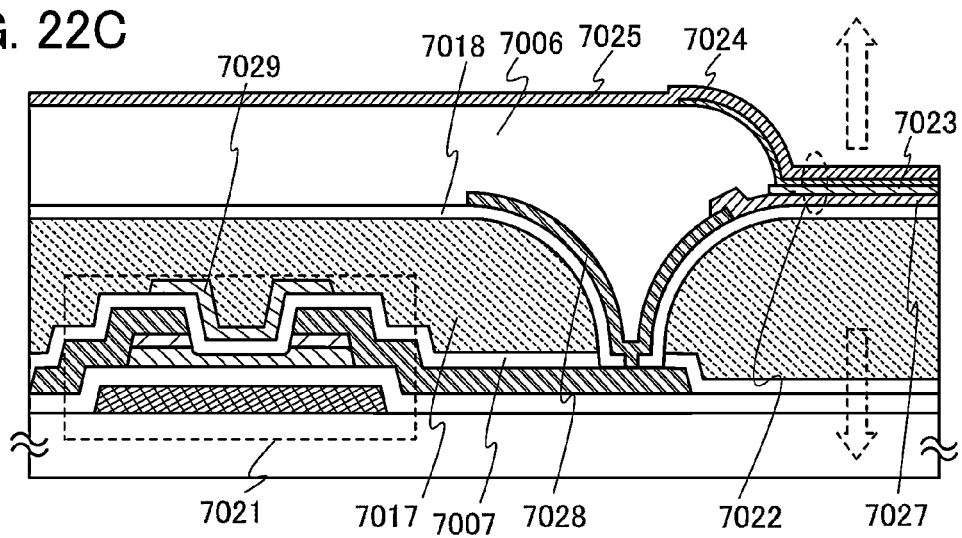

FIG. 22C is a cross-sectional view of a pixel in which the transistor 7021 described in Embodiment 1 is provided as a driver transistor in the pixel and light emitted from a light-emitting element 7022 electrically connected to the transistor 7021 goes out through both of an anode 7025 and a cathode 7023. The transistor 7021 is covered with the protective layer 7007 and the resin layer 7017 over which the second protective insulating layer 7018 formed of a silicon nitride film is provided. A Zn—O-based oxide semiconductor is used for the channel of the transistor 7021.

The cathode 7023 of the light-emitting element 7022 is formed over a conductive film 7027 having a light-transmitting property which is electrically connected to the transistor 7021 via a connection electrode 7028, and a light-emitting layer 7024 and an anode 7025 are stacked in this order over the cathode 7023. For the cathode 7023, any of conductive materials which have a low work function can be used as in the case of FIG. 22A. Note that the cathode 7023 is formed to have a thickness with which the cathode 7023 transmits light (preferably, approximately from 5 nm to 30 nm). For example, an aluminum film with a thickness of 20 nm can be used as the cathode 7023.

Similarly to the case of FIG. 22A, the light-emitting layer 7024 may be formed using either a single layer or a stacked layer of a plurality of layers. The anode 7025 can be formed using a light-transmitting conductive material as in the case of FIG. 22A.

The light-emitting element 7022 includes the cathode 7023, the anode 7025, and the light-emitting layer 7024 sandwiched between the cathode 7023 and the anode 7025. In the case of the pixel illustrated in FIG. 22C, light is emitted from the light-emitting element 7022 to both the anode 7025 side and the cathode 7023 side as indicated by arrows.

In FIG. 22C, a second gate electrode 7029 overlaps with the oxide semiconductor layer. Therefore, as a material for the second gate electrode 7029, a light-blocking conductive material (such as Ti, titanium nitride, Al, or W) is used. Here, titanium is used as a material for the second gate electrode 7029. The second gate electrode 7029 controls the threshold voltage of the transistor 7021. The oxide semiconductor layer in the transistor 7021 is shielded from light by the second gate electrode 7029. The second gate electrode 7029 and the connection electrode 7028 which is connected to the transistor 7021 are formed from the same material (that is, titanium) and the same layer.

Although an organic EL element is described here as a light-emitting element, an inorganic EL element may be used as a light-emitting element.

Note that although the example in which a transistor (a driver transistor) which controls driving of a light-emitting element is connected to the light-emitting element is described in this embodiment, a transistor for controlling current may be connected between the driver transistor and the light-emitting element.

Figure 23A:
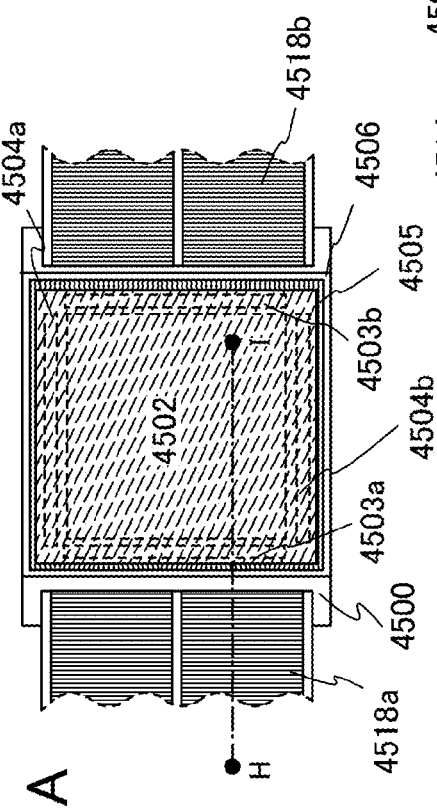
FIGS. 23A and 23B are diagrams illustrating a display device which is one embodiment of the present invention.
Figure 23B:
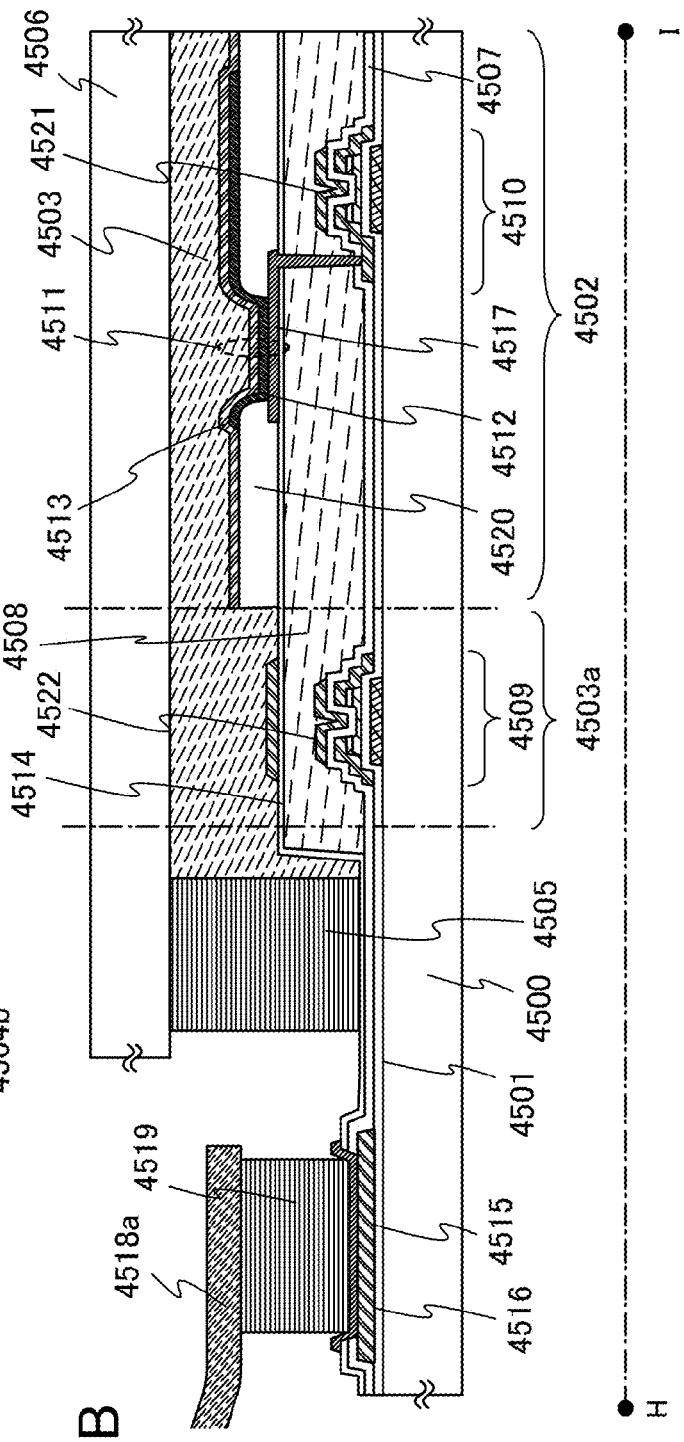

Next, the appearance and a cross section of a light-emitting display panel (also referred to as a light-emitting panel), which is one embodiment of the semiconductor device of the present invention, will be described with reference to FIGS. 23A and 23B. FIG. 23A is a top view of a light-emitting display panel in which a transistor and a light-emitting element formed over a first substrate are sealed between the first substrate and a second substrate with a sealant. FIG. 23B is a cross-sectional view taken along line H-I of FIG. 23A.

A sealant 4505 is provided so as to surround a pixel portion 4502, signal line driver circuits 4503a and 4503b, and scan line driver circuits 4504a and 4504b which are provided over a first substrate 4500. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4503, by the first substrate 4500, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air as described above.

The pixel portion 4502, the signal line driver circuits 4503a and 4503b, and the scan line driver circuits 4504a and 4504b formed over the first substrate 4500 each include a plurality of transistors, and a transistor 4510 included in the pixel portion 4502 and a transistor 4509 included in the signal line driver circuit 4503a are illustrated as an example in FIG. 23B.

Here, the transistors 4509 and 4510 include a Zn—O-based oxide semiconductor. In this embodiment, the transistors 4509 and 4510 are n-channel transistors. The transistors 4509 and 4510 are covered with a resin layer 4508 which is provided over the first protective layer 4507, and a second protective insulating layer 4514 which is provided over the resin layer 4508. Note that the second protective insulating layer 4514 formed using silicon nitride is formed to cover a top surface and side surfaces of the resin layer 4508. A second gate electrode 4522 is provided as a top layer of the transistor 4509, and a second gate electrode 4521 is provided as a top layer of the transistor 4510. The second gate electrodes 4521 and 4522 are formed from the same layer, and they each control the threshold voltage of the transistor, and function as a protective layer for the oxide semiconductor layer.

The width of the second gate electrode 4522 may be larger than that of the gate electrode of the transistor 4509 so that gate voltage can be applied to the entire oxide semiconductor layer. In the case where the second gate electrode 4522 is formed using a light-blocking conductive material, the oxide semiconductor layer of the transistor 4509 can be shielded from light. In the case where the second gate electrode 4522 is formed using a light-blocking conductive material, changes in electric characteristics of the transistor due to photosensitivity of the oxide semiconductor can be prevented and thus the transistor can operate stably.

The width of the second gate electrode 4521 is different from that of the second gate electrode 4522 and is smaller than that of the first gate electrode of the transistor 4510. When the width of the second gate electrode 4521 is made smaller than that of the first gate electrode of the transistor 4510, an area in which the second gate electrode 4521 overlaps with the source electrode or the drain electrode of the transistor 4510 is reduced, whereby parasitic capacitance can be reduced. The width of the second gate electrode 4521 is smaller than that of the oxide semiconductor layer of the transistor 4510; thus, the second gate electrode 4521 shields only part of the oxide semiconductor layer from light, but a second electrode layer 4513 is provided over the second gate electrode 4521. When the second electrode layer 4513 is formed using a light-blocking conductive material, the entire part of the oxide semiconductor layer can be shielded from light.

A first electrode layer 4517 that is a pixel electrode included in the light-emitting element 4511 is connected to a source electrode or a drain electrode of the transistor 4510. Note that the light-emitting element 4511 has a structure in which the first electrode layer 4517, an electroluminescent layer 4512, and the second electrode layer 4513 are stacked, but it is not limited to the structure. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed using either a single layer or a stacked layer of a plurality of layers.

A protective film may be formed over the second electrode layer 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 and the first electrode layer 4517 which is included in the light-emitting element 4511 are formed from the same material and the same layer. A terminal electrode 4516 and the source and drain electrodes which are included in the transistors 4509 and 4510 are formed from the same material and the same layer. Note that a gate insulating layer 4501 of the transistors 4509 and 4510 is provided below the terminal electrode 4516

The connection terminal electrode 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting substrate such as a glass plate, a plastic plate, a polyester film, or an acrylic film is used.

As the filler 4503, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. Here, nitrogen is used for the filler 4503.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be provided using a single crystal semiconductor film or polycrystalline semiconductor film over another substrate. In addition, only the signal line driver circuits, or only the scan line driver circuits or part thereof may be separately formed over another substrate.

Through the above steps, a highly reliable light-emitting display device (display panel) as a semiconductor device can be manufactured.

This embodiment can be implemented in combination with any of the other embodiments as appropriate.

[Embodiment 8]

In this embodiment, a liquid crystal display device to which the transistor including an oxide semiconductor layer described in any one of Embodiments 1 to 4 is applied will be described. A liquid crystal display device having a display function can be manufactured using the transistors including an oxide semiconductor layer which are described in any one of Embodiments 1 to 4 not only in a driver circuit but also in a pixel portion. Further, part or whole of a driver circuit can be formed over the same substrate as a pixel portion, using the transistor, whereby a system-on-panel can be obtained.

The liquid crystal display device includes a liquid crystal element (a liquid crystal display element) as a display element.

In addition, the liquid crystal display device includes a panel in which a display element is sealed, and a module in which an IC and the like including a controller are mounted on the panel. The liquid crystal display device also includes one mode of an element substrate before the display element is completed in a manufacturing process of the liquid crystal display device, and the element substrate is provided with a means to supply current to the display element in each pixel. Specifically, the element substrate may be in a state after only a pixel electrode of the display element is formed, a state after a conductive film to be a pixel electrode is formed but before the conductive film is etched to be the pixel electrode, or any other states.

A liquid crystal display device in this specification refers to an image display device, a display device, or a light source (including a lighting device). Further, the liquid crystal display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module in which an integrated circuit (IC) is directly mounted on a display element by a chip-on-glass (COG) method.

Figure 24B:
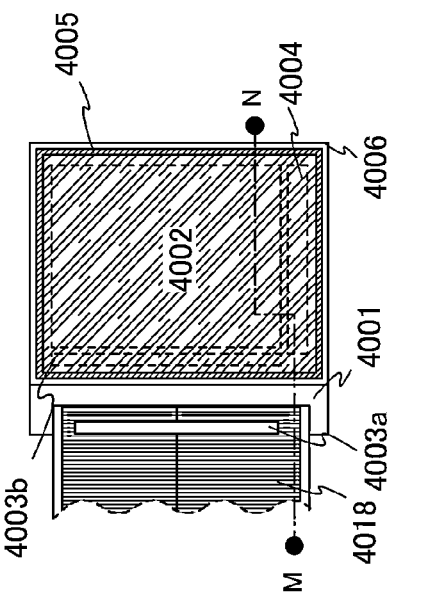
Figure 24B:
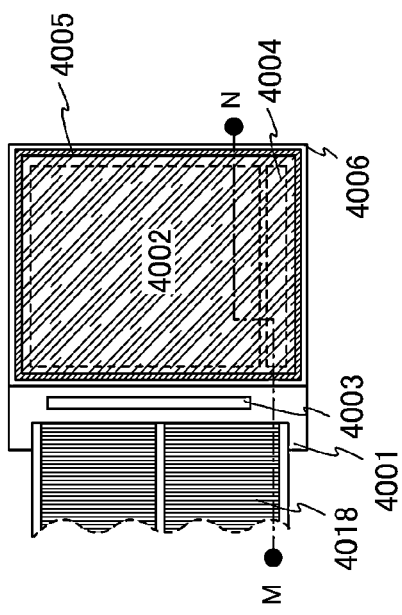
Figure 24B:
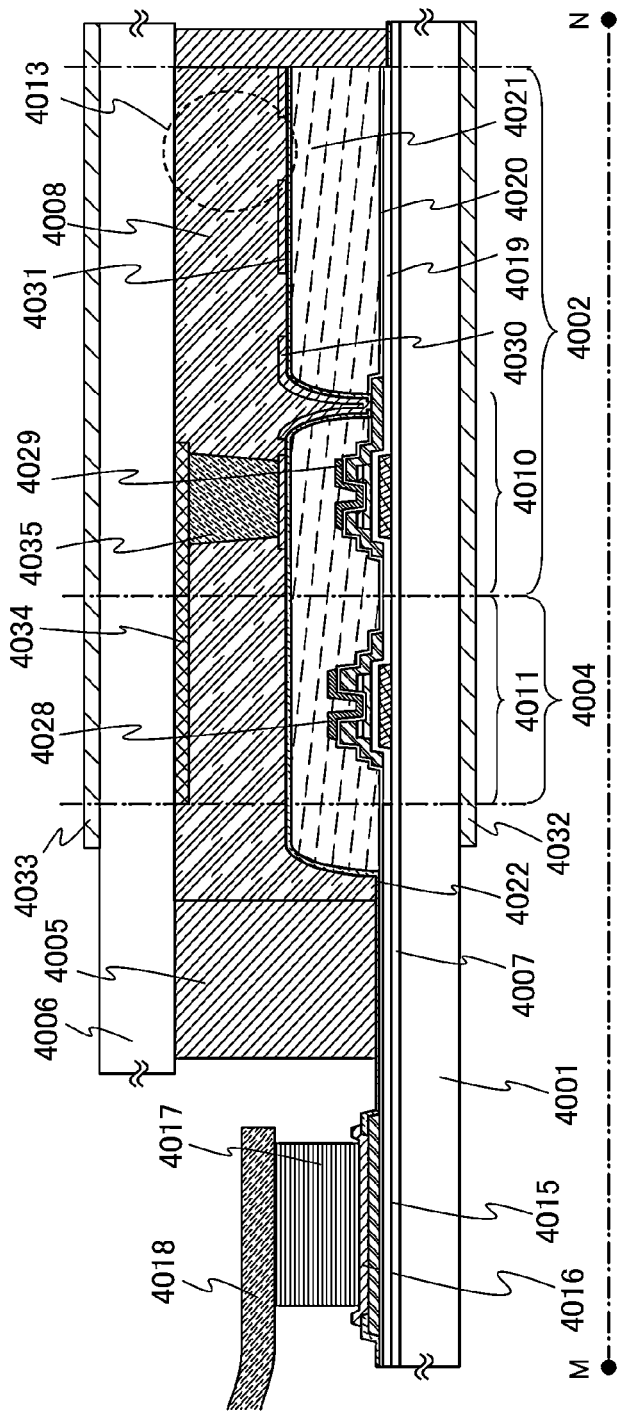

Next, the appearance and a cross section of a liquid crystal display panel, which is one embodiment of the liquid crystal display device of the present invention, will be described with reference to FIGS. 24A1, 24A2, and 24B. FIGS. 24A1 and 24A2 are top views of panels in which a liquid crystal element 4013 is sealed with a sealant 4005 between a first substrate 4001 and a second substrate 4006. FIG. 24B is a cross-sectional view taken along line M-N of FIGS. 24A1 and 24A2.

In FIGS. 24A1, 24A2, and 24B, the sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. There is no particular limitation on the liquid crystal layer 4008 in this embodiment, but a liquid crystal material exhibiting a blue phase is used. A liquid crystal material exhibiting a blue phase has a short response time of one millisecond or less from the state of applying no voltage to the state of applying voltage, whereby short-time response is possible. The liquid crystal material exhibiting a blue phase includes a liquid crystal and a chiral agent. The chiral agent is employed to align the liquid crystal in a helical structure and to make the liquid crystal exhibit a blue phase. For example, a liquid crystal material into which a chiral agent is mixed at 5 wt % or more may be used for the liquid crystal layer. As the liquid crystal, a thermotropic liquid crystal, a low-molecular liquid crystal, a high-molecular liquid crystal, a ferroelectric liquid crystal, an anti-ferroelectric liquid crystal, or the like is used.

In FIG. 24A1, a signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that FIG. 24A2 illustrates an example in which part of the signal line driver circuit is formed over the first substrate 4001. A signal line driver circuit 4003b is formed over the first substrate 4001, and a signal line driver circuit 4003a formed using a single crystal semiconductor film or a polycrystalline semiconductor film is mounted over a separately-prepared substrate.

Note that the connection method of a driver circuit which is separately formed is not particularly limited, and a COG method, a wire bonding method, a TAB method, or the like can be used. FIG. 24A1 illustrates an example in which the signal line driver circuit is mounted by a COG method, and FIG. 24A2 illustrates an example in which the signal line driver circuit is mounted by a TAB method.

The pixel portion 4002 and the scan line driver circuit 4004 which are provided over the first substrate 4001 include a plurality of transistors. FIG. 24B illustrates the transistor 4010 included in the pixel portion 4002 and the transistor 4011 included in the scan line driver circuit 4004. Over the transistors 4010 and 4011, a first protective insulating layer 4020 and a resin layer 4021 which is a second protective insulating layer, and a third protective insulating layer 4022 are provided. The transistors which are described in any one of Embodiments 1 to 4 can be used as the transistors 4010 and 4011. In this embodiment, the transistors 4010 and 4011 are n-channel transistors each including an oxide semiconductor layer for a channel formation region.

The transistors 4010 and 4011 are covered with the first protective insulating layer 4020, the resin layer 4021 which is the second protective insulating layer, and the third protective insulating layer 4022. The first protective insulating layer 4020 is provided over and in contact with the oxide semiconductor layers of the transistors 4010 and 4011 and a gate insulating layer 4019.

The resin layer 4021 which is the second protective insulating layer and serves as a planarizing insulating film can be formed from an organic material having heat resistance, such as polyimide, acrylic, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. Note that the resin layer 4021 may be formed by stacking a plurality of insulating films formed of these materials. The resin layer 4021 is a light-transmitting resin layer and a photosensitive polyimide resin is used in this embodiment.

There is no particular limitation on the formation method of the insulating layer, and the following method can be employed depending on the material: a method such as a sputtering method, an SOG method, spin coating, dip coating, spray coating, or a droplet discharging method (e.g., ink jetting, screen printing, or offset printing), or with a tool (equipment) such as a doctor knife, a roll coater, a curtain coater, or a knife coater.

Note that the third protective insulating layer 4022 is provided to prevent entry of an impurity element (such as sodium) which floats in air, such as an organic substance, a metal substance, or water vapor, and which contaminates the oxide semiconductor layer, and the third protective insulating layer 4022 is preferably a dense film. The protective film may be formed using either a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a PCVD method or a sputtering method.

Further, the third protective insulating layer 4022 is formed using a silicon nitride film obtained under a low power condition by a plasma CVD method. Further, a base insulating layer 4007 which is formed using a silicon nitride film and the third protective insulating layer 4022 are in contact with each other outside the pixel portion to surround the resin layer 4021 which is the second protective insulating layer. Thus, the transistors 4010 and 4011 are encapsulated with silicon nitride films, whereby the reliability of the transistors 4010 and 4011 is improved.

A second gate electrode 4028 is formed over the first protective insulating layer 4020 and in a position overlapping with the oxide semiconductor layer of the transistor 4011. A second gate electrode 4029 is formed over the third protective insulating layer 4022 and in a position overlapping with the oxide semiconductor layer of the transistor 4010.

A pixel electrode layer 4030 and a common electrode layer 4031 are provided over the first substrate 4001, and the pixel electrode layer 4030 is electrically connected to the transistor 4010. The second gate electrodes 4028 and 4029 can have the same potential as the common electrode layer 4031. The second gate electrodes 4028 and 4029 are formed in the same step as the common electrode layer 4031. Further, if the second gate electrodes 4028 and 4029 are formed using a light-blocking material, they can also serve as light-blocking layers shielding the oxide semiconductor layers of the transistors 4011 and 4010 from light.

Alternatively, the second gate electrodes 4028 and 4029 can have a different potential from the common electrode layer 4031. In this case, a control line electrically connected to the second gate electrodes 4028 and 4029 is provided and the threshold voltage of each of the transistors 4011 and 4010 is controlled with a potential of the control line.

Note that the structures of the transistors are not limited to the above description, and the second gate electrodes 4028 and 4029 may be connected to the first gate electrode, or they may be in a floating state.

The liquid crystal element 4013 includes the pixel electrode layer 4030, the common electrode layer 4031, and the liquid crystal layer 4008. In this embodiment, a method is used in which grayscale is controlled by generating an electric field which is substantially parallel to a substrate (i.e., in a lateral direction) to move liquid crystal molecules in a plane parallel to the substrate. In such a method, an electrode structure used in an in plane switching (IPS) mode or a fringe field switching (FFS) mode can be used. Note that a polarizing plate 4032 and a polarizing plate 4033 are provided on the outer sides of the first substrate 4001 and the second substrate 4006, respectively.

For the first substrate 4001 and the second substrate 4006, a glass substrate, a plastic substrate, or the like having a light-transmitting property can be used. As the plastic substrate, a fiberglass-reinforced plastics (FRP) plate, a polyvinyl fluoride (PVF) film, a polyester film, or an acrylic resin film can be used. Moreover, a sheet in which aluminum foil is sandwiched between PVF films or polyester films can also be used.

A post spacer 4035 is obtained by selective etching of an insulating film and is provided in order to control the thickness (a cell gap) of the liquid crystal layer 4008. Note that the shape of the spacer is not limited thereto, and a spherical spacer may alternatively be used. The columnar post spacer 4035 is located to overlap with the second gate electrode 4029.

FIGS. 24A1, 24A2, and 24B illustrate examples of liquid crystal display devices in which a polarizing plate is provided on the outer side (the view side) of a substrate; however, the polarizing plate may be provided on the inner side of the substrate.

Furthermore, a light-blocking layer serving as a black matrix may be provided to an appropriate position. In FIGS. 24A1, 24A2, and 24B, a light-blocking layer 4034 is provided on the second substrate 4006 side so as to cover the transistors 4010 and 4011. By provision of the light-blocking layer 4034, contrast can be further improved and the transistor can operate stably.

When the light-blocking layer 4034 is provided, the intensity of incident light on the oxide semiconductor layers of the transistors can be attenuated; accordingly, electric characteristics of the transistors can be prevented from being varied due to photosensitivity of the oxide semiconductor layers and the transistors can operate stably.

The pixel electrode layer 4030, the common electrode layer 4031, and the second gate electrodes 4028 and 4029 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can also be used for the pixel electrode layer 4030, the common electrode layer 4031, and the second gate electrodes 4028 and 4029.

Note that a variety of signals and potentials are supplied to the signal line driver circuit 4003 which is formed separately, and the scan line driver circuit 4004 or the pixel portion 4002 from an FPC 4018.

Further, since the transistor is easily broken by static electricity and the like, a protective circuit for protecting the driver circuits is preferably provided over the same substrate for a gate line or a source line. The protective circuit is preferably formed using a nonlinear element in which an oxide semiconductor is used.

In FIGS. 24A1, 24A2, and 24B, a connection terminal electrode 4015 and the pixel electrode layer 4030 are formed from the same layer, and a terminal electrode 4016 and source and drain electrode layers of the transistors 4010 and 4011 are formed from the same layer.

The connection terminal electrode 4015 is electrically connected to a terminal included in the FPC 4018 through an anisotropic conductive film 4017.

FIGS. 24A1, 24A2, and 24B illustrate an example in which the signal line driver circuit 4003 is separately formed and mounted on the first substrate 4001; however, this embodiment is not limited to this structure. The scan line driver circuit may be formed separately and then mounted, or only part of the signal line driver circuit or part of the scan line driver circuit may be formed separately and then mounted.

Figure 25:
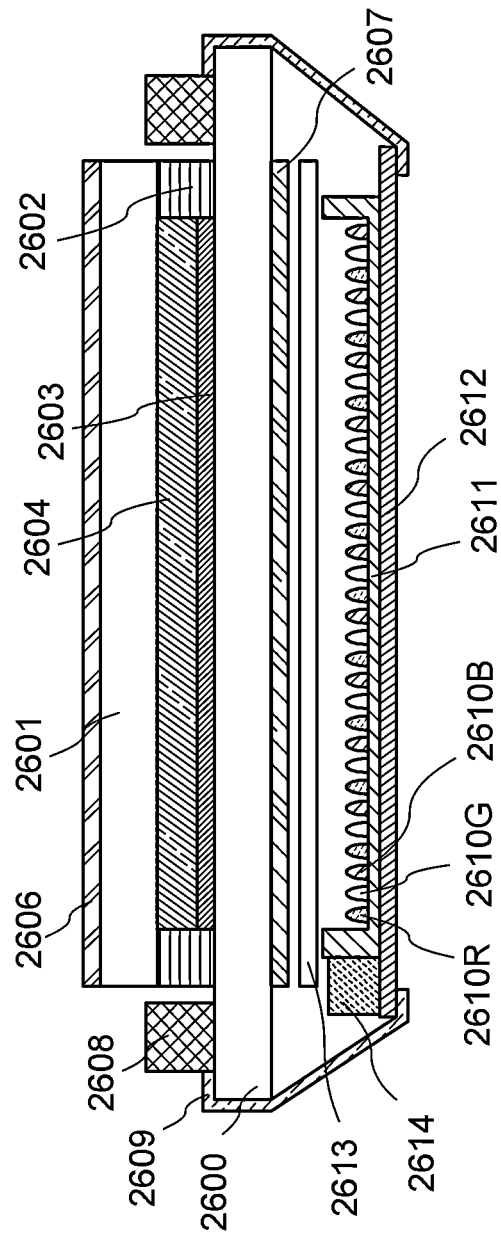
FIG. 25 is a diagram illustrating a display device which is one embodiment of the present invention.

FIG. 25 illustrates an example of a cross-sectional structure of a liquid crystal display device in which an element substrate 2600 and a counter substrate 2601 are attached to each other with a sealant 2602, and an element layer 2603 including a transistor or the like and a liquid crystal layer 2604 are provided between the substrates.

In the case where color display is performed, for example, light-emitting diodes which emit light of plural colors may be arranged in a backlight portion. In the case of an RGB mode, a red light-emitting diode 2610R, a green light-emitting diode 2610G, and a blue light-emitting diode 2610B are disposed in each of the regions into which a display area of the liquid crystal display device is divided.

A polarizing plate 2606 is provided on the outer side of the counter substrate 2601, and a polarizing plate 2607 and an optical sheet 2613 are provided on the outer side of the element substrate 2600. A light source is formed using the red light-emitting diode 2610R, the green light-emitting diode 2610G, the blue light-emitting diode 2610B, and a reflective plate 2611. An LED control circuit 2614 provided for a circuit substrate 2612 is connected to a wiring circuit portion 2608 of the element substrate 2600 via a flexible wiring board 2609 and further includes an external circuit such as a control circuit or a power source circuit.

In this embodiment, an example in which LEDs are individually made to emit light by this LED control circuit 2614, so that a field-sequential liquid crystal display device is formed; however, an embodiment of the present invention is not limited thereto. A cold cathode tube or a white LED may be used as a light source of backlight, and a color filter may be provided.

Further, in this embodiment, an example of an electrode structure used in the IPS mode is described; however, there is no particularly limitation on the electrode structure mode. The following mode can be used: a TN (twisted nematic) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like.

This embodiment can be implemented in combination with any of the other embodiments as appropriate.

[Embodiment 9]

In this embodiment, an example of an electronic paper will be described as a semiconductor device which includes a plurality of transistors including an oxide semiconductor layer.

Figure 26A:
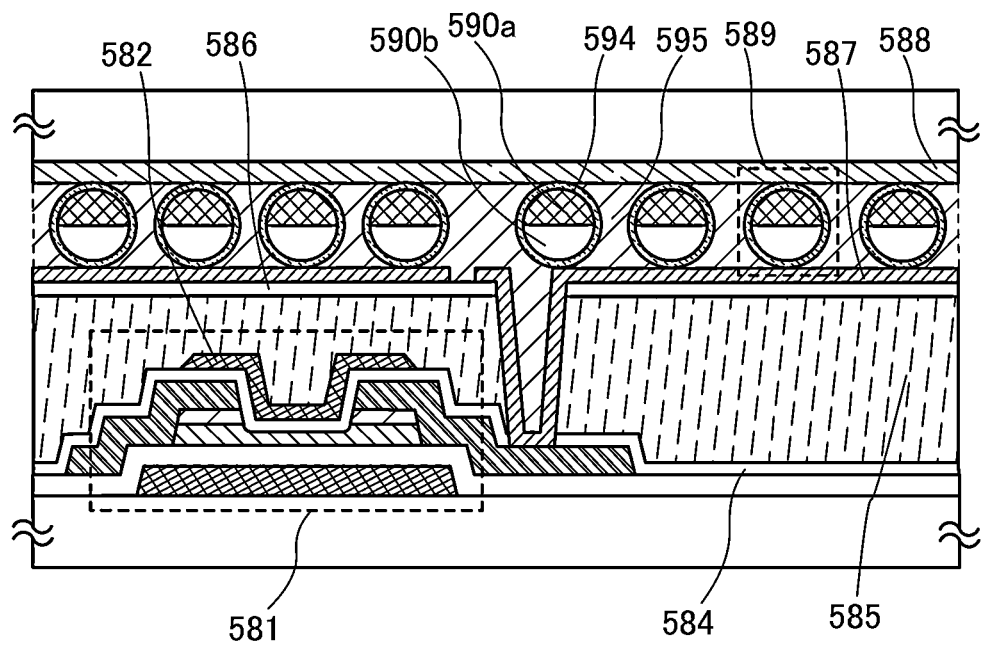
FIGS. 26A and 26B are diagrams each illustrating an electronic device which is one embodiment of the present invention.

FIG. 26A is a cross-sectional structure of an active matrix electronic paper. As a transistor 581 used in a display portion of the semiconductor device, the transistor which is described in any one of Embodiments 1 to 4 can be employed.

The electronic paper of FIG. 26A is an example of a display device in which a twisting ball display system is employed. The twisting ball display system refers to a method in which spherical particles each colored in black and white are used for a display element and are arranged between a first electrode layer and a second electrode layer, and a potential difference is generated between the first electrode layer and the second electrode layer to control orientation of the spherical particles, so that display is performed.

The transistor 581 has a bottom-gate structure. A first electrode layer 587 is electrically connected to a source or drain electrode through an opening formed in a first protective insulating layer 584, a resin layer 585 which is a second protective insulating layer, and a third protective insulating layer 586. The first protective insulating layer 584 covers the transistor 581. A second gate electrode 582 is provided below and in contact with the resin layer 585 which is provided over the first protective insulating layer 584, and the third protective insulating layer 586 is provided to cover the second gate electrode 582. An oxide semiconductor layer of the transistor 581 is protected by the first protective insulating layer 584, the resin layer 585 which is the second protective insulating layer, the second gate electrode 582, and the third protective insulating layer 586.

Between the first electrode layer 587 and a second electrode layer 588, spherical particles 589 each having a black region 590a, a white region 590b, and a cavity 594 are provided. A space around the spherical particles 589 is filled with a filler 595 such as a resin (see FIG. 26A). The first electrode layer 587 corresponds to the pixel electrode and the second electrode layer 588 corresponds to the common electrode. The second electrode layer 588 is electrically connected to a common potential line provided over the same substrate as the transistor 581. With the use of a common connection portion, the second electrode layer 588 can be electrically connected to the common potential line through conductive particles provided between a pair of substrates.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when a potential difference is generated between the first electrode layer and the second electrode layer, the white microparticles and the black microparticles move to opposite sides, so that white or black can be displayed. A display element using this principle is an electrophoretic display element and is called an electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, in the case where the electric paper has a structure in which a signal and electric power are wirelessly supplied from an electric wave source, a displayed image can be held even if a semiconductor device having a display function is distanced from the electric wave source.

By using the transistor manufactured by the process described in any one of Embodiments 1 to 4 as a switching element, an electronic paper can be manufactured as a semiconductor device at low cost. An electronic paper can be used for electronic devices of a variety of fields as long as they can display data. For example, an electronic paper can be applied to an electronic book (e-book) reader, a poster, an advertisement in a vehicle such as a train, displays of various cards such as a credit card, and the like. Examples of such electronic devices are illustrated in FIG. 26B.

Figure 26B:
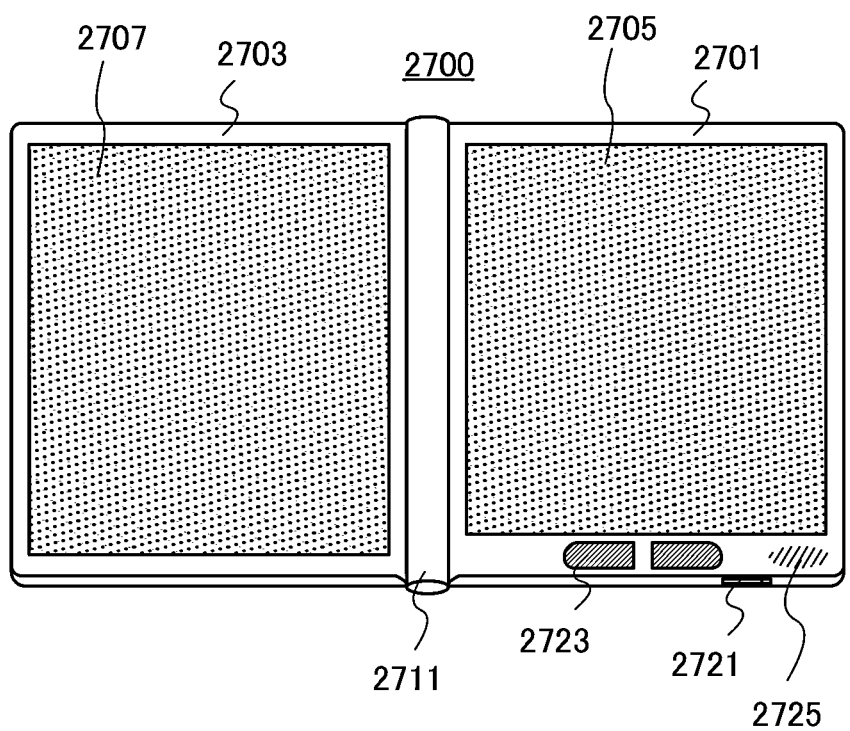

FIG. 26B illustrates an example of an electronic book reader 2700. The electronic book reader 2700 includes two housings, a first housing 2701 and a second housing 2703. The first housing 2701 and the second housing 2703 are combined with a hinge 2711 so that the electronic book reader 2700 can be opened and closed with the hinge 2711 as an axis. With such a structure, the electronic book reader 2700 can be operated like a paper book.

A first display portion 2705 and a second display portion 2707 are incorporated in the first housing 2701 and the second housing 2703, respectively. The first display portion 2705 and the second display portion 2707 may be configured to display one image or different images. In the case where the first display portion 2705 and the second display portion 2707 display different images, for example, a display portion on the right side (the first display portion 2705 in FIG. 26B) can display text and a display portion on the left side (the second display portion 2707 in FIG. 26B) can display graphics.

In the electronic book reader 2700 in FIG. 26B, the first housing 2701 is provided with an operation portion and the like. For example, the first housing 2701 is provided with a power switch 2721, an operation key 2723, a speaker 2725, and the like. With the operation key 2723, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as an AC adapter and a USB cable, or the like), a recording medium insert portion, or the like may be provided on the back surface or the side surface of the housing. Further, the electronic book reader 2700 may have a function of an electronic dictionary.

The electronic book reader 2700 may be configured to transmit and receive data by wireless communication. The structure can be employed in which desired book data or the like is purchased and downloaded from an electronic book server by wireless communication.

This embodiment can be implemented in combination with any of the other embodiments as appropriate.

[Embodiment 10]

A semiconductor device using the transistor described in any one of Embodiments 1 to 4 can be applied to a variety of electronic devices (including an amusement machine). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 27A:
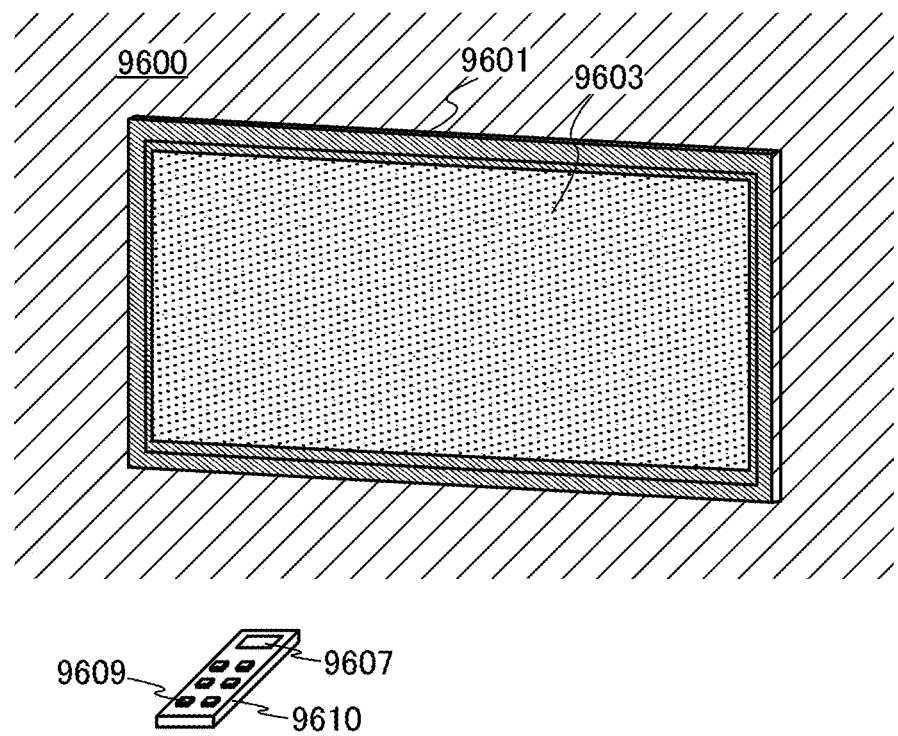
FIGS. 27A and 27B are diagrams each illustrating an electronic device which is one embodiment of the present invention.

In the television set in FIG. 27A, a display portion 9603 is incorporated in a housing 9601. The display portion 9603 can display an image. Here, the rear side of the housing 9601 is supported so that the television set is fixed to a wall 9600.

The television set illustrated in FIG. 27A can be operated with an operation switch of the housing 9601 or a remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television set illustrated in FIG. 27A is provided with a receiver, a modem, and the like. With the use of the receiver, general television broadcasting can be received. Moreover, when the television set is connected to a communication network by wired or wireless connection via the modem, one-way (from a sender to a receiver) or two-way (between a sender and a receiver or between receivers) data communication can be performed.

Figure 27B:
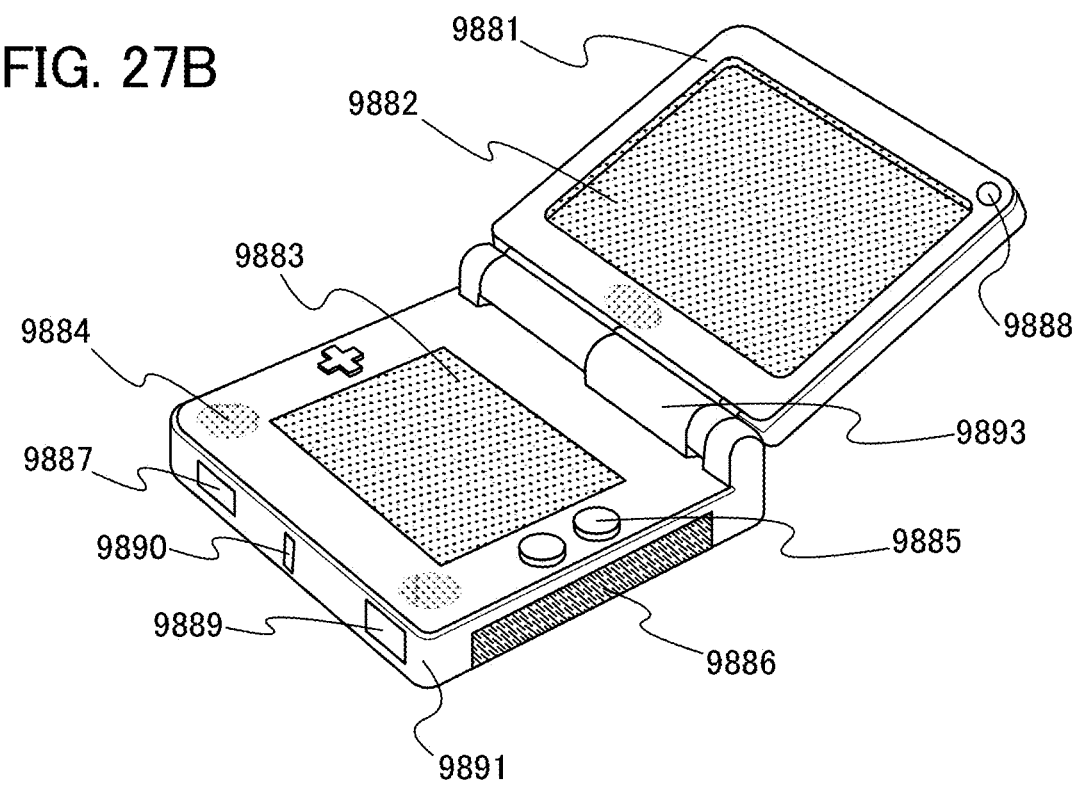

FIG. 27B is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 27B is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. Needless to say, the structure of the portable game machine is not limited to that described above. The portable game machine may have a structure in which additional accessory equipment is provided as appropriate as long as at least a semiconductor device according to an example of the present invention is provided. The portable game machine illustrated in FIG. 27B has a function of reading a program or data stored in a recording medium to display it on the display portion, and a function of sharing information with another portable game machine by wireless communication. Note that a function of the portable game machine illustrated in FIG. 27B is not limited to those described above, and the portable game machine can have a variety of functions.

Figure 28A:
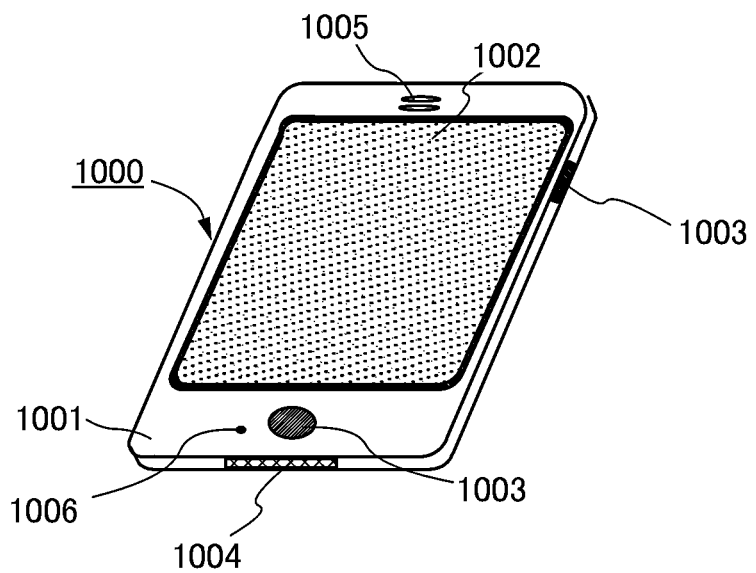
FIGS. 28A and 28B are diagrams each illustrating an electronic device which is one embodiment of the present invention.

FIG. 28A illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 28A is touched with a finger or the like, data can be input into the mobile phone handset 1000. Further, operation such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a call or texting, a text input mode mainly for inputting text is selected for the display portion 1002 so that text displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether the mobile phone handset 1000 is placed horizontally or vertically for a landscape mode or a portrait mode).

The screen modes are changed by touching the display portion 1002 or using the operation buttons 1003 of the housing 1001. Alternatively, the screen modes may be changed depending on the kind of the image displayed on the display portion 1002. For example, when a signal of an image displayed on the display portion 1002 is the one of moving image data, the screen mode is changed to the display mode. When the signal is the one of text data, the screen mode is changed to the input mode.

Further, in the input mode, when input by touching the display portion 1002 is not performed for a certain period while a signal detected by the optical sensor in the display portion 1002 is detected, the screen mode may be controlled so as to be changed from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits near-infrared light in the display portion 1002, an image of a finger vein, a palm vein, or the like can be taken.

Figure 28B:
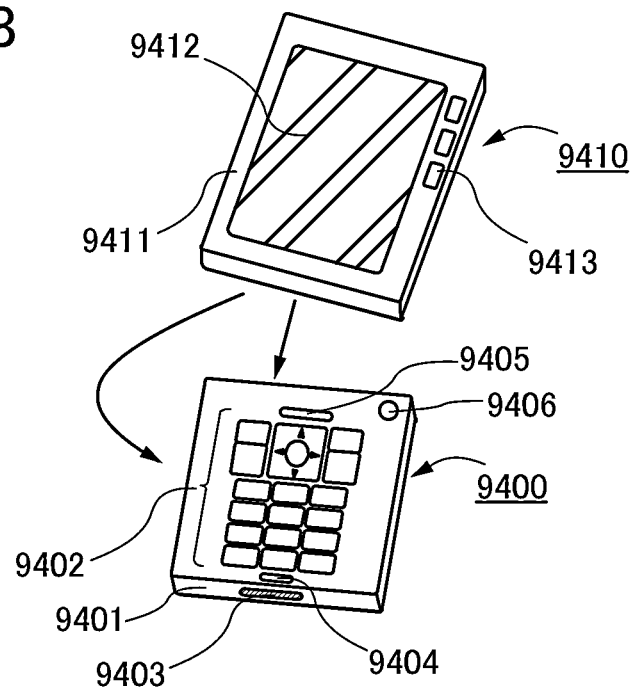

The cellular phone in FIG. 28B has a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 which has a display function can be detached from or attached to the communication device 9400 which has a phone function by moving in directions represented by arrows. Thus, the display device 9410 and the communication device 9400 can be attached to each other along their short sides or long sides. In addition, when only the display function is needed, the display device 9410 can be detached from the communication device 9400 and used alone. Images, input information, or the like can be transmitted or received by wireless or wire communication between the communication device 9400 and the display device 9410, each of which has a rechargeable battery.

This embodiment can be implemented in combination with any of the other embodiments as appropriate.

Example 1

One of methods for examining reliability of transistors is a bias-temperature stress test (hereinafter, referred to as a BT test). The BT test is one kind of accelerated test and can evaluate change in characteristics, caused by long-term usage, of transistors in a short time. In particular, the amount of shift in threshold voltage of the transistor between before and after the BT test is an important indicator for examining reliability. Between before and after the BT test, the small amount of shift in threshold voltage means high reliability.

Specifically, the temperature of a substrate over which a transistor is formed (substrate temperature) is set at fixed temperature, a source and a drain of the transistor are set at the same potential, and a gate is supplied with potential different from those of the source and the drain for a certain period. The substrate temperature may be set as appropriate in accordance with the purpose of the test. A test in the case where potential applied to the gate is higher than potentials of the source and the drain is referred to as a +BT test, and a test in the case where potential applied to the gate is lower than potentials of the source and the drain is referred to as a −BT test.

The stress conditions for the BT test can be determined by setting the substrate temperature, electric field intensity applied to a gate insulating film, or a time period of application of electric field. The electric field intensity applied to a gate insulating film can be determined by dividing the potential difference between the gate potential and the source and drain potential by the thickness of the gate insulating film. For example, in the case where the electric field intensity applied to the 100-nm-thick gate insulating film is to be set to 2 MV/cm, the potential difference may be set to 20 V.

In this example, results of a BT test performed on three kinds of samples are described. The samples are subjected to heat treatment under a nitrogen atmosphere at 250° C., 350° C., and 450° C., which is performed before formation of a source and a drain in manufacture of a transistor.

Note that "voltage" generally indicates a difference between potentials of two points, and "potential" indicates a static electric energy (electrical potential energy) unit charge which is at a point in a static electric field has. However, in an electronic circuit, a difference between a potential at a certain point and a reference potential (e.g., a ground potential) is often referred to as the potential at a certain point. Thus, in the following description, when a difference between a potential at a certain point and a reference potential (e.g., a ground potential) is referred to as the potential at a certain point, the potential at a certain point means the voltage except for the case where definition is particularly given.

As the BT test, a +BT test and a −BT test were performed under such conditions that a substrate temperature was 150° C., an electric field intensity applied to a gate insulating film was 2 MV/cm, and a time period for application was one hour.

First, the +BT test is described. In order to measure initial characteristics of a transistor subjected to the BT test, a change in characteristics of the source-drain current (hereinafter, referred to as the drain current) was measured, under the conditions where the substrate temperature was set to 40° C., the voltage between a source and a drain (hereinafter, the drain voltage) was set to 10 V, and the voltage between a source and a gate (hereinafter, the gate voltage) was changed in the range of −20 V to +20 V. That is, Vg-Id characteristics were measured. Here, as a countermeasure against moisture-absorption onto surfaces of the samples, the substrate temperature was set to 40° C. However, the measurement may be performed at room temperature (25° C.) or lower if there is no particular problem.

Next, the substrate temperature was increased to 150° C., and then, the potentials of the source and the drain of the transistor were set to 0 V. After that, the voltage was applied to the gate so that the electric field intensity applied to the gate insulating film was 2 MV/cm. In this case, the thickness of the gate insulating film of the transistor was 100 nm. The gate was supplied with +20 V of voltage, and the gate supplied with the voltage was kept for one hour. Note that although the time period for voltage application was one hour here, the time period may be changed as appropriate in accordance with the purpose.

Next, the substrate temperature was lowered to 40° C. while the voltage was kept on being applied to the source, the drain, and the gate. If application of the voltage is stopped before the substrate temperature was completely lowered to 40° C., the transistor which has been damaged during the BT test is repaired by the influence of residual heat. Thus, lowering of the substrate temperature needs to be performed with application of the voltage. After the substrate temperature was lowered to 40° C., application of the voltage was terminated.

Then, the Vg-Id characteristics were measured under the conditions same as those for the measurement of the initial characteristics, so that the Vg-Id characteristics after the +BT test were obtained.

Next, the −BT test is described. The −BT test was performed with the procedure similar to the +BT test, but has a different point from the +BT test, in that the voltage applied to the gate after the substrate temperature is increased to 150° C. is set to −20 V.

In the BT test, it is important to use a transistor which has been never subjected to a BT test. For example, if a −BT test is performed with use of a transistor which has been once subjected to a +BT test, the results of the −BT test cannot be evaluated correctly due to influence of the +BT test which has been performed previously. Similarly, if the transistor which has been once subjected to a +BT test is used for another +BT test, the results cannot be evaluated correctly. However, the usage of the transistor is not limited to the above in the case where the BT test is performed repeatedly in consideration of such influence.

Figure 29A:
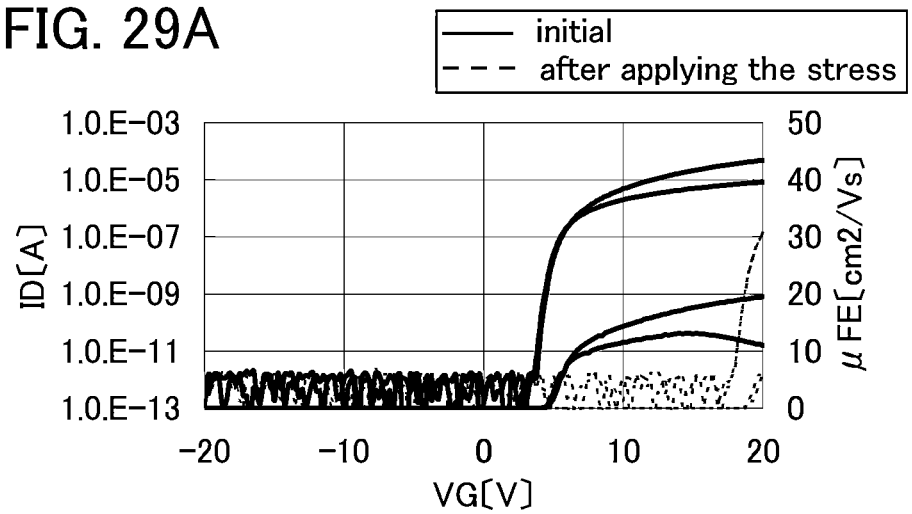
FIGS. 29A to 29C are graphs for description of Example 1.
Figure 29B:
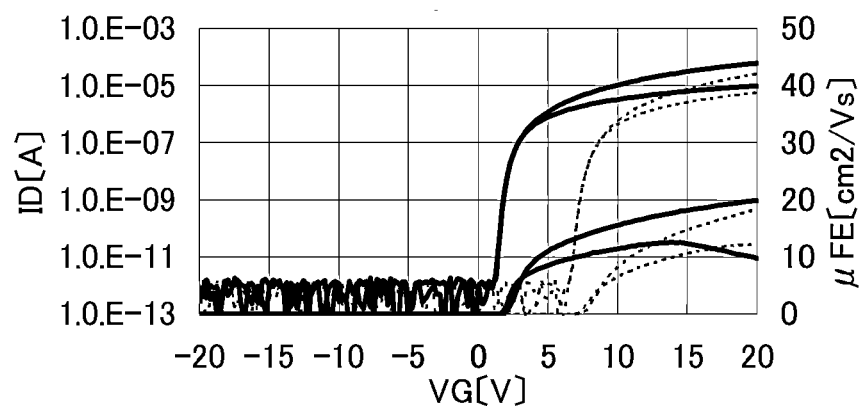
Figure 29C:
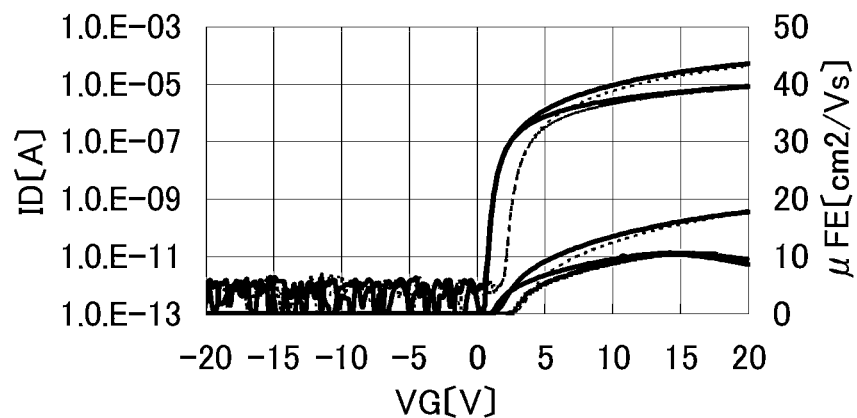

FIGS. 29A to 29C show the Vg-Id characteristics of the transistors before and after the +BT tests. FIG. 29A shows the +BT test results of transistors each formed in such a manner that heat treatment is performed under a nitrogen atmosphere at 250° C. before formation of a source and a drain. FIG. 29B shows the +BT test results of transistors each formed in such a manner that heat treatment is performed under a nitrogen atmosphere at 350° C. before formation of a source and a drain. FIG. 29C shows the +BT test results of transistors each formed in such a manner that heat treatment is performed under a nitrogen atmosphere at 450° C. before formation of a source and a drain.

Figure 30A:
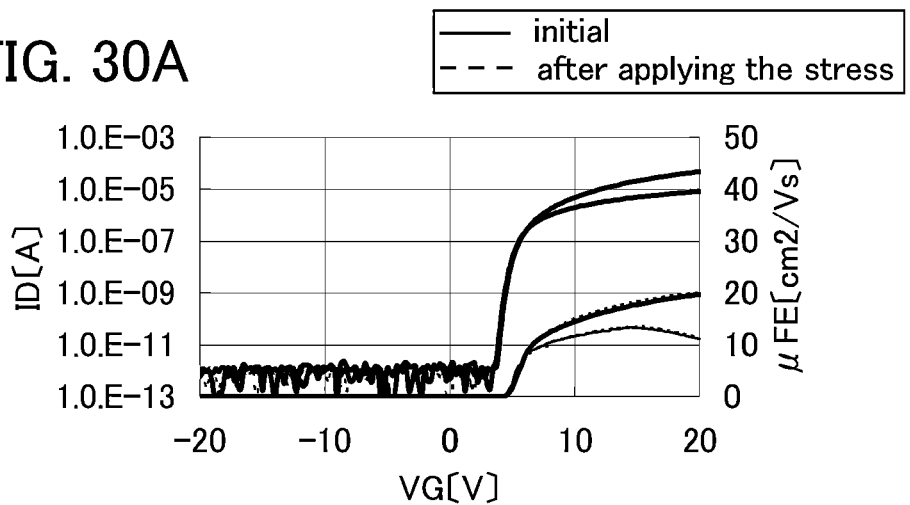
FIGS. 30A to 30C are graphs for description of Example 1.
Figure 30B:
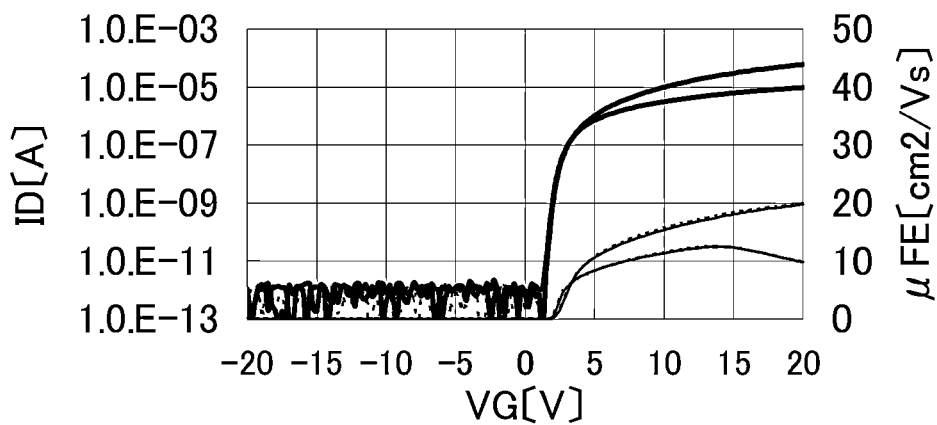
Figure 30C:
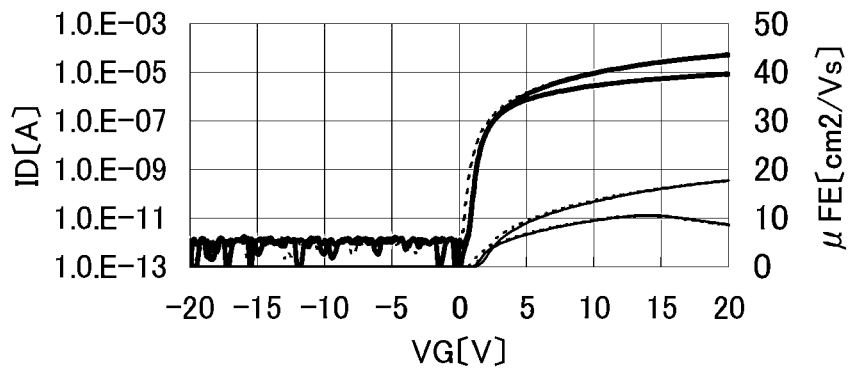

FIGS. 30A to 30C show the Vg-Id characteristics of the transistors before and after the −BT tests. FIG. 30A shows the −BT test results of transistors each formed in such a manner that heat treatment is performed under a nitrogen atmosphere at 250° C. before formation of a source and a drain. FIG. 30B shows the −BT test results of transistors each formed in such a manner that heat treatment is performed under a nitrogen atmosphere at 350° C. before formation of a source and a drain. FIG. 30C shows the −BT test results of transistors each formed in such a manner that heat treatment is performed under a nitrogen atmosphere at 450° C. before formation of a source and a drain.

Figure 31A:
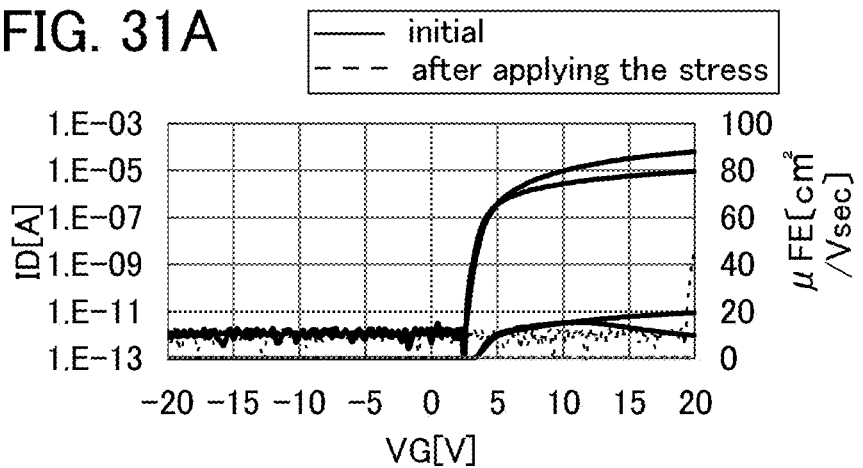
FIGS. 31A to 31C are graphs for description of Example 1.
Figure 31B:
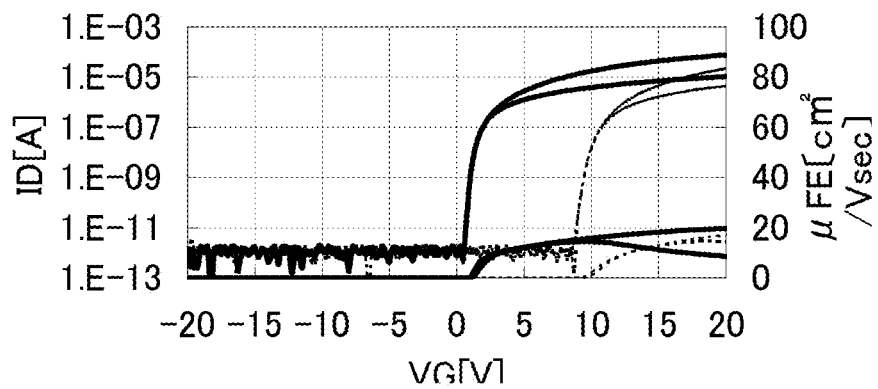
Figure 31C:
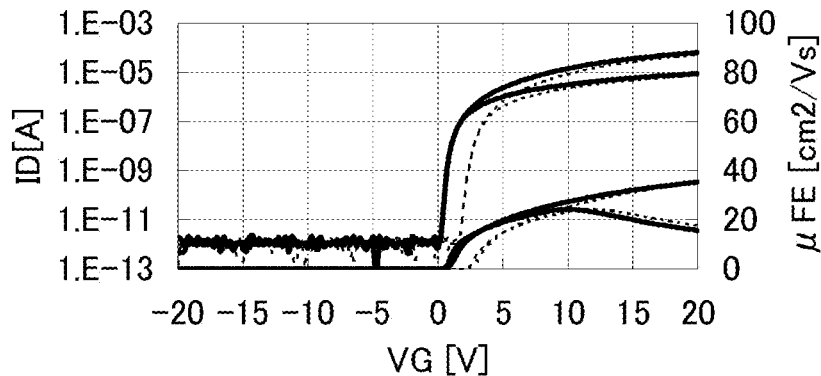
Figure 32A:
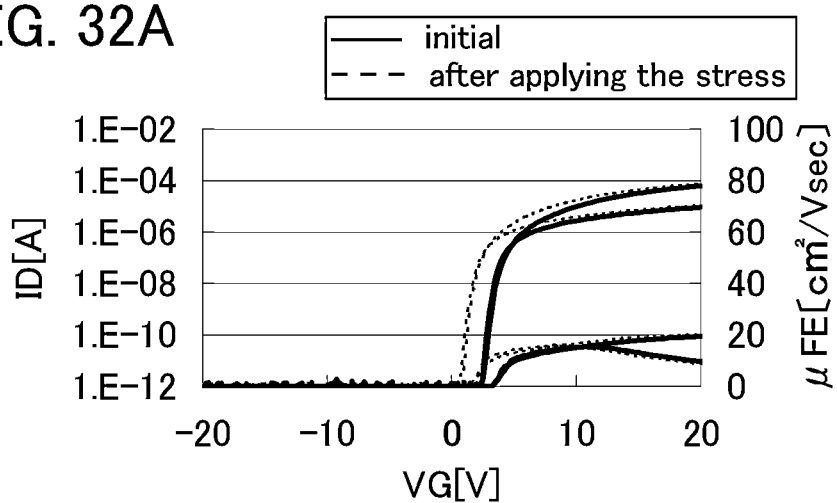
FIGS. 32A to 32C are graphs for description of Example 1.
Figure 32B:
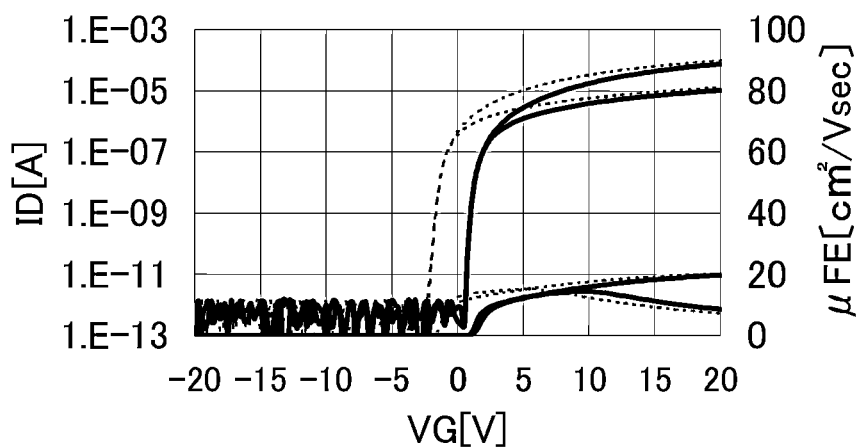
Figure 32C:
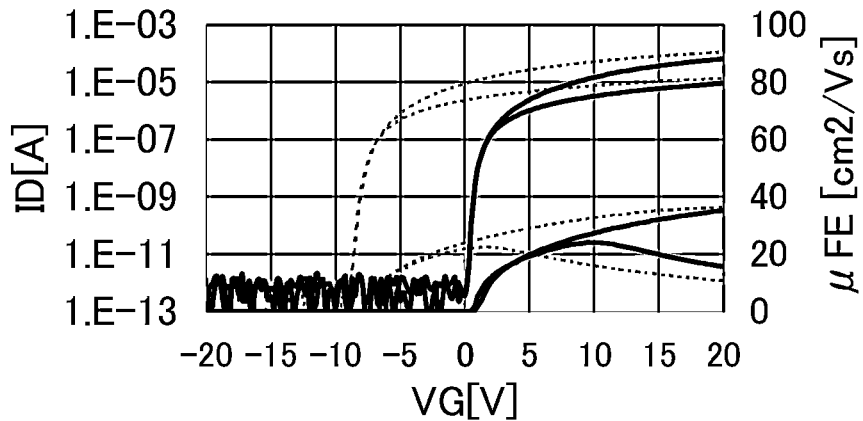

Note that in FIGS. 29A to 29C and FIGS. 30A to 30C, the second gate electrode has a three-layer structure in which a titanium layer (50 nm), an aluminum layer (100 nm), and a titanium layer (5 nm) are stacked. The second gate electrode of each pixel is led individually. Note that as a comparative example, results of +BT tests of when the second gate electrode is not provided are shown in FIGS. 31A to 31C, and results of −BT tests of when the second gate electrode is not provided are shown in FIGS. 32A to 32C. FIG. 31A shows the +BT test results at 250° C., FIG. 31B shows the +BT test results at 350° C., and FIG. 31C shows the +BT test results at 450° C. FIG. 32A shows the −BT test results at 250° C., FIG. 32B shows the −BT test results at 350° C., and FIG. 32C shows the −BT test results at 450° C.

Note that in each of FIGS. 31A to 31C and FIGS. 32A to 32C, the horizontal axis shows the gate voltage ($V_g$) and the vertical axis shows the drain current ($I_d$), and both of them are represented in a logarithmic scale. In each of FIGS. 31A to 31C and FIGS. 32A to 32C, a solid line represents initial characteristics and a dotted line represents characteristics after the stress is applied.

In terms of the amount of shift in the threshold voltage after the +BT test, it is found from FIGS. 29A to 29C and FIGS. 31A to 31C that the shift amount at 350° C. is smaller than that at 250° C. and that the shift amount at 450° C. is smaller than that at 350° C. That is, the higher the temperature of heat treatment, the smaller the amount of shift in the threshold voltage after +BT tests becomes. In addition, it is found from the comparison between FIGS. 30A to 30C and FIGS. 32A to 32C that the amount of shift in the threshold voltage after the −BT test becomes small by provision of the second gate electrode.

As can be seen from FIGS. 29A to 29C and FIGS. 31A to 31C, in the case where the temperature of the heat treatment performed before formation of the source and drain is about 400° C. or higher, the reliability in at least the +BT test can be improved. As can be seen from the comparison between FIGS. 30A to 30C and FIGS. 32A to 32C, in the case where the second gate electrode is provided, the reliability in the −BT test can be improved. Therefore, in the case where the temperature of the heat treatment performed before formation of the source and drain is about 400° C. or higher and the second gate electrode is provided, the reliability in the +BT test and the −BT test can be improved.

As described in this example, according to one embodiment of the present invention, the reliability in both of the +BT test and the −BT test can be improved.

Note that the transistor having high reliability in the −BT test as described above is particularly useful for application to a driver circuit in a driver circuit portion of a display device.

Example 2

In this example, heat treatment was performed on a plurality of samples under a nitrogen atmosphere at heat temperatures whose conditions were determined. Such a plurality of samples were measured with thermal desorption spectroscopy (hereinafter referred to as TDS). Measurement results are shown in FIG. 34, FIG. 35, and FIG. 36.

The TDS is used for detecting and identifying a gas component discharged or generated from the samples by a quadrupole mass analyzer; thus, a gas and a molecule discharged from surfaces and insides of the samples can be observed. Discharge or generation of gas from the samples occurs while the samples are heated and the temperature is rising in high vacuum. With use of a TDS (product name: 1024 amu QMS) manufactured by ESCO Ltd., under a condition where the rising temperature was at approximately 10° C./min, measurement was performed. At the beginning of the measurement, the pressure was $1 \times 10^{-8}$ (Pa), and during the measurement, the pressure was at a degree of vacuum of about $1 \times 10^{-7}$ (Pa).

Figure 34:
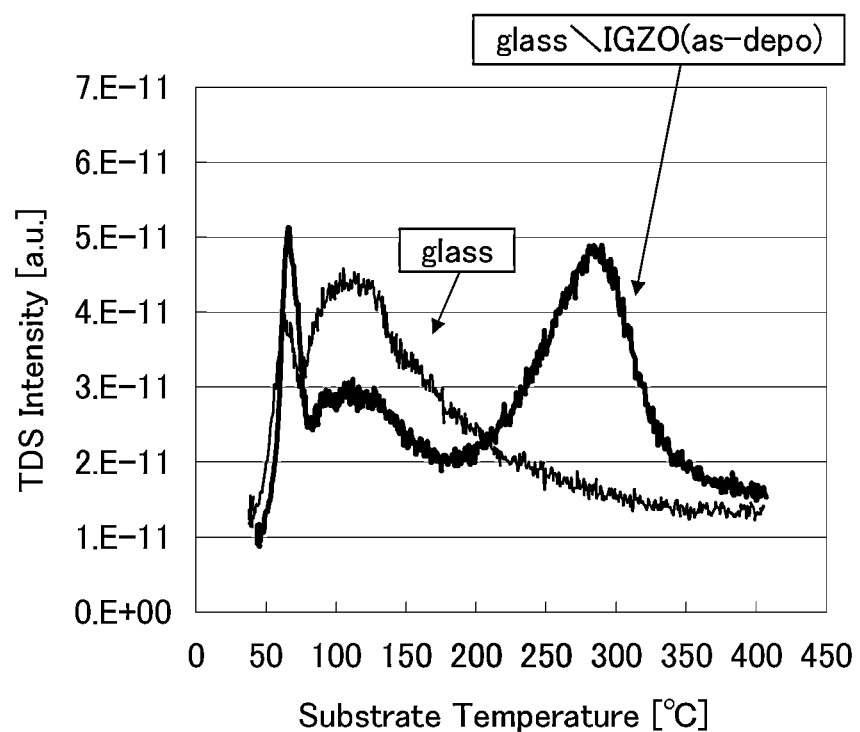
FIG. 34 is a graph for description of Example 2.

FIG. 34 is a graph showing TDS measurement results of comparison between a sample (comparative sample) which includes only a glass substrate and a sample (Sample 1) where an In—Ga—Zn—O-based non-single-crystal film with an original thickness of 50 nm (an actual thickness obtained after etching is about 30 nm) is formed over a glass substrate. FIG. 34 shows TDS measurement results obtained by measuring $H_2O$. Discharge of impurities such as moisture ($H_2O$) from the In—Ga—Zn—O-based non-single-crystal film can be confirmed from a peak in the vicinity of 300° C.

Figure 35:
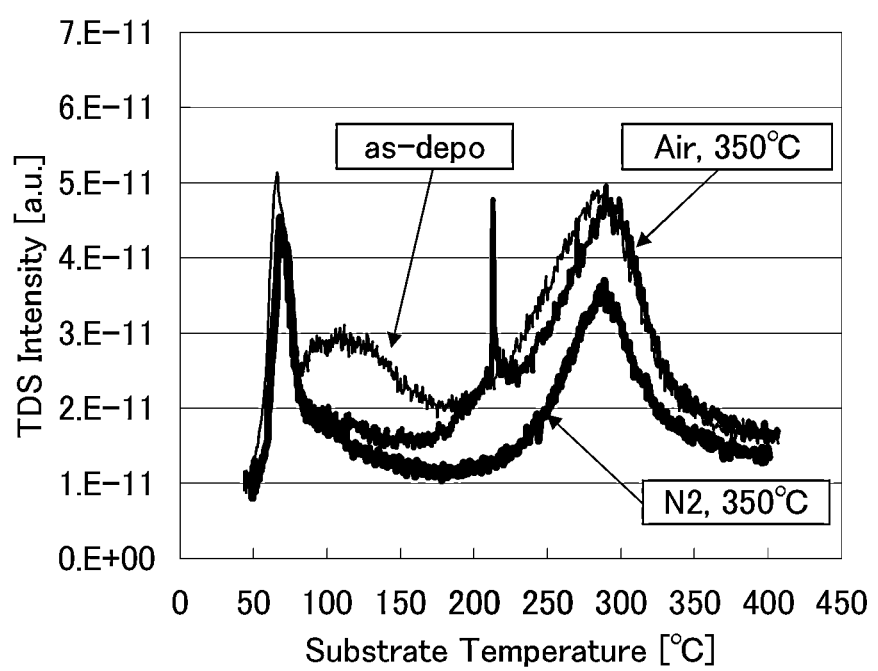
FIG. 35 is a graph for description of Example 2.
Figure 36:
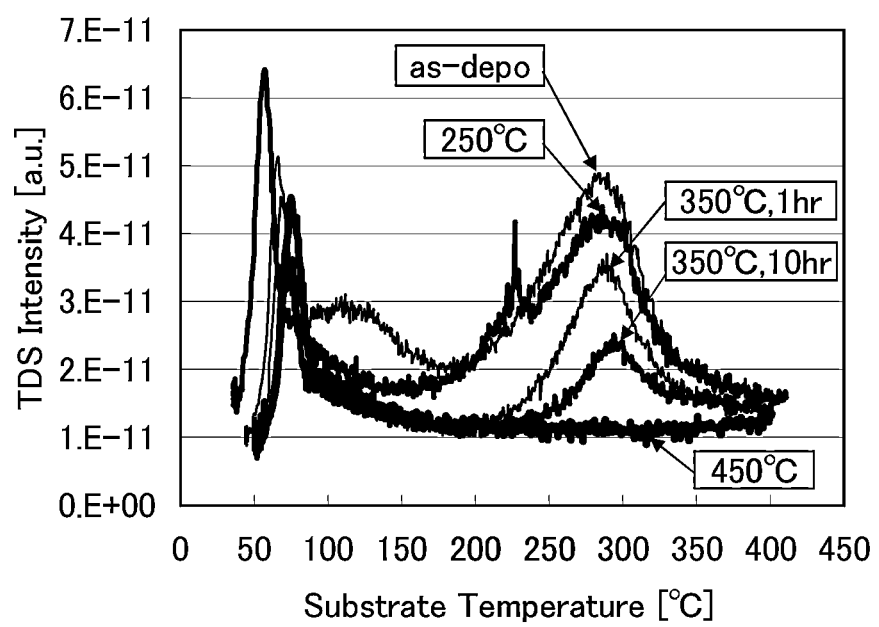
FIG. 36 is a graph for description of Example 2.

FIG. 35 is a graph showing comparison of samples, which shows TDS measurement results of $H_2O$. The comparison was performed on the following samples: the sample (Sample 1) where an In—Ga—Zn—O-based non-single-crystal film with an original thickness of 50 nm is formed over a glass substrate; a sample (Sample 2) where the structure of Sample 1 is subjected to heat treatment for an hour at 350° C. under an air atmosphere; and a sample (Sample 3) where the structure of Sample 1 is subjected to heat treatment for an hour at 350° C. under a nitrogen atmosphere. From the results shown in FIG. 35, a peak in the vicinity of 300° C. of Sample 3 is lower than that of Sample 2. Thus, discharge of moisture ($H_2O$) due to heat treatment performed under a nitrogen atmosphere can be confirmed. Moreover, it is found that heat treatment performed under a nitrogen atmosphere reduces impurities such as moisture ($H_2O$) more than heat treatment performed under an air atmosphere.

FIG. 36 is a graph showing comparison of samples, which shows TDS measurement results of $H_2O$. The comparison was performed on the following samples: the sample (Sample 1) where an In—Ga—Zn—O-based non-single-crystal film with an original thickness of 50 nm is formed over a glass substrate; a sample (Sample 4) where the structure of Sample 1 is subjected to heat treatment for an hour at 250° C. under a nitrogen atmosphere; the sample (Sample 3) where the structure of Sample 1 is subjected to heat treatment for an hour at 350° C. under a nitrogen atmosphere; a sample (Sample 5)

where the structure of Sample 1 is subjected to heat treatment for an hour at 450° C. under a nitrogen atmosphere; and a sample (Sample 6) where the structure of Sample 1 is subjected to heat treatment for 10 hours at 350° C. under a nitrogen atmosphere. From the results shown in FIG. 36, it is found that the higher the heat temperature within the measurement temperature range under a nitrogen atmosphere is, the smaller the amount of impurities such as moisture ($H_2O$) discharged from the In—Ga—Zn—O-based non-single-crystal film becomes.

In addition, from the graphs of FIG. 35 and FIG. 36, two peaks can be confirmed: a first peak in the vicinity of 200° C. to 250° C., which indicates discharge of impurities such as moisture ($H_2O$); and a second peak in the vicinity of 300° C., which indicates discharge of impurities such as moisture ($H_2O$).

Note that even in the case where the sample which has been subjected to heat treatment at 450° C. under a nitrogen atmosphere is left at room temperature in an air atmosphere approximately for one week, discharge of moisture at 200° C. or higher was not observed. Thus, it is found that by performing heat treatment, the In—Ga—Zn—O-based non-single-crystal film becomes stable.

Figure 33:
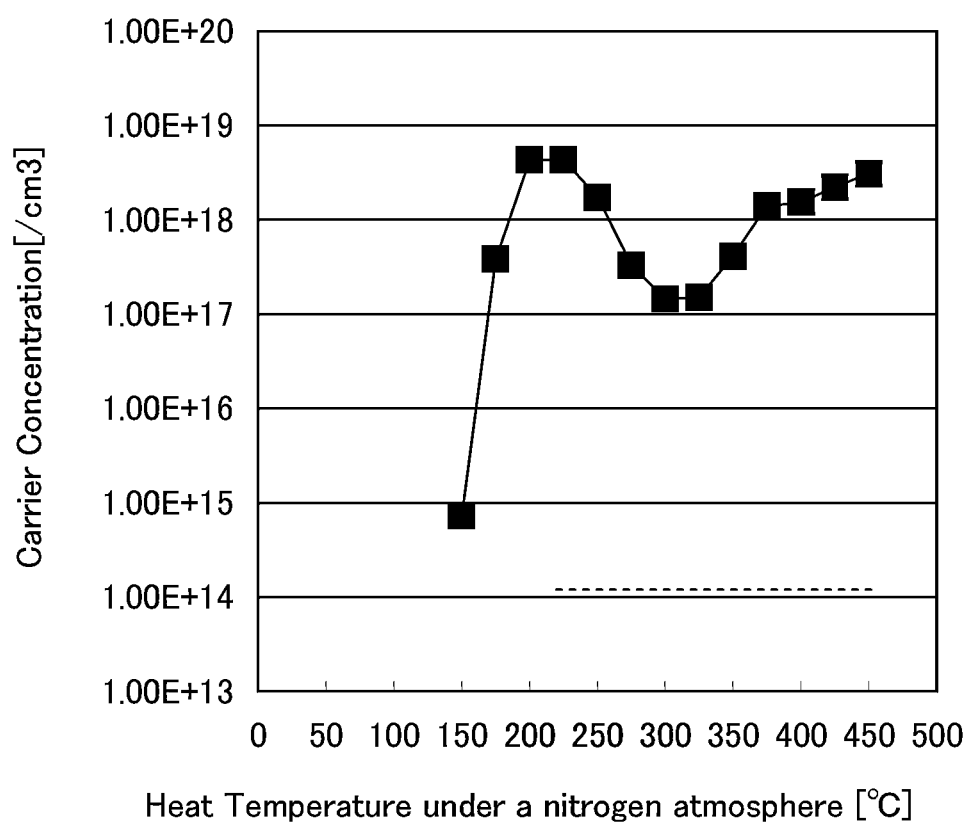
FIG. 33 is a graph for description of Example 2.

Further, FIG. 33 shows measurement results of carrier concentrations. Conditions of heat temperature under a nitrogen atmosphere were set to 150° C., 175° C., 200° C., 225° C., 250° C., 275° C., 300° C., 325° C., 350° C., 375° C., 400° C., 425° C., and 450° C., and a carrier concentration at each temperature was measured. When an oxide insulating film is formed over the In—Ga—Zn—O-based non-single-crystal film, a carrier concentration of $1\times10^{14}/cm^3$ or lower, which is indicated by a dotted line in FIG. 33, was obtained.

Figure 37A:
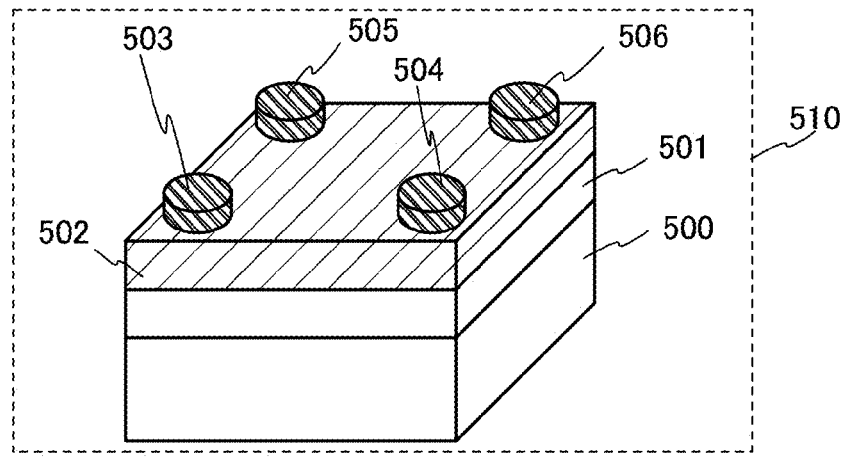
FIGS. 37A to 37C are graphs for description of Example 2.
Figure 37B:
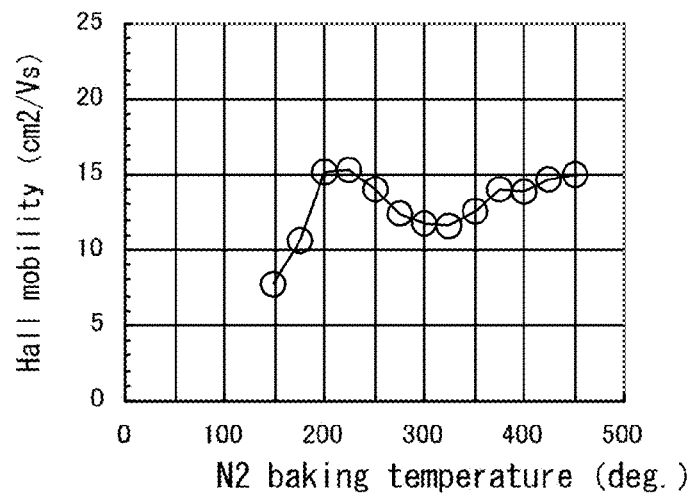
Figure 37C:
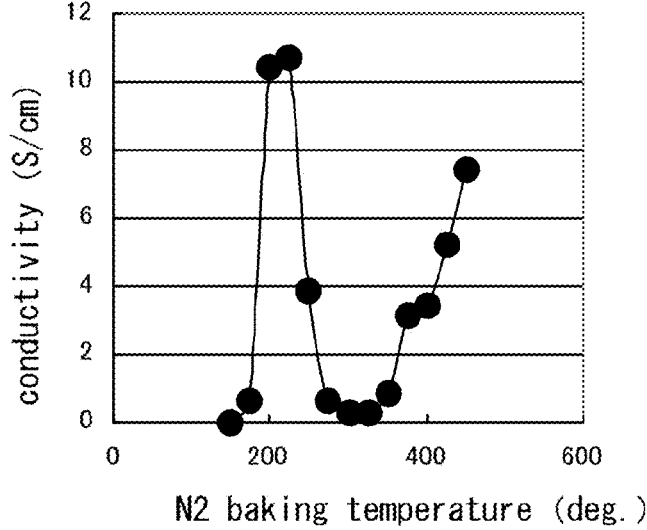
Figure 38:
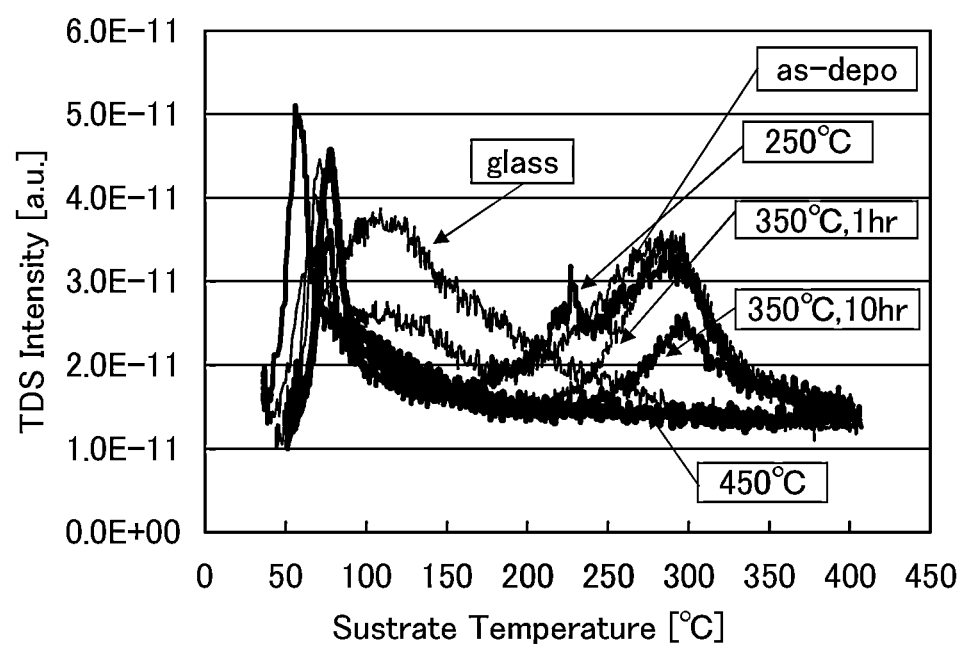
FIG. 38 is a graph for description of Example 2.
Figure 39:
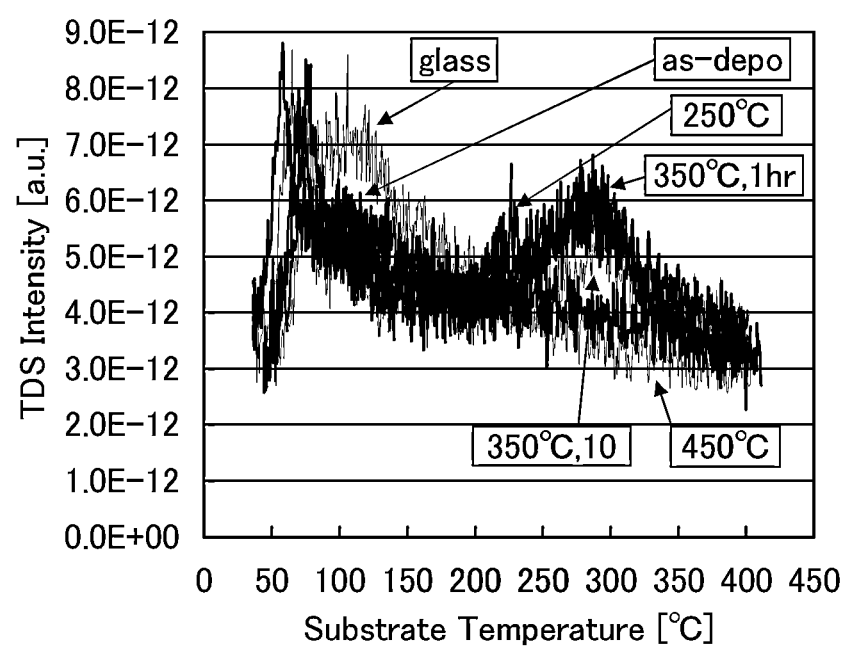
FIG. 39 is a graph for description of Example 2.
Figure 40:
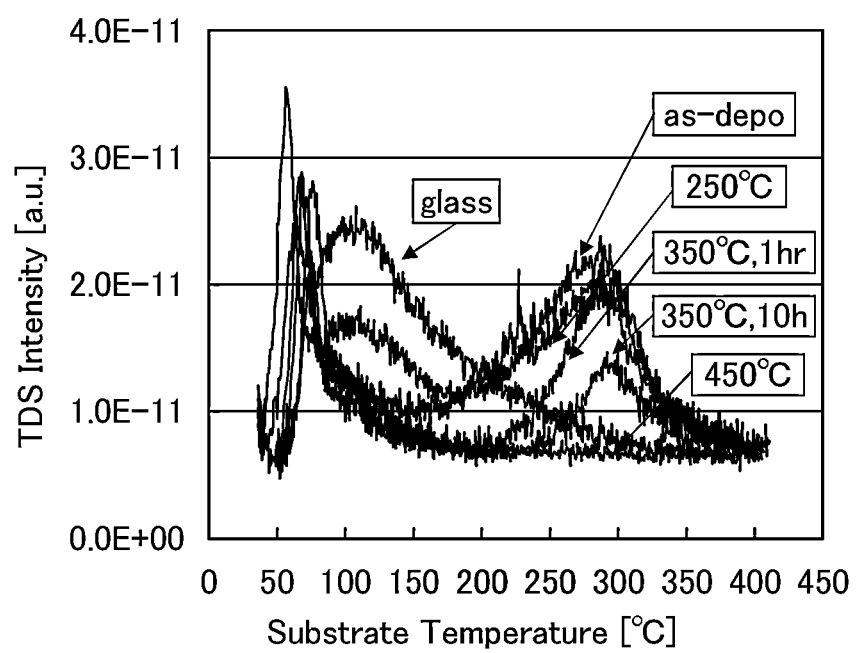
FIG. 40 is a graph for description of Example 2.
Figure 41:
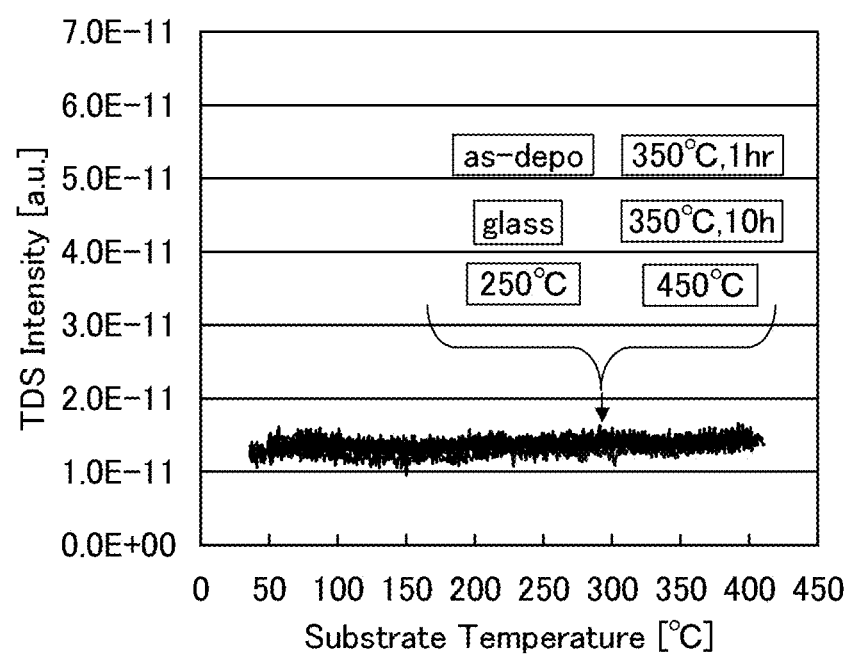
FIG. 41 is a graph for description of Example 2.

Next, measurements of the carrier concentration and Hall mobility are described. FIG. 37A illustrates a three-dimensional view of a property-evaluation sample 510 for evaluating properties (the carrier concentrations and Hall mobility) of an oxide semiconductor film (an In—Ga—Zn—O-based non-single-crystal film). Here, the property-evaluation sample 510 was fabricated and subjected to Hall effect measurement at room temperature. The carrier concentration and Hall mobility of the oxide semiconductor film were evaluated. The property-evaluation sample 510 was fabricated in the following manner: an insulating film 501 including silicon oxynitride was formed over a substrate 500, an oxide semiconductor film 502 with a size of 10 mm×10 mm, which serves as an evaluation object, was formed over the insulating film 501, and electrodes 503, 504, 505, and 506 each having a diameter of 1 mm were formed over the oxide semiconductor film 502. FIG. 37B shows the measurement result of the Hall mobility, and FIG. 37C shows the measurement result of the conductivity. The carrier concentrations of the oxide semiconductor film obtained by the Hall effect measurement are shown in FIG. 33.

From the results of FIG. 33, FIG. 34, FIG. 35, and FIG. 36, it is found that there is a relation, at 250° C. or higher, between discharge of impurities such as moisture ($H_2O$) from the In—Ga—Zn—O-based non-single-crystal film and change in carrier concentration. That is, when the impurities such as moisture ($H_2O$) are discharged from the In—Ga—Zn—O-based non-single-crystal film, the carrier concentration is increased.

Moreover, H, O, OH, $H_2$, $O_2$, N, $N_2$, and Ar, in addition to $H_2O$, were each measured by TDS. The measurement resulted in that peaks of H, O, and OH were observed clearly but peaks of $H_2$, $O_2$, N, $N_2$, and Ar were not observed. As samples of the above measurement, a structure where an In—Ga—Zn—O-based non-single-crystal film with an original thickness of 50 nm was formed over a glass substrate was used. The conditions of heat treatment were set as follows: heat treatment under a nitrogen atmosphere at 250° C. for an hour; that under a nitrogen atmosphere at 350° C. for an hour; that under a nitrogen atmosphere at 350° C. for ten hours; and that under a nitrogen atmosphere at 450° C. for an hour. As comparative samples, a structure in which heat treatment was not performed on an In—Ga—Zn—O-based non-single-crystal film and a structure including only a glass substrate were measured. FIG. 38, FIG. 39, FIG. 40, and FIG. 41 show TDS results of H, O, OH, and $H_2$, respectively. Note that under the above conditions of heat treatment, the oxygen density under a nitrogen atmosphere is 20 ppm or lower.

Example 3

With respect to an oxide semiconductor layer including a region having high oxygen density and a region having low oxygen density, a phenomenon in which oxygen is diffused in accordance with heat treatment was simulated. The result thereof will be described with reference to FIG. 42 and FIG. 43 in this example. As software for the simulation, Materials Explorer 5.0 manufactured by Fujitsu Limited was used.

Figure 42:
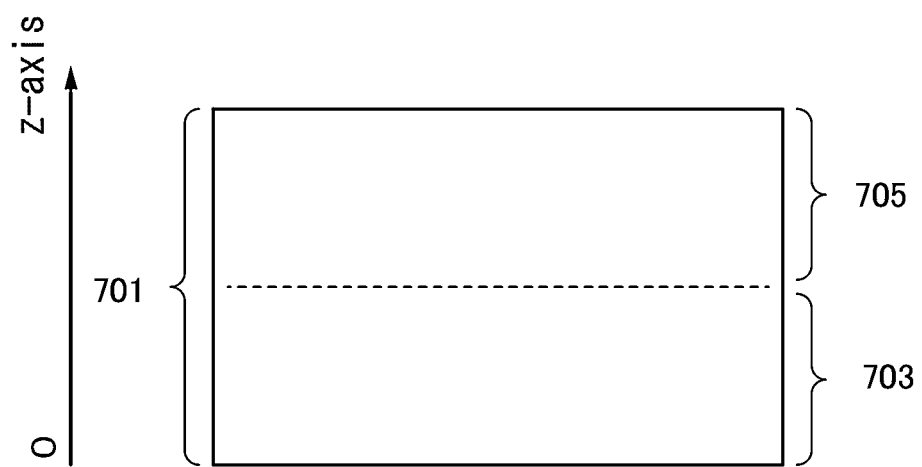
FIG. 42 is a graph for description of Example 3.

FIG. 42 illustrates a model of an oxide semiconductor layer which was used for the simulation. Here, a structure in which a layer 705 having high oxygen density were stacked over a layer 703 having low oxygen density was employed for an oxide semiconductor layer 701.

The layer 703 having low oxygen density was formed to have an amorphous structure including In atoms, Ga atoms, Zn atoms, and O atoms, where the numbers of In atoms, Ga atoms, and Zn atoms were each 15 and the number of O atoms was 54.

In addition, the layer 705 having high oxygen density was formed to have an amorphous structure including In atoms, Ga atoms, Zn atoms, and O atoms, where the numbers of In atoms, Ga atoms, and Zn atoms were each 15 and the number of O atoms was 66.

The density of the oxide semiconductor layer 701 was set to 5.9 $g/cm^3$.

Next, the classical molecular dynamics (MD) simulation was performed on the oxide semiconductor layer 701 under conditions of NVT ensemble and a temperature of 250° C. The time step was set to 0.2 fs, and the total simulation time was set to 200 ps. In addition, Born-Mayer-Huggins potential was used for the potentials of metal-oxygen bonding and oxygen-oxygen bonding. Moreover, movement of atoms at an upper end portion and a lower end portion of the oxide semiconductor layer 701 was fixed.

Figure 43:
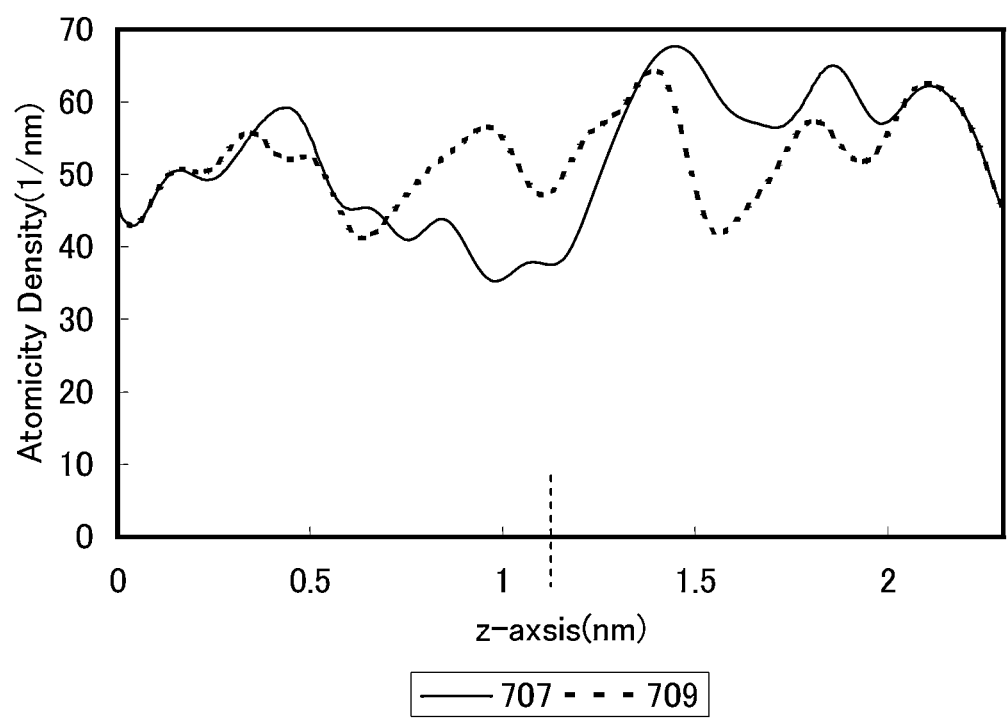
FIG. 43 is a graph for description of Example 3.
Figure 43:
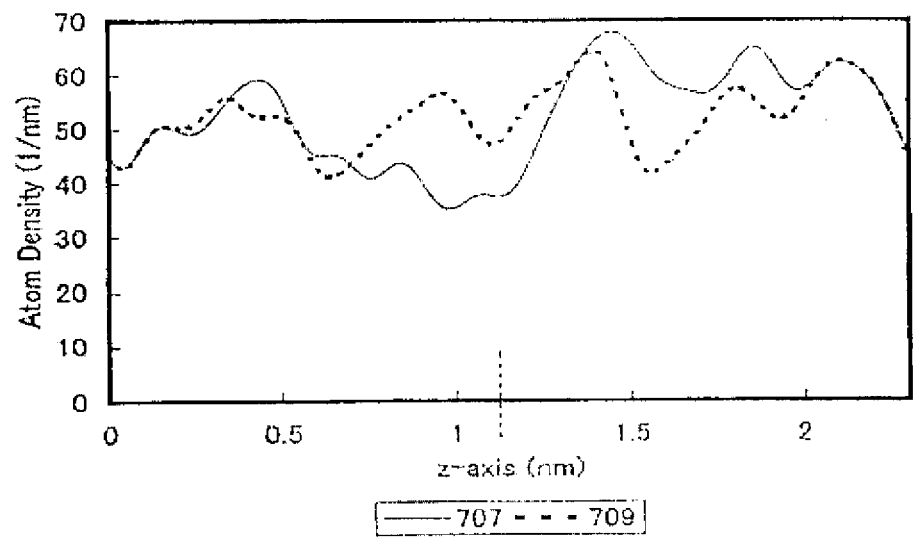

The simulation results are shown in FIG. 43. In z-axis coordinates, the range of 0 nm to 1.15 nm indicates the layer 703 having low oxygen density, and the range of 1.15 nm to 2.3 nm indicates the layer 705 having high oxygen density. The distribution of oxygen densities before the MD simulation is indicated by a solid line 707, and the distribution of oxygen densities after the MD simulation is indicated by a dashed line 709.

The solid line 707 shows that the oxide semiconductor layer 701 has high oxygen densities in a region ranging from an interface between the layer 703 having low oxygen density and the layer 705 having high oxygen density to the layer 705 having high oxygen density. On the other hand, the dashed line 709 shows that the oxygen density is uniform in the layer 703 having low oxygen density and the layer 705 having high oxygen density.

From the above, when there is non-uniformity in the distribution of oxygen concentration as in the stack of the layer 703 having low oxygen density and the layer 705 having high oxygen density, it is found that the oxygen diffuses from where the oxygen density is higher to where the oxygen density is lower by heat treatment and thus the oxygen density becomes uniform.

That is, as described in Embodiment 1, since the oxygen density at the interface between the oxide semiconductor layer 403 and the first oxide insulating layer 407 is increased by formation of the first protective insulating layer 407 over the oxide semiconductor layer 403 with use of an insulating oxide, the oxygen diffuses to the oxide semiconductor layer 403 where the oxygen density is low and thus the oxide semiconductor layer 403 has higher resistance. As described above, the reliability of a transistor included in a display device which is one embodiment of the present invention can be improved.

This application is based on Japanese Patent Application serial no. 2009-159052 filed with Japan Patent Office on Jul. 3, 2009, the entire contents of which are hereby incorporated by reference.

What is claimed is:

1. A semiconductor device comprising:
a first control line;
a second control line; and
a transistor,
wherein the transistor comprises:
  a first conductive layer;
  a first insulating layer over the first conductive layer;
  an oxide semiconductor layer over the first conductive layer;
  a second conductive layer and a third conductive layer over and in contact with the oxide semiconductor layer;
  a second insulating layer over and in contact with the oxide semiconductor layer, the second conductive layer, and the third conductive layer; and
  a fourth conductive layer over the second insulating layer,
wherein the first conductive layer is electrically connected to the first control line, and
wherein the fourth conductive layer is electrically connected to the second control line.

2. The semiconductor device according to claim 1, wherein a width of the first conductive layer is larger than a width of the fourth conductive layer.

3. The semiconductor device according to claim 1, wherein a width of the fourth conductive layer is larger than a width of the first conductive layer.

4. The semiconductor device according to claim 1, wherein the oxide semiconductor layer comprises indium and zinc.

5. The semiconductor device according to claim 1, wherein the oxide semiconductor layer comprises a microcrystalline region.

6. The semiconductor device according to claim 1, wherein the oxide semiconductor layer comprises an oxygen-excess region.

7. The semiconductor device according to claim 1, wherein the oxide semiconductor layer comprises a depression.

8. The semiconductor device according to claim 1, wherein the second control line supplies a fixed potential.

9. The semiconductor device according to claim 1, wherein the semiconductor device is included in a pixel portion.

10. The semiconductor device according to claim 1, wherein the semiconductor device is included in a driver circuit.

11. A semiconductor device comprising:
a first control line;
a second control line; and
a transistor,
wherein the transistor comprises:
  a first conductive layer;
  a first insulating layer over the first conductive layer;
  an oxide semiconductor layer over the first conductive layer;
  a second conductive layer and a third conductive layer over and in contact with the oxide semiconductor layer;
  a second insulating layer over and in contact with the oxide semiconductor layer, the second conductive layer, and the third conductive layer;
  a resin layer over the second insulating layer; and
  a fourth conductive layer over the resin layer,
wherein the first conductive layer is electrically connected to the first control line, and
wherein the fourth conductive layer is electrically connected to the second control line.

12. The semiconductor device according to claim 11, wherein a width of the first conductive layer is larger than a width of the fourth conductive layer.

13. The semiconductor device according to claim 11, wherein a width of the fourth conductive layer is larger than a width of the first conductive layer.

14. The semiconductor device according to claim 11, wherein the oxide semiconductor layer comprises indium and zinc.

15. The semiconductor device according to claim 11, wherein the oxide semiconductor layer comprises a microcrystalline region.

16. The semiconductor device according to claim 11, wherein the oxide semiconductor layer comprises an oxygen-excess region.

17. The semiconductor device according to claim 11, wherein the oxide semiconductor layer comprises a depression.

18. The semiconductor device according to claim 11, wherein the second control line supplies a fixed potential.

19. The semiconductor device according to claim 11, wherein the semiconductor device is included in a pixel portion.

20. The semiconductor device according to claim 11, wherein the semiconductor device is included in a driver circuit.

* * * * *

UNITED STATES PATENT AND TRADEMARK OFFICE
CERTIFICATE OF CORRECTION

PATENT NO. : 8,735,884 B2
APPLICATION NO. : 13/632709
DATED : May 27, 2014
INVENTOR(S) : Junichiro Sakata et al.

It is certified that error appears in the above-identified patent and that said Letters Patent is hereby corrected as shown below:

In the Drawings

Delete Drawing Sheet 43 of 43 and substitute therefore with the attached Drawing Sheet 43 of 43.
FIG. 43 has been corrected.

In the Specification

At column 1, line 61, "$(ZnO)_n$" should be --$(ZnO)_m$--;

At column 4, line 30, "1 $nMO_3(ZnO)_m$" should be --$InMO_3(ZnO)_m$--;

At column 19, line 34, "OW" should be --$OH^-$--;

At column 23, line 27, "OW" should be --$OH^-$--;

At column 53, line 62, "$N_z$" should be --$N_2$--;

At column 54, line 11, "$H_z$" should be --$H_2$--.

Signed and Sealed this
Ninth Day of December, 2014

Michelle K. Lee
*Deputy Director of the United States Patent and Trademark Office*